United States Patent
Takaki et al.

(10) Patent No.: US 8,778,595 B2
(45) Date of Patent: *Jul. 15, 2014

(54) RESIST COMPOSITION, METHOD OF FORMING RESIST PATTERN, AND POLYMERIC COMPOUND

(71) Applicant: Tokyo Ohka Kogyo Co., Ltd., Kawasaki (JP)

(72) Inventors: Daichi Takaki, Kawasaki (JP); Daiju Shiono, Kawasaki (JP); Yoshiyuki Utsumi, Kawasaki (JP); Jun Iwashita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,955

(22) Filed: Nov. 16, 2012

(65) Prior Publication Data

US 2013/0157201 A1    Jun. 20, 2013

(30) Foreign Application Priority Data

Nov. 25, 2011   (JP) ................................. 2011-257859

(51) Int. Cl.
G03F 7/039 (2006.01)
G03F 7/20 (2006.01)
G03F 7/30 (2006.01)

(52) U.S. Cl.
USPC ........ 430/270.1; 430/311; 430/326; 430/905; 430/907; 430/910; 430/921; 430/925; 526/304; 526/305; 526/307.7; 526/288; 526/312; 526/243; 526/286; 526/287

(58) Field of Classification Search
None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,949,325 B2 | 9/2005 | Li et al. | |
| 2001/0049073 A1 | 12/2001 | Hada et al. | |
| 2004/0110085 A1 | 6/2004 | Iwai et al. | |
| 2007/0231708 A1 | 10/2007 | Matsumaru et al. | |
| 2009/0047602 A1 | 2/2009 | Furuya et al. | |
| 2009/0233223 A1* | 9/2009 | Tachibana et al. | 430/270.1 |
| 2010/0075256 A1* | 3/2010 | Joo et al. | 430/286.1 |
| 2010/0233617 A1 | 9/2010 | Wada | |
| 2011/0177453 A1 | 7/2011 | Masubuchi et al. | |
| 2011/0244392 A1 | 10/2011 | Hirano et al. | |
| 2012/0328993 A1 | 12/2012 | Utsumi et al. | |
| 2013/0095427 A1* | 4/2013 | Yahagi et al. | 430/285.1 |
| 2013/0143159 A1* | 6/2013 | Iwashita et al. | 430/285.1 |

FOREIGN PATENT DOCUMENTS

| | | |
|---|---|---|
| JP | A-09-208554 | 8/1997 |
| JP | A-10-221852 | 8/1998 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2003-241385 | 8/2003 |
| JP | A-2005-336452 | 12/2005 |
| JP | A-2006-045311 | 2/2006 |
| JP | A-2006-063318 | 3/2006 |
| JP | A-2006-259582 | 9/2006 |
| JP | A-2006-317803 | 11/2006 |
| JP | A-2008-309938 | 12/2008 |
| JP | A-2009-025723 | 2/2009 |
| JP | A-2009-139909 | 6/2009 |
| JP | A-2010-095643 | 4/2010 |
| JP | 2011-026300 | 2/2011 |
| JP | A-2011-158879 | 8/2011 |
| JP | 2011-168698 | 9/2011 |
| WO | WO 2004/074242 A2 | 9/2004 |
| WO | WO 2006/011420 A1 * | 2/2006 |

OTHER PUBLICATIONS

Derwent English abstract for WO 2006/011420 A1 (2006).*
Office Action issued on Feb. 11, 2014 in U.S. Appl. No. 13/650,371.
Office Action mailed May 20, 2014 in U.S. Appl. No. 13/653,930.

* cited by examiner

Primary Examiner — Sin J. Lee
(74) Attorney, Agent, or Firm — Knobbe Martens Olson & Bear LLP

(57) ABSTRACT

A resist composition containing a base component (A) which generates acid upon exposure, and exhibits changed solubility in a developing solution under the action of acid, wherein the base component (A) contains a polymeric compound (A1) having a structural unit (a5) represented by general formula (a5-0) shown below and a structural unit (a6) that generates acid upon exposure.

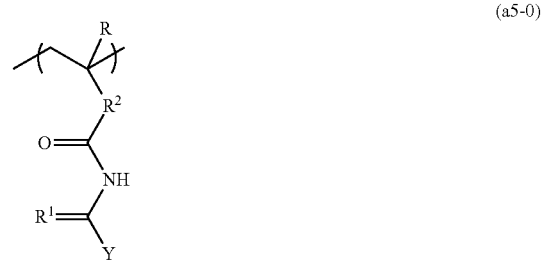

(a5-0)

In the formula, R represents a hydrogen atom, an alkyl group of 1 to 5 carbon atoms or a halogenated alkyl group of 1 to 5 carbon atoms, $R^1$ represents a sulfur atom or an oxygen atom, $R^2$ represents a single bond or a divalent linking group, and Y represents a hydrocarbon group in which a carbon atom or a hydrogen atom may be substituted with a substituent.

7 Claims, No Drawings

RESIST COMPOSITION, METHOD OF FORMING RESIST PATTERN, AND POLYMERIC COMPOUND

BACKGROUND OF THE INVENTION

1. Field of the Invention

The present invention relates to a novel polymeric compound, a resist composition containing the polymeric compound, and a method of forming a resist pattern that uses the resist composition.

Priority is claimed on Japanese Patent Application No. 2011-257859, filed Nov. 25, 2011, the content of which is incorporated herein by reference.

2. Description of Related Art

In lithography techniques, for example, a resist film composed of a resist material is formed on a substrate, and the resist film is subjected to selective exposure of radial rays such as light or an electron beam through a mask having a predetermined pattern formed therein, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as electron beam (EB), extreme ultraviolet radiation (EUV) and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified resist composition is used, which includes a base component that exhibits changed solubility in a developing solution under the action of acid, and an acid generator component that generates acid upon exposure.

For example, in the case where the developing solution is an alkali developing solution (alkali developing process), a positive-type chemically amplified resist composition containing a resin component (base resin) which exhibits increased solubility in an alkali developing solution under the action of acid, and an acid generator component is generally used. If the resist film formed using this resist composition is selectively exposed during formation of a resist pattern, then acid is generated from the acid generator component within the exposed portions, and the action of this acid causes an increase in the solubility of the resin component in an alkali developing solution, making the exposed portions soluble in the alkali developing solution. The unexposed portions remain to form a positive-type resist pattern. The base resin exhibits increased polarity under the action of acid, thereby exhibiting increased solubility in an alkali developing solution, whereas the solubility in an organic solvent decreases. Accordingly, if a process that uses a developing solution containing an organic solvent (an organic developing solution) is employed (hereafter, this process is referred to as a "solvent developing process" or "negative-type developing process") instead of an alkali developing process, then within the exposed portions of the resist film, the solubility in the organic developing solution decreases relatively. As a result, during the solvent developing process, the unexposed portions of the resist film are dissolved in the organic developing solution and removed, whereas the exposed portions remain as a pattern, resulting in the formation of a negative-type resist pattern. For example, Patent Document 1 proposes a negative-type developing process and a resist composition for use within the process.

Currently, resins that contain structural units derived from (meth)acrylate esters within the main chain (acrylic resins) are widely used as base resins for resist compositions that use ArF excimer laser lithography or the like, as they exhibit excellent transparency in the vicinity of 193 nm (for example, see Patent Document 2).

In order to improve various lithography properties, the base resin usually contains a plurality of structural units. For example, in the case of a resin component that exhibits higher polarity under the action of acid, a base resin is typically used that includes a plurality of structural units, including a structural unit having an acid-decomposable group that exhibits increased polarity upon decomposition under the action of the acid generated from the acid generator component, a structural unit having a polar group such as a hydroxyl group, and a structural unit having a lactone structure.

In particular, structural units having a polar group are widely used, since they improve the compatibility with an alkali developing solution, and contribute to favorable improvements in the resolution.

Recently, base resins having a structural unit containing an imide group have also been proposed (for example, see Patent Document 3). These base resins contribute to improvements in the resolution and mask reproducibility and the like.

DOCUMENTS OF RELATED ART

[Patent Documents]
[Patent Document 1]
Japanese Unexamined Patent Application, First Publication No. 2009-025723
[Patent Document 2]
Japanese Unexamined Patent Application, First Publication No. 2003-241385
[Patent Document 3]
Japanese Unexamined Patent Application, First Publication No. 2006-063318

SUMMARY OF THE INVENTION

As further progress is made in lithography techniques, and the potential fields of application for lithography techniques continue to expand, demands are growing for novel materials capable of being used in these lithography applications.

For example, further progress in pattern miniaturization will result in ever greater demands for improvements in resist materials, both in terms of higher sensitivity, and in terms of various lithography properties such as the resolution, roughness (such as line width roughness (LWR, non-uniformity of the line width) in the case of line patterns, and circularity in the case of hole patterns) and exposure latitude.

The present invention takes the above circumstances into consideration, with an object of providing a resist composition which exhibits excellent sensitivity, resolution and lithography properties, a polymeric compound that is useful for use within the resist composition, and a method of forming a resist pattern that uses the resist composition.

In order to achieve the above object, the present invention adopts the aspects described below.

Namely, a first aspect of the present invention is a resist composition containing a base component (A) which generates acid upon exposure, and exhibits changed solubility in a developing solution under the action of acid, wherein the base component (A) contains a polymeric compound (A1) having a structural unit (a5) represented by general formula (a5-0) shown below and a structural unit (a6) that generates acid upon exposure.

[Chemical Formula 1]

(a5-0)

In the formula, R represents a hydrogen atom, an alkyl group of 1 to 5 carbon atoms or a halogenated alkyl group of 1 to 5 carbon atoms, $R^1$ represents a sulfur atom or an oxygen atom, $R^2$ represents a single bond or a divalent linking group, and Y represents a hydrocarbon group in which a carbon atom or a hydrogen atom may be substituted with a substituent.

A second aspect of the present invention is a method of forming a resist pattern, the method including: using the resist composition of the first aspect to form a resist film on a substrate, conducting exposure of the resist film, and developing the resist film to form a resist pattern.

A third aspect of the present invention is a polymeric compound having a structural unit (a5) represented by general formula (a5-0) shown below and a structural unit (a6) that generates acid upon exposure.

[Chemical Formula 2]

(a5-0)

In the formula, R represents a hydrogen atom, an alkyl group of 1 to 5 carbon atoms or a halogenated alkyl group of 1 to 5 carbon atoms, $R^1$ represents a sulfur atom or an oxygen atom, $R^2$ represents a single bond or a divalent linking group, and Y represents a hydrocarbon group in which a carbon atom or a hydrogen atom may be substituted with a substituent.

In the present description and claims, the term "aliphatic" is a relative concept used in relation to the term "aromatic", and defines a group or compound or the like that has no aromaticity.

The term "alkyl group" includes linear, branched and cyclic monovalent saturated hydrocarbon groups, unless specified otherwise. This definition also applies for the alkyl group within an alkoxy group.

The term "alkylene group" includes linear, branched and cyclic divalent saturated hydrocarbon groups, unless specified otherwise.

A "halogenated alkyl group" is a group in which part or all of the hydrogen atoms of an alkyl group have each been substituted with a halogen atom, and a "halogenated alkylene group" is a group in which part or all of the hydrogen atoms of an alkylene group have each been substituted with a halogen atom, wherein examples of the halogen atom include a fluorine atom, chlorine atom, bromine atom and iodine atom.

A "fluorinated alkyl group" is a group in which part or all of the hydrogen atoms of an alkyl group have each been substituted with a fluorine atom, and a "fluorinated alkylene group" is a group in which part or all of the hydrogen atoms of an alkylene group have each been substituted with a fluorine atom.

A "hydroxyalkyl group" is a group in which part or all of the hydrogen atoms of an alkyl group have each been substituted with a hydroxyl group.

A "structural unit" describes a monomer unit that contributes to the formation of a polymeric compound (a resin, polymer or copolymer).

The term "exposure" is used as a general concept that includes irradiation with any form of radiation.

According to the present invention, there are provided a resist composition which exhibits excellent sensitivity, resolution and lithography properties, a polymeric compound that is useful for use within the resist composition, and a method of forming a resist pattern that uses the resist composition.

DETAILED DESCRIPTION OF THE INVENTION

<<Resist Composition>>

The resist composition of the present invention includes a base component (A) (hereafter referred to as "component (A)") which generates acid upon exposure, and exhibits changed solubility in a developing solution under the action of acid.

Because the resist composition contains the component (A), the composition exhibits changed solubility in a developing solution upon exposure. When a resist film is formed using the resist composition, and the resist film is then subjected to selective exposure, acid is generated from the component (A) in the exposed portions, and the action of this acid causes a change in the solubility in a developing solution of the component (A) itself. As a result, the solubility in the developing solution of the exposed portions of the resist film changes, whereas the solubility in the developing solution of the unexposed portions remains unchanged, and therefore a difference in solubility within the developing solution develops between the exposed portions and the unexposed portions. As a result, when the resist film is developed, the exposed portions are dissolved and removed in the case of a positive-type resist composition, forming a positive-type resist pattern, whereas in the case of a negative-type resist composition, the unexposed portions are dissolved and removed to form a negative-type resist pattern.

In the present description, a resist composition in which the exposed portions are dissolved and removed to form a positive-type resist pattern is referred to as a "positive-type resist composition", and a resist composition in which the unexposed portions are dissolved and removed to form a negative-type resist pattern is referred to as a "negative-type resist composition".

The resist composition of the present invention may be either a positive-type resist composition or a negative-type resist composition.

Further, the resist composition of the present invention may be used within either an alkali developing process in which an alkali developing solution is used for the developing treatment during formation of the resist pattern, or a solvent developing process in which a developing solution containing an organic solvent (an organic developing solution) is used for the developing treatment.

<Component (A)>

The component (A) which functions as the base component used in the resist composition of the present invention contains a polymeric compound (A1) (hereafter referred to as "component (A1)") having a structural unit (a5) represented by general formula (a5-0) shown above and a structural unit (a6) that generates acid upon exposure.

Here, the term "base component" refers to an organic compound capable of forming a film, and is preferably an organic compound having a molecular weight of 500 or more. Ensuring that the organic compound has a molecular weight of 500 or more improves the film-forming ability, and facilitates the formation of nano level resist patterns.

The organic compounds that can be used as the base component can be broadly classified into non-polymers and polymers.

In general, compounds which have a molecular weight of at least 500 but less than 4,000 may be used as non-polymers. Hereafter, a non-polymer having a molecular weight of at least 500 but less than 4,000 is referred to as a "low molecular weight compound".

In terms of the polymers, typically, compounds which have a molecular weight of 1,000 or more may be used. In the following description, the term "high molecular weight compound" or "resin" is used to describe a polymer having a molecular weight of 1,000 or more.

The "molecular weight" of a polymer refers to the weight-average molecular weight in terms of the polystyrene-equivalent value determined by gel permeation chromatography (GPC).

[Component (A1)]

The component (A1) may be either a compound that exhibits increased solubility in the developing solution under the action of acid, or a compound that exhibits decreased solubility in the developing solution under the action of acid.

In those cases where the resist composition of the present invention is a resist composition which forms a negative-type resist pattern in an alkali developing process (or forms a positive-type resist pattern in a solvent developing process), a polymeric compound which is soluble in an alkali developing solution (hereafter, this polymeric compound is also referred to as "component (A1-2)") is preferably used as the component (A1), and a crosslinking agent component is also added to the composition.

The component (A1-2) typically contains alkali-soluble groups such as hydroxyl groups, carboxyl groups and/or amino groups, whereas the crosslinking agent component contains one or more reactive groups such as a methylol group or alkoxymethyl group that are capable of reacting with the alkali-soluble groups under the action of acid. Accordingly, when the resist composition is used to form a resist film, and the resist film is then subjected to selective exposure, acid is generated from the structural unit (a6) in the exposed portions, the action of the generated acid causes crosslinking to occur between the component (A1-2) and the crosslinking agent component, causing a reduction in the amount of alkali-soluble groups within the component (A1-2), together with a corresponding decrease in the polarity and a corresponding increase in the molecular weight, and as a result, the solubility of the base component in an alkali developing solution decreases (whereas the solubility in an organic developing solution increases). Accordingly, during resist pattern formation, by conducting selective exposure of a resist film obtained by applying the resist composition to a substrate, the exposed portions change to a state that is substantially insoluble in an alkali developing solution (but soluble in an organic developing solution), while the unexposed portions remain soluble in an alkali developing solution (but substantially insoluble in an organic developing solution), meaning developing with an alkali developing solution can be used to form a negative-type resist pattern. Further, if an organic developing solution is used as the developing solution, then a positive-type resist pattern can be formed.

An amino-based crosslinking agent such as a glycoluril having a methylol group or alkoxymethyl group, or a melamine-based crosslinking agent is usually preferred as the crosslinking agent component, as it enables the formation of a favorable resist pattern with minimal swelling. The amount added of the crosslinking agent component is preferably within a range from 1 to 50 parts by weight, relative to 100 parts by weight of the alkali-soluble resin.

In those cases where the component (A1-2) has self crosslinking properties (for example, cases in which the component (A1-2) contains one or more groups that can react with the alkali-soluble groups under the action of acid), addition of a crosslinking agent component may be unnecessary.

In those cases where the resist composition of the present invention is a resist composition which forms a positive-type pattern in an alkali developing process (or forms a negative-type pattern in a solvent developing process), a polymeric compound which exhibits increased polarity under the action of acid (hereafter this polymeric compound is also referred to as "component (A1-1)") is preferably used as the component (A1). The polarity of the component (A1-1) changes upon exposure, and therefore by using the component (A1-1), excellent developing contrast can be achieved, not only in an alkali developing process, but also in a solvent developing process.

In other words, in those cases where an alkali developing process is used, the component (A1-1) is substantially insoluble in an alkali developing solution prior to exposure, but when acid is generated from the structural unit (a6) upon exposure, the action of the acid causes an increase in polarity that increases the solubility in the alkali developing solution. Accordingly, during resist pattern formation, by conducting selective exposure of a resist film formed by applying the resist composition to a substrate, the exposed portions change from being substantially insoluble in the alkali developing solution to being soluble, while the unexposed portions remain substantially insoluble in the alkali developing solution, meaning alkali developing can be used to achieve contrast between the exposed portions and the unexposed portions, thus enabling formation of a positive-type resist pattern. On the other hand, in those cases where a solvent developing process is used, the component (A1-1) exhibits good solubility in an organic developing solution prior to exposure, but when acid is generated from the structural unit (a6) upon exposure, the action of the acid causes an increase in polarity that reduces the solubility in the organic developing solution. Accordingly, during resist pattern formation, by conducting selective exposure of a resist film formed by applying the resist composition to a substrate, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, thereby enabling formation of a negative-type resist pattern.

Of the different possibilities, the component (A1) is preferably the component (A1-1). In other words, the resist composition of the present invention is preferably a chemically amplified resist composition that functions as a positive-type composition in an alkali developing process, and functions as a negative-type composition in a solvent developing process.

In addition to the structural unit (a5) and the structural unit (a6), the component (A1-1) preferably also includes a structural unit (a1) containing an acid-decomposable group that exhibits increased polarity under the action of acid. The structural unit (a1) is preferably a structural unit derived from an acrylate ester in which the hydrogen atom bonded to the carbon atom on the α-position may be substituted with a substituent.

In addition to the structural unit (a5), the structural unit (a6) and the structural unit (a1), the component (A1-1) preferably also includes a structural unit (a2) containing an —SO$_2$-containing cyclic group or a lactone-containing cyclic group.

—Structural Unit (a5)

The structural unit (a5) is a structural unit represented by general formula (a5-0) shown below.

[Chemical Formula 3]

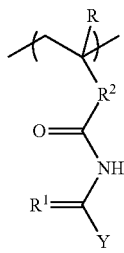

(a5-0)

In the formula, R represents a hydrogen atom, an alkyl group of 1 to 5 carbon atoms, or a halogenated alkyl group of 1 to 5 carbon atoms, $R^1$ represents a sulfur atom or an oxygen atom, $R^2$ represents a single bond or a divalent linking group, and Y represents a hydrocarbon group in which a carbon atom or a hydrogen atom may be substituted with a substituent.

In formula (a5-0), R represents a hydrogen atom, an alkyl group of 1 to 5 carbon atoms, or a halogenated alkyl group of 1 to 5 carbon atoms.

Examples of the alkyl group of 1 to 5 carbon atoms for R include linear and branched alkyl groups such as a methyl group, ethyl group, propyl group, isopropyl group, n-butyl group, isobutyl group, tert-butyl group, pentyl group, isopentyl group and neopentyl group.

Examples of the halogenated alkyl group of 1 to 5 carbon atoms for R include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms, or a fluorinated alkyl group of 1 to 5 carbon atoms, is more preferably a hydrogen atom or an alkyl group of 1 to 5 carbon atoms, and is most preferably a hydrogen atom or a methyl group.

In formula (a5-0), $R^1$ represents a sulfur atom or an oxygen atom, and is preferably an oxygen atom.

In formula (a5-0), $R^2$ represents a single bond or a divalent linking group.

Although there are no particular limitations on the divalent linking group for $R^2$, preferred examples include divalent hydrocarbon groups which may have a substituent, and divalent linking groups containing a hetero atom.

(Divalent Hydrocarbon Groups which May have a Substituent)

The hydrocarbon group for $R^2$ may be either an aliphatic hydrocarbon group or an aromatic hydrocarbon group. An aliphatic hydrocarbon group refers to a hydrocarbon group that has no aromaticity.

The aliphatic hydrocarbon group as the divalent hydrocarbon group for $R^2$ described above may be either saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group that includes a ring within the structure.

The linear or branched aliphatic hydrocarbon group preferably has 1 to 10 carbon atoms, more preferably 1 to 8 carbon atoms, and still more preferably 1 to 5 carbon atoms.

As the linear aliphatic hydrocarbon group, a linear alkylene group is preferable. Specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent (an atom other than a hydrogen atom, or a group of atoms) that substitutes a hydrogen atom. Examples of the substituent include a fluorine atom, a fluorinated alkyl group of 1 to 5 carbon atoms, and an oxo group (=O).

Examples of the aliphatic hydrocarbon group that includes a ring within the structure include cyclic aliphatic hydrocarbon groups (groups in which two hydrogen atoms have been removed from an aliphatic hydrocarbon ring) which may contain a hetero atom-containing substituent within the cyclic structure, groups in which an aforementioned cyclic aliphatic hydrocarbon group is bonded to the terminal of a linear or branched aliphatic hydrocarbon group, and groups in which an aforementioned cyclic aliphatic hydrocarbon group is interposed within the chain of a linear or branched aliphatic hydrocarbon group. Examples of the linear or branched aliphatic hydrocarbon group include the same groups as those mentioned above.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which two hydrogen atoms have been removed from a monocycloalkane is preferred. The monocycloalkane preferably contains 3 to 6 carbon atoms, and specific examples include cyclopentane and cyclohexane. As the polycyclic aliphatic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The cyclic aliphatic hydrocarbon group may or may not have a substituent (an atom other than a hydrogen atom, or a group) that substitutes a hydrogen atom. Examples of the substituent include an alkyl group, alkoxy group, halogen atom, halogenated alkyl group, hydroxyl group and oxo group (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferred.

Examples of the halogenated alkyl group for the substituent include groups in which part or all of the hydrogen atoms of an aforementioned alkyl group have each been substituted with an aforementioned halogen atom.

In the cyclic aliphatic hydrocarbon group, a portion of the carbon atoms that constitute the cyclic structure may be substituted with a hetero atom-containing substituent. This hetero atom-containing substituent is preferably —O—, —C(=O)—O—, —S—, —S(=O)$_2$—, or —S(=O)$_2$—O—.

The aromatic hydrocarbon group as the divalent hydrocarbon group for R$^2$ is a divalent hydrocarbon group having at least one aromatic ring, and may also have a substituent. There are no particular limitations on the aromatic ring, provided it is a cyclic conjugated system having 4n+2 (wherein n represents 0 or a natural number) n electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents.

Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the divalent hydrocarbon group include groups in which two hydrogen atoms have been removed from an aromatic hydrocarbon ring or aromatic heterocyclic ring (namely, arylene groups or heteroarylene groups), groups in which two hydrogen atoms have been removed from an aromatic compound having two or more aromatic rings (such as biphenyl or fluorene), and groups in which one of the hydrogen atoms of a group having one hydrogen atom removed from an aforementioned aromatic hydrocarbon ring or aromatic heterocyclic ring (namely, an aryl group or heteroaryl group) has been substituted with an alkylene group (for example, groups in which one further hydrogen atom has been removed from the aryl group within an arylalkyl group such as a benzyl group, phenethyl group, 1-naphthylmethyl group, 2-naphthylmethyl group, 1-naphthylethyl group or 2-naphthylethyl group). The alkylene group bonded to the aryl group or heteroaryl group preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic ring of an aforementioned aromatic hydrocarbon group may be substituted with a substituent. Examples of the substituent include an alkyl group, alkoxy group, halogen atom, halogenated alkyl group, hydroxyl group and oxo group (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group have each been substituted with an aforementioned halogen atom.

(Divalent Linking Groups Containing a Hetero Atom)

Examples of the hetero atom in the "divalent linking group containing a hetero atom" for R$^2$ described above include atoms other than a carbon atom or hydrogen atom, and specific examples include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group or an acyl group or the like), —S—, —S(=O)$_2$—, —S(=O)$_2$—O—, —NH—C(=O)—, =N—, groups represented by general formula —Y$^{21}$—O—Y$^{22}$—, —[Y$^{21}$—C(=O)—O]$_{m'}$—Y$^{22}$—, —C(=O)—O—Y$^{22}$— or —Y$^{21}$—O—C(=O)—Y$^{22}$— [in the formulas, each of Y$^{21}$ and Y$^{22}$ independently represents a divalent hydrocarbon group which may have a substituent, O represents an oxygen atom, and m' represents an integer of 0 to 3].

When R$^2$ represents —NH—, this H may be substituted with a substituent such as an alkyl group or an acyl group. The substituent (such as an alkyl group or an acyl group) preferably contains 1 to 10 carbon atoms, more preferably 1 to 8 carbon atoms, and most preferably 1 to 5 carbon atoms.

Each of Y$^{21}$ and Y$^{22}$ independently represents a divalent hydrocarbon group which may have a substituent. Examples of this divalent hydrocarbon group include the same groups as those described above for the "divalent hydrocarbon group which may have a substituent" for $R^2$.

$Y^{21}$ is preferably a linear aliphatic hydrocarbon group, more preferably a linear alkylene group, still more preferably a linear alkylene group of 1 to 5 carbon atoms, and most preferably a methylene group or an ethylene group.

$Y^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula $-[Y^{21}-C(=O)-O]_{m'}-Y^{22}-$, m' represents an integer of 0 to 3, and is preferably an integer of 0 to 2, more preferably 0 or 1, and most preferably 1. In other words, the group represented by formula $-[Y^{21}-C(=O)-O]_{m'}-Y^{22}-$ is most preferably a group represented by a formula $-Y^{21}-C(=O)-O-Y^{22}-$. Among such groups, groups represented by a formula $-(CH_2)_{a'}-C(=O)-O-(CH_2)_{b'}-$ are particularly preferred. In this formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking groups containing a hetero atom, linear groups containing an oxygen atom as the hetero atom, for example, groups containing an ether linkage or ester linkage are preferred, and groups represented by one of the above formulas $-Y^{21}-O-Y^{22}-$, $-[Y^{21}-C(=O)-O]_{m'}-Y^{22}-$, $-C(=O)-O-Y^{22}-$ or $-Y^{21}-O-C(=O)-Y^{22}-$ are more preferred.

Of the various possibilities described above, $R^2$ is preferably a single bond or a divalent linking group containing a hetero atom, is more preferably a single bond, a group represented by the above formula $-Y^{21}-O-Y^{22}-$, a group represented by the above formula $-[Y^{21}-C(=O)-O]_{m'}-Y^{22}-$, a group represented by the above formula $-C(=O)-O-Y^{22}-$ or a group represented by the above formula $-Y^{21}-O-C(=O)-Y^{22}-$, and is most preferably a single bond or a group represented by the above formula $-C(=O)-O-Y^{22}-$.

In formula (a5-0), Y represents a hydrocarbon group in which a carbon atom or a hydrogen atom may be substituted with a substituent.

The expression that "a carbon atom or a hydrogen atom may be substituted with a substituent" means that either part of the carbon atoms that constitute the hydrocarbon group may be substituted with a substituent (an atom other than a hydrogen atom, or a group of atoms), or part or all of the hydrogen atoms that constitute the hydrocarbon group may each be substituted with an aforementioned substituent.

The hydrocarbon group for Y may be either an aliphatic hydrocarbon group or an aromatic hydrocarbon group.

The aliphatic hydrocarbon group for Y may be a saturated aliphatic hydrocarbon group or an unsaturated aliphatic hydrocarbon group. Further, the aliphatic hydrocarbon group may be linear, branched or cyclic, or may include a combination of a chain-like structure and a cyclic structure.

The aliphatic hydrocarbon group for Y is preferably a linear or branched saturated hydrocarbon group, a linear or branched monovalent unsaturated hydrocarbon group, or a cyclic aliphatic hydrocarbon group (aliphatic cyclic group).

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group (tert-butyl group), 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms.

Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of such groups include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Among the above possibilities, the aliphatic cyclic group is preferably a polycyclic group, is more preferably a group in which one or more hydrogen atoms have been removed from a polycycloalkane, and is most preferably a group in which one or more hydrogen atoms have been removed from adamantane.

The aliphatic hydrocarbon group for Y is preferably a cyclic aliphatic hydrocarbon group (aliphatic cyclic group), and is more preferably a polycyclic aliphatic cyclic group.

Examples of the aforementioned combination of a chain-like structure and a cyclic structure include groups in which an aforementioned aliphatic cyclic group is bonded to the terminal of a linear or branched aliphatic hydrocarbon group (a saturated hydrocarbon group or unsaturated hydrocarbon group), and groups in which an aforementioned aliphatic cyclic group is interposed within the chain of a linear or branched aliphatic hydrocarbon group (a saturated hydrocarbon group or unsaturated hydrocarbon group).

In the aliphatic hydrocarbon group for Y, a carbon atom or a hydrogen atom that constitutes part of the aliphatic hydrocarbon group may be substituted with a substituent.

Examples of this substituent include an alkyl group and a group of atoms containing a hetero atom. Here, there are no particular limitations on the "hetero atom", which may be any atom other than a carbon atom or a hydrogen atom, and specific examples include a halogen atom, an oxygen atom, a sulfur atom and a nitrogen atom. Examples of the halogen atom include a fluorine atom, chlorine atom, iodine atom and bromine atom. The group of atoms containing a hetero atom may consist solely of the hetero atom, or may be a group of atoms that also contains a group of atoms or atom other than the hetero atom in addition to the hetero atom.

Specific examples of the substituent that may substitute part or all of the hydrogen atoms that constitute the (linear, branched or cyclic) aliphatic hydrocarbon group for Y include an alkoxy group, a halogen atom, a halogenated alkyl group, a hydroxyl group, an oxo group (=O) and a cyano group.

The alkoxy group for this substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for this substituent include a fluorine atom, chlorine atom, bromine atom and iodine atom, and a fluorine atom is preferred.

Examples of the halogenated alkyl group for this substituent include groups in which part or all of the hydrogen atoms of an alkyl group of 1 to 5 carbon atoms (such as a methyl group, ethyl group, propyl group, n-butyl group or tert-butyl group) have each been substituted with an aforementioned halogen atom.

When the aliphatic hydrocarbon group for Y is an aliphatic cyclic group, part or all of the hydrogen atoms that constitute the aliphatic cyclic group may each be substituted with an alkyl group. This alkyl group substituent is preferably an alkyl group of 1 to 5 carbon atoms, and is more preferably a methyl group, ethyl group, propyl group, n-butyl group or tert-butyl group.

Examples of the substituent that may substitute part of the carbon atoms that constitute the (linear, branched or cyclic) aliphatic hydrocarbon group for Y include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is a cyclic group, these substituents may be included within the cyclic structure, and in such cases the substituent is preferably —O—, —C(=O)—O—, —S—, —S(=O)$_2$— or —S(=O)$_2$—O—.

The aromatic hydrocarbon group for Y is a hydrocarbon group having at least one aromatic ring. There are no particular limitations on the aromatic ring, provided it is a cyclic conjugated system having 4n+2 (wherein n represents 0 or a natural number) n electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms.

In the aromatic hydrocarbon group for Y, part of the carbon atoms or hydrogen atoms that constitute the aromatic hydrocarbon group may be substituted with a substituent. However, the aforementioned preferred number of carbon atoms in the aromatic ring does not include any carbon atoms within any substituents.

Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for Y include groups in which one hydrogen atom has been removed from an aromatic hydrocarbon ring or aromatic heterocyclic ring (namely, aryl groups or heteroaryl groups), groups in which one hydrogen atom has been removed from an aromatic compound having two or more aromatic rings (such as biphenyl or fluorene), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group, and heteroarylalkyl groups). The alkylene group that substitutes the hydrogen atom of an aforementioned aromatic hydrocarbon ring or aromatic heterocyclic ring preferably contains 1 to 4 carbon atoms, more preferably 1 or 2 carbon atoms, and most preferably 1 carbon atom.

Of the various possibilities, the aromatic hydrocarbon group for Y is preferably a group in which one hydrogen atom has been removed from an aromatic hydrocarbon ring or aromatic heterocyclic ring (namely, an aryl group or heteroaryl group), is more preferably an aryl group, and is most preferably a phenyl group or a naphthyl group.

Specific examples of the substituent that may substitute part or all of the hydrogen atoms that constitute the aromatic hydrocarbon group for Y include an alkyl group, alkoxy group, halogen atom, halogenated alkyl group, hydroxyl group, oxo group (=O), and amino group-containing group (such as —NH$_2$ or —SO$_2$—NH$_2$).

The alkyl group for this substituent is preferably an alkyl group of 1 to 5 carbon atoms, is more preferably a methyl group, ethyl group, propyl group, n-butyl group or tert-butyl group, and is most preferably a methyl group.

The alkoxy group for this substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for this substituent include a fluorine atom, chlorine atom, bromine atom and iodine atom, and a fluorine atom is preferred.

Examples of the halogenated alkyl group for this substituent include groups in which part or all of the hydrogen atoms of an aforementioned "alkyl group for this substituent" have each been substituted with an aforementioned halogen atom.

A structural unit represented by general formula (a5-1) or (a5-2) shown below is preferred as the structural unit (a5), as such structural units yield superior sensitivity, resolution and lithography properties.

[Chemical Formula 4]

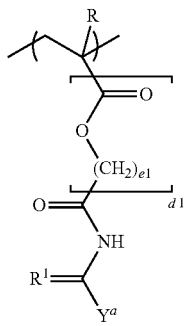
(a5-1)

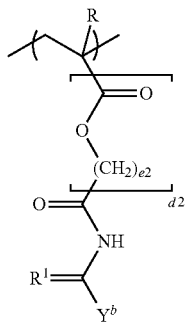
(a5-2)

In the formulas, R represents a hydrogen atom, an alkyl group of 1 to 5 carbon atoms, or a halogenated alkyl group of 1 to 5 carbon atoms, $R^1$ represents a sulfur atom or an oxygen atom, $Y^a$ represents an aromatic hydrocarbon group (wherein one or more carbon atoms or hydrogen atoms within the aromatic hydrocarbon group may be substituted with a substituent), $Y^b$ represents an aliphatic hydrocarbon group (wherein one or more carbon atoms or hydrogen atoms within the aliphatic hydrocarbon group may be substituted with a substituent), each of d1 and d2 represents 0 or 1, and each of e1 and e2 represents an integer of 1 to 5.

In formulas (a5-1) and (a5-2), R is the same as defined for R in the aforementioned formula (a5-0). $R^1$ represents a sulfur atom or an oxygen atom, and is preferably an oxygen atom.

In formula (a5-1), $Y^a$ is the same as defined above for the aromatic hydrocarbon group for Y in formula (a5-0). $Y^a$ is preferably a group in which one hydrogen atom has been removed from an aromatic ring (aromatic hydrocarbon group) (namely, an aryl group), and is most preferably a phenyl group or naphthyl group.

In the aromatic hydrocarbon group for $Y^a$, it is preferable that one or more hydrogen atoms within the group are each substituted with a substituent, and the hydrogen atoms are most preferably substituted with a halogen atom or an amino group-containing group.

In formula (a5-2), $Y^b$ is the same as defined above for the aliphatic hydrocarbon group for Y in formula (a5-0). $Y^b$ is preferably a cyclic aliphatic hydrocarbon group (in which one or more of the carbon atoms or hydrogen atoms of the aliphatic hydrocarbon group may be substituted with a substituent), and is more preferably a polycyclic aliphatic cyclic group.

Specific examples of the structural units represented by the aforementioned general formulas (a5-1) and (a5-2) are shown below.

In each of the following formulas, $R^\alpha$ represents a hydrogen atom, a methyl group, or a trifluoromethyl group.

[Chemical Formula 5]

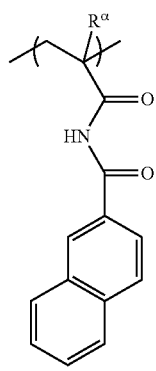
(a5-1-1)

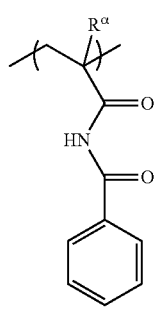
(a5-1-2)

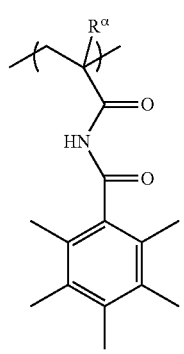
(a5-1-3)

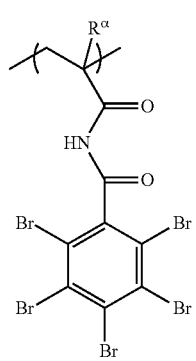
(a5-1-4)

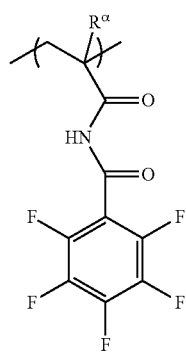 (a5-1-5)
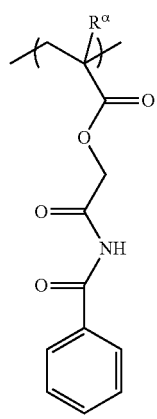 (a5-1-6)
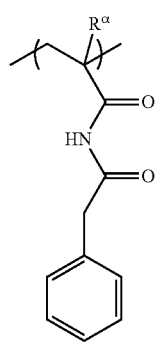 (a5-1-7)
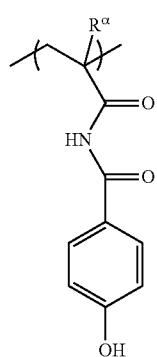 (a5-1-8)
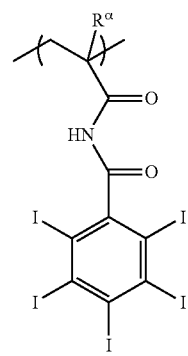 (a5-1-9)
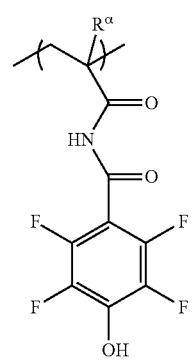 (a5-1-10)
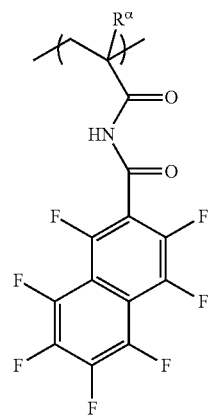 (a5-1-11)
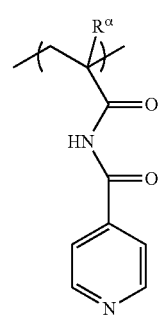 (a5-1-12)

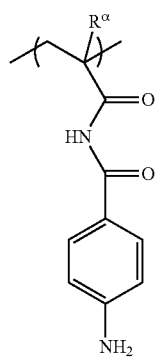 (a5-1-13)
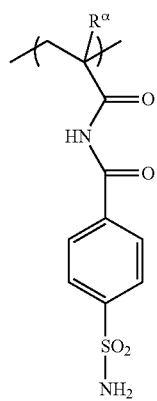 (a5-1-14)
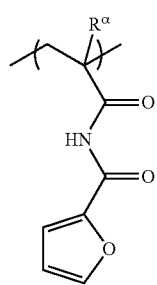 (a5-1-15)
[Chemical Formula 6]
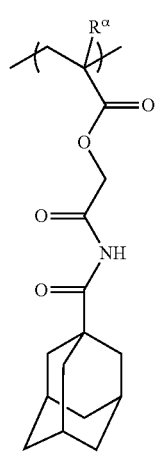 (a5-2-1)
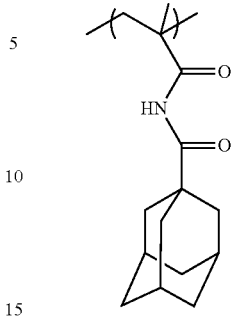 (a5-2-2)
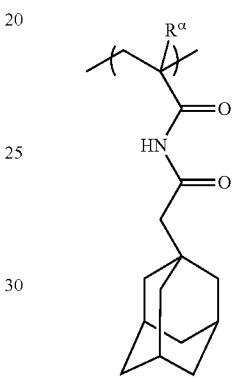 (a5-2-3)
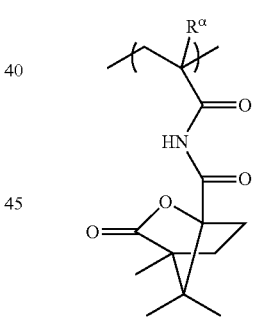 (a5-2-4)
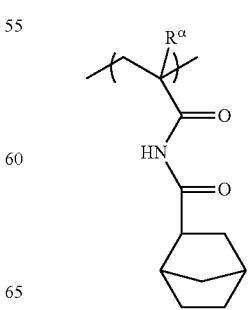 (a5-2-5)

(a5-2-6)
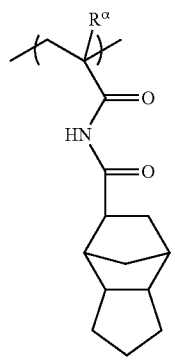
(a5-2-7)
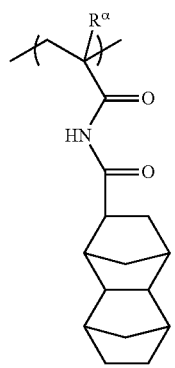
(a5-2-8)
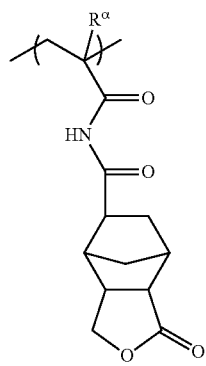
[Chemical Formula 7]
(a5-2-9)
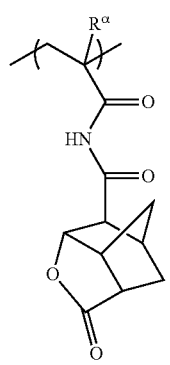
(a5-2-10)
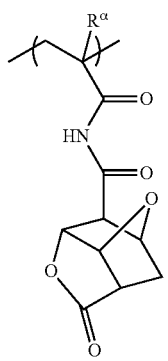
(a5-2-11)
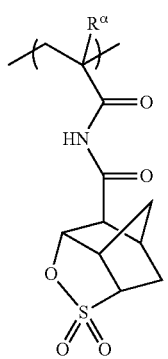
(a5-2-12)
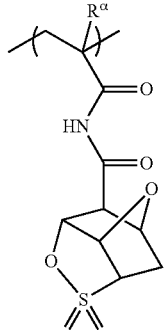
[Chemical Formula 8]
(a5-2-13)
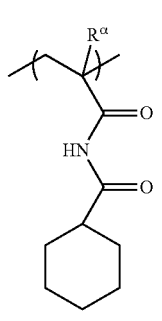

(a5-2-14)
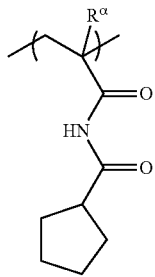

(a5-2-15)
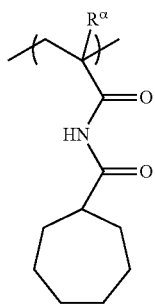

(a5-2-16)
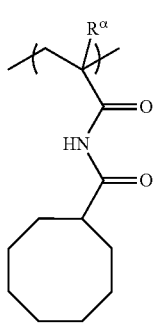

(a5-2-17)
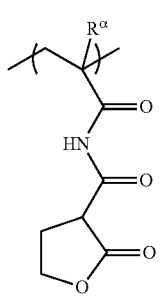

(a5-2-18)
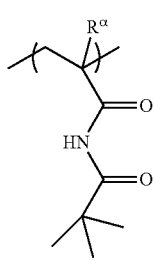

(a5-2-19)
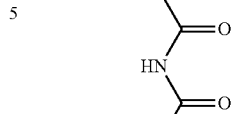

(a5-2-20)
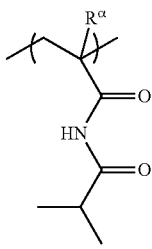

(a5-2-21)
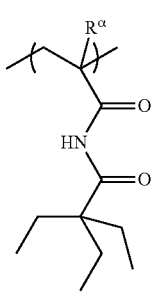

The structural unit (a5) is preferably at least one structural unit selected from the group consisting of structural units represented by general formula (a5-1) and structural units represented by general formula (a5-2).

Among these, at least one structural unit selected from the group consisting of structural units represented by formulas (a5-1-1) to (a5-1-5), formulas (a5-2-1) to (a5-2-4), and formulas (a5-2-13) and (a5-2-18) is particularly preferred.

The component (A1-1) may have a single type of the structural unit (a5), or a combination of two or more types.

The amount of the structural unit (a5) within the component (A1-1), based on the combined total of all the structural units that constitute the component (A1-1), is preferably within a range from 5 to 95 mol %, more preferably from 5 to 80 mol %, still more preferably from 10 to 70 mol %, and most preferably from 10 to 65 mol %.

When the amount of the structural unit (a5) is at least as large as the lower limit of the above range, the effects of the invention in improving the sensitivity, the resolution and the lithography properties can be more easily realized. On the other hand, when the amount of the structural unit (a5) is not more than the upper limit of the above range, a good balance can be achieved with the other structural units.

—Structural Unit (a6)

The structural unit (a6) is a structural unit that generates acid upon exposure.

There are no particular limitations on the structural unit (a6), provided that it is a structural unit that generates acid upon exposure, and for example, a structural unit that can be copolymerized with the structural unit (a5) and includes a structure that has been proposed as an acid generator for a conventional chemically amplified resist can be used.

Preferred examples of structural units that can be copolymerized with the structural unit (a5) include structural units derived from an acrylate ester in which the hydrogen atom bonded to the carbon atom on the α-position may be substituted with a substituent, and structural units derived from hydroxystyrene in which the hydrogen atom bonded to the carbon atom on the α-position may be substituted with a substituent, and in which the hydrogen atoms bonded to the benzene ring may be substituted with a substituent other than a hydroxyl group (namely, structural units derived from α-substituted) hydroxystyrenes).

Preferred examples of structures that have been proposed as acid generators for conventional chemically amplified resists include the structures described below for a component (B).

The structural unit (a6) is preferably a structural unit containing a cationic group, or a structural unit containing an anionic group such as a sulfonate anion, carboxylate anion, sulfonylimide anion, bis(alkylsulfonyl)imide anion or tris(alkylsulfonyl)methide anion.

Among the various possibilities, the structural unit (a6) is preferably a structural unit having a group represented by general formula (a6-0-1) or general formula (a6-0-2) shown below.

[Chemical Formula 9]

In the formulas, each of $Q^1$ and $Q^2$ independently represents a single bond or a divalent linking group, each of $R^3$, $R^4$ and $R^5$ independently represents an organic group, wherein $R^4$ and $R^5$ may be bonded to each other to form a ring in combination with the sulfur atom in the formula, $V^-$ represents a counter anion, $A^-$ represents an organic group containing an anion, and $M^{m+}$ represents an organic cation having a valency of m, wherein m represents an integer of 1 to 3.

—Structural Units Having a Group Represented by Formula (a6-0-1)

In formula (a6-0-1), $Q^1$ represents a single bond or a divalent linking group.

There are no particular limitations on the divalent linking group for $Q^1$, but examples of preferred groups include divalent hydrocarbon groups which may have a substituent, and divalent linking groups containing a hetero atom.

Examples of the divalent hydrocarbon group which may have a substituent and the divalent linking group containing a hetero atom for the divalent linking group for $Q^1$ include the same groups as those mentioned above for the divalent hydrocarbon group which may have a substituent and the divalent linking group containing a hetero atom for $R^2$ in formula (a5-0).

Among these groups, $Q^1$ is preferably a single bond, an ester linkage [—C(═O)—O], an ether linkage (—O—), an alkylene group, or a combination thereof.

In formula (a6-0-1), each of $R^3$, $R^4$ and $R^5$ independently represents an organic group, wherein $R^4$ and $R^5$ may be bonded to each other to form a ring in combination with the sulfur atom in the formula.

The organic group for each of $R^3$ to $R^5$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

Examples of the organic group include hydrocarbon groups in which part or all of the hydrogen atoms may each be substituted with a substituent, and in which a linking group may be inserted between carbon atoms of the group. Examples of this linking group include the same groups as those mentioned above for the divalent linking group containing a hetero atom for $Q^1$. The organic group may or may not have an aromatic hydrocarbon group.

Here, an aromatic hydrocarbon group describes a hydrocarbon group having at least one aromatic ring. There are no particular limitations on the aromatic ring, provided it is a cyclic conjugated system having 4n+2 (wherein n represents 0 or a natural number) π electrons, and examples include the same aromatic rings as those mentioned above within the description of the aromatic hydrocarbon group for Y. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic ring include an oxygen atom, a sulfur atom and a nitrogen atom. Specific examples of the aromatic heterocyclic rings include a pyridine ring and a thiophene ring. A substituent may be bonded to the aromatic hydrocarbon ring. Examples of this substituent include the same substituents as those described above for substituting part or all of the hydrogen atoms that constitute the aromatic hydrocarbon group for Y.

In the formula (a6-0-1), the organic group for $R^3$ is preferably an alkylene group which may have a substituent, or an arylene group which may have a substituent.

Examples of the alkylene group which may have a substituent for $R^3$ include unsubstituted alkylene groups, and substituted alkylene groups in which part or all of the hydrogen atoms of an unsubstituted alkylene group have each been substituted with a substituent.

The unsubstituted alkylene group may be linear, branched or cyclic. From the viewpoint of achieving superior resolution, an alkylene group of 1 to 10 carbon atoms is preferred, and an alkylene group of 1 to 5 carbon atoms is more preferred. Specific examples include a methylene group, ethylene group, n-propylene group, isopropylene group, n-butylene group, isobutylene group, n-pentenylene group, cyclopentylene group, hexylene group, cyclohexylene group, nonylene group and decylene group.

Examples of the substituent within the substituted alkylene group include a halogen atom, oxo group (═O), cyano group, alkyl group, alkoxyalkyloxy group, alkoxycarbonylalkyloxy group, —C(═O)—O—R⁷", —O—C(═O)—R⁸", —O—R⁹", and aryl group. Each of R⁷", R⁸" and R⁹" independently represents a hydrogen atom or a hydrocarbon group.

Among these, examples of the halogen atom as the substituent within the substituted alkylene group include a fluorine atom, chlorine atom, iodine atom and bromine atom, and a fluorine atom is preferred.

The alkyl group for the substituent within the substituted alkylene group may be linear, branched or cyclic. The alkyl group preferably contains 1 to 30 carbon atoms.

Of such alkyl groups, the linear alkyl group preferably has 1 to 20 carbon atoms, more preferably 1 to 15 carbon atoms, and still more preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched alkyl group preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The cyclic alkyl group may be either monocyclic or polycyclic. The cyclic alkyl group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The cyclic alkyl group is preferably a polycyclic group, is more preferably a group in which one or more hydrogen atoms have been removed from a polycycloalkane, and is most preferably a group in which one or more hydrogen atoms have been removed from adamantane.

Among the various possibilities, the alkyl group for the substituent within the substituted alkylene group is preferably an alkyl group of 1 to 5 carbon atoms, and is most preferably a methyl group, ethyl group, propyl group, n-butyl group or tert-butyl group.

Examples of the alkoxyalkyloxy group for the substituent within the substituted alkylene group include groups represented by a general formula shown below.

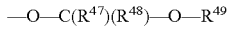

In this formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ is a hydrogen atom. It is particularly desirable that at least one of $R^{47}$ and $R^{48}$ is a hydrogen atom, and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and specific examples include a methyl group, ethyl group, propyl group, n-butyl group and tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Examples of the alkoxycarbonylalkyloxy group for the substituent within the aforementioned substituted alkylene group include groups represented by a general formula shown below.

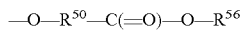

In this formula, $R^{50}$ represents a linear or branched alkylene group, and $R^{56}$ represents a tertiary alkyl group.

The linear or branched alkylene group for $R^{50}$ preferably has 1 to 5 carbon atoms, and specific examples include a methylene group, ethylene group, trimethylene group, tetramethylene group and 1,1-dimethylethylene group.

Examples of the tertiary alkyl group for $R^{56}$ include a 2-methyl-2-adamantyl group, 2-(2-propyl)-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

Further, a group in which $R^{56}$ in the group represented by the aforementioned general formula: —O—$R^{50}$—C(=O)—O—$R^{56}$ has been substituted with $R^{56'}$ can also be used. $R^{56'}$ represents a hydrogen atom, an alkyl group, a fluorinated alkyl group or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which part or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which a hydrogen atom within an aliphatic cyclic group has been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by formulas (L1) to (L6) and (S1) to (S4) described below.

For $R^{56'}$, specific examples of the groups in which a hydrogen atom within an aliphatic cyclic group has been substituted with a hetero atom include groups in which two hydrogen atoms within an aliphatic cyclic group have been substituted with an oxo group (=O).

$R^{7''}$ in —C(=O)—O—$R^{7''}$ represents a hydrogen atom or a hydrocarbon group.

The hydrocarbon group for $R^{7''}$ may be an aliphatic hydrocarbon group or an aromatic hydrocarbon group. The aliphatic hydrocarbon group may be either a saturated hydrocarbon group or an unsaturated hydrocarbon group.

The saturated hydrocarbon group for $R^{7''}$ may be linear, branched or cyclic, or a combination thereof.

The linear or branched saturated hydrocarbon group preferably has 1 to 25 carbon atoms, more preferably 1 to 15 carbon atoms, and still more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group include the tertiary alkyl groups described for $R^{56}$. Further, examples of branched saturated hydrocarbon groups other than tertiary alkyl groups include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxo group (=O), cyano group and carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group for $R^{7''}$ preferably contains 3 to 20 carbon atoms. The cyclic saturated hydrocarbon group may be either a polycyclic group or a monocyclic group, and examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, part of the carbon atoms that constitute a ring within the cyclic saturated hydrocarbon group may be substituted with a hetero atom, or a hydrogen atom bonded to a ring within the cyclic saturated hydrocarbon may be substituted with a substituent.

Examples of the former case include groups in which one or more hydrogen atoms have been removed from a heterocycloalkane in which a portion of the carbon atoms that constitute the ring(s) of an aforementioned monocycloalkane or polycycloalkane have been substituted with a hetero atom such as an oxygen atom, sulfur atom or nitrogen atom. Further, the ring structure may contain an ester linkage (—C(=O)—O—). More specific examples include a lactone-containing monocyclic group, such as a group in which one hydrogen atom has been removed from γ-butyrolactone, and a lactone-containing polycyclic group, such as a group in which one hydrogen atom has been removed from a bicycloalkane, tricycloalkane or tetracycloalkane containing a lactone ring.

In the latter case, examples of the substituent include the same substituents as those described above for the linear or branched saturated hydrocarbon group, or an alkyl group of 1 to 5 carbon atoms.

Further, the saturated hydrocarbon group for $R^{7''}$ may be a combination of a linear or branched saturated hydrocarbon group and a cyclic saturated hydrocarbon group. Examples of combinations of a linear or branched saturated hydrocarbon group and a cyclic saturated hydrocarbon group include groups in which a cyclic saturated hydrocarbon group is bonded as a substituent to a linear or branched saturated hydrocarbon group (such as a 1-(1-adamantyl)methyl group), and groups in which a linear or branched saturated hydrocarbon group is bonded as a substituent to a cyclic saturated hydrocarbon group.

The aliphatic unsaturated hydrocarbon group for $R^{7''}$ is preferably a linear or branched group. Examples of the linear aliphatic unsaturated hydrocarbon group include a vinyl group, propenyl group (allyl group), and butynyl group. Examples of the branched aliphatic unsaturated hydrocarbon group include a 1-methylpropenyl group and 2-methylpropenyl group. These linear or branched aliphatic unsaturated hydrocarbon groups may have a substituent. Examples of the substituent include the same substituents as those described above for the "linear or branched saturated hydrocarbon group".

The aromatic hydrocarbon group for $R^{7''}$ is a monovalent hydrocarbon group having at least one aromatic ring, and may also have a substituent.

There are no particular limitations on the aromatic ring, provided it is a cyclic conjugated system having 4n+2 (wherein n represents 0 or a natural number) π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. However, this preferred number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic ring include an oxygen atom, a sulfur atom and a nitrogen atom. Specific examples of the aromatic heterocyclic ring include a pyridine ring and a thiophene ring.

Specific examples of the aromatic hydrocarbon group for $R^{7\prime\prime}$ include groups in which one hydrogen atom has been removed from an aromatic hydrocarbon ring or aromatic heterocyclic ring (namely, aryl groups or heteroaryl groups), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group, and heteroarylalkyl groups). The alkylene group that substitutes the hydrogen atom of an aforementioned aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group for $R^{7\prime\prime}$ may or may not have a substituent. Examples of this substituent include an alkyl group, alkoxy group, halogen atom, halogenated alkyl group, hydroxyl group and oxo group (=O).

The alkyl group for this substituent is preferably an alkyl group of 1 to 5 carbon atoms, and is most preferably a methyl group, ethyl group, propyl group, n-butyl group or tert-butyl group.

The alkoxy group for this substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for this substituent include a fluorine atom, chlorine atom, bromine atom and iodine atom, and a fluorine atom is preferred.

Examples of the halogenated alkyl group for the substituent include groups in which part or all of the hydrogen atoms of an aforementioned "alkyl group for this substituent" have each been substituted with an aforementioned halogen atom.

Of the various possibilities described above, from the viewpoints of achieving superior lithography properties and a favorable resist pattern shape, $R^{7\prime\prime}$ is preferably a hydrogen atom, a saturated hydrocarbon group or an aliphatic unsaturated hydrocarbon group, and is more preferably a hydrogen atom, a linear or branched saturated hydrocarbon group of 1 to 15 carbon atoms, or a cyclic saturated hydrocarbon group of 3 to 20 carbon atoms.

$R^{8\prime\prime}$ in —O(C=O)—$R^{8\prime\prime}$ represents a hydrogen atom or a hydrocarbon group.

Specific examples for $R^{8\prime\prime}$ include the same groups as those mentioned above for $R^{7\prime\prime}$. Among the various possibilities, from the viewpoints of achieving superior lithography properties and a favorable resist pattern shape, $R^{8\prime\prime}$ is preferably a hydrogen atom, a saturated hydrocarbon group or an aliphatic unsaturated hydrocarbon group, and is more preferably a hydrogen atom, a linear or branched saturated hydrocarbon group of 1 to 15 carbon atoms, or a cyclic saturated hydrocarbon group of 3 to 20 carbon atoms.

$R^{9\prime}$ in —O—$R^{9\prime\prime}$ represents a hydrogen atom or a hydrocarbon group.

Specific examples for $R^{9\prime\prime}$ include the same groups as those mentioned above for $R^{7\prime\prime}$. Among the various possibilities, from the viewpoints of achieving superior lithography properties and a favorable resist pattern shape, $R^{9\prime\prime}$ is preferably a hydrogen atom, a saturated hydrocarbon group or an aliphatic unsaturated hydrocarbon group, and is more preferably a hydrogen atom, a linear or branched saturated hydrocarbon group of 1 to 15 carbon atoms, or a cyclic saturated hydrocarbon group of 3 to 20 carbon atoms.

The group —O—$R^{9\prime\prime}$ is preferably a hydroxyl group or an alkoxy group of 1 to 5 carbon atoms, and is most preferably a methoxy group, ethoxy group, n-propoxy group, iso-propoxy group, n-butoxy group or tert-butoxy group.

The aryl group for the substituent within the aforementioned substituted alkylene group is preferably an aryl group of 6 to 10 carbon atoms, because such groups enable lower cost synthesis. Specific examples include a phenyl group and a naphthyl group. This aryl group for the substituent may itself have a substituent. Examples of this substituent for the aryl group substituent include the same substituents as those mentioned above for the aromatic hydrocarbon group for $R^{7\prime\prime}$.

In formula (a6-0-1), examples of the arylene group which may have a substituent for $R^3$ include unsubstituted arylene groups of 6 to 20 carbon atoms, and substituted arylene groups in which part or all of the hydrogen atoms within such an unsubstituted arylene group have each been substituted with a substituent.

The unsubstituted arylene group is preferably an arylene group of 6 to 10 carbon atoms, because such groups enable lower cost synthesis. Specific examples include a phenylene group and a naphthylene group.

Examples of the substituent in the "substituted arylene group" include the same substituents as those mentioned above for the substituent in the aforementioned substituted alkylene group. Specific examples of suitable substituents among those mentioned above as the substituent for the substituted alkylene group include a halogen atom, oxo group (=O), cyano group, alkyl group, alkoxyalkyloxy group, alkoxycarbonylalkyloxy group, —C(=O)—O—$R^{7\prime\prime}$, —O—C(=O)—$R^{9\prime\prime}$, and —O—$R^{9\prime\prime}$ (wherein each of $R^{7\prime\prime}$, $R^{8\prime\prime}$ and $R^{9\prime\prime}$ independently represents a hydrogen atom, a saturated hydrocarbon group, or an aliphatic unsaturated hydrocarbon group).

In formula (a6-0-1), there are no particular limitations on the organic groups for $R^4$ and $R^5$, and examples include aryl groups which may have a substituent, alkyl groups which may have a substituent, and alkenyl groups which may have a substituent. Among these, an aryl group which may have a substituent or an alkyl group which may have a substituent is preferred, and an alkyl group which may have a substituent is particularly desirable.

Examples of the aryl group which may have a substituent include unsubstituted aryl groups of 6 to 20 carbon atoms, and substituted aryl groups in which part or all of the hydrogen atoms of such an unsubstituted aryl group have each been substituted with a substituent.

The unsubstituted aryl group is preferably an aryl group of 6 to 10 carbon atoms, because such groups enable lower cost synthesis. Specific examples include a phenyl group and a naphthyl group.

Examples of the substituent in the substituted aryl group include non-aromatic substituents. Specific examples of these non-aromatic substituents include the same substituents as those mentioned above for the substituent which the aforementioned "substituted arylene group" may have (namely, a halogen atom, oxo group (=O), cyano group, alkyl group, alkoxyalkyloxy group, alkoxycarbonylalkyloxy group, —C(=O)—O—$R^{7\prime\prime}$, —O—C(=O)—$R^{8\prime\prime}$, and —O—$R^{9\prime\prime}$).

Examples of the alkyl group for $R^4$ and $R^5$ include unsubstituted alkyl groups, and substituted alkyl groups in which part or all of the hydrogen atoms of such an unsubstituted alkyl group have each been substituted with a substituent.

In terms of achieving superior resolution, the unsubstituted alkyl group is preferably an alkyl group of 1 to 5 carbon atoms.

The unsubstituted alkyl group may be a linear, branched or cyclic group. From the viewpoint of achieving superior resolution, an alkyl group of 1 to 10 carbon atoms is preferred, and an alkyl group of 1 to 5 carbon atoms is more preferable. Specific examples include a methyl group, ethyl group, n-propyl group, isopropyl group, n-butyl group, isobutyl group, n-pentyl group, cyclopentyl group, hexyl group, cyclohexyl group, nonyl group and decyl group.

Examples of the substituent in the substituted alkyl group include the same substituents as those mentioned above for the substituent in the substituted alkylene group for $R^3$.

Examples of the alkenyl group for $R^4$ and $R^5$ include unsubstituted alkenyl groups, and substituted alkenyl groups in which part or all of the hydrogen atoms of such an unsubstituted alkenyl group have each been substituted with a substituent.

The unsubstituted alkenyl group is preferably a linear or branched group, and preferably contains 2 to 10 carbon atoms, more preferably 2 to 5 carbon atoms, and still more preferably 2 to 4 carbon atoms. Specific examples include a vinyl group, propenyl group (allyl group), butynyl group, 1-methylpropenyl group, and 2-methylpropenyl group.

Examples of the substituent in the substituted alkenyl group include the same substituents as those mentioned above for the substituent in the substituted alkylene group for $R^3$.

In formula (a6-0-1), $R^4$ and $R^5$ may be bonded to each other to form a ring in combination with the sulfur atom in the formula. The resulting ring may be saturated or unsaturated. Further, the ring may be monocyclic or polycyclic. For example, in those cases where one or both of $R^4$ and $R^5$ is a cyclic group (a cyclic alkyl group or aryl group), bonding $R^4$ and $R^5$ together forms a polycyclic ring structure (condensed ring structure).

The ring that is formed, which includes the sulfur atom in the formula within the ring structure, is preferably a 3- to 10-membered ring, and more preferably a 5- to 7-membered ring, including the sulfur atom.

The ring may include, among the atoms that constitute the ring structure, a hetero atom other than the sulfur atom that is bonded to $R^4$ and $R^5$. Examples of this hetero atom include a sulfur atom, an oxygen atom, and a nitrogen atom.

Specific examples of the ring that is formed include a thiophene ring, thiazole ring, benzothiophene ring, tetrahydrothiophenium ring and tetrahydrothiopyranium ring.

In formula (a6-0-1), $V^-$ represents a counter anion.

There are no particular limitations on the counter anion for $V^-$, and for example, any of the conventional anions known as anions for onium salt acid generators may be used.

Examples of $V^-$ include anions represented by general formula $R^{4'''}SO_3^-$ (wherein $R^{4'''}$ represents a linear, branched or cyclic alkyl group, a halogenated alkyl group, an aryl group or an alkenyl group, and any of these groups may have a substituent).

In the general formula $R^{4'''}SO_3^-$, $R^{4'''}$ represents a linear, branched or cyclic alkyl group, a halogenated alkyl group, an aryl group or an alkenyl group, wherein the group may have a substituent.

The linear or branched alkyl group for $R^{4'''}$ is preferably a group of 1 to 10 carbon atoms, more preferably 1 to 8 carbon atoms, and most preferably 1 to 4 carbon atoms.

The cyclic alkyl group for $R^{4'''}$ is preferably a cyclic group of 4 to 15 carbon atoms, more preferably 4 to 10 carbon atoms, and most preferably 6 to 10 carbon atoms.

Examples of $R^{4'''}SO_3^-$ when $R^{4'''}$ is an alkyl group include alkylsulfonate ions such as methanesulfonate, n-propanesulfonate, n-butanesulfonate, n-octanesulfonate, 1-adamantanesulfonate, 2-norbornanesulfonate and d-camphor-10-sulfonate.

The halogenated alkyl group for $R^{4'''}$ is a group in which part or all of the hydrogen atoms within an alkyl group have each been substituted with a halogen atom, wherein the alkyl group is preferably an alkyl group of 1 to 5 carbon atoms, is more preferably a linear or branched alkyl group, and is most preferably a methyl group, ethyl group, propyl group, isopropyl group, n-butyl group, tert-butyl group, tert-pentyl group, or isopentyl group. Examples of the halogen atom used for substituting each hydrogen atom include a fluorine atom, chlorine atom, iodine atom and bromine atom.

In the halogenated alkyl group, it is preferable that 50 to 100% of all the hydrogen atoms within the alkyl group (the alkyl group prior to halogenation) are substituted with halogen atoms, and groups in which all of the hydrogen atoms have been substituted with halogen atoms are particularly desirable.

As the halogenated alkyl group, a fluorinated alkyl group is preferred. The fluorinated alkyl group preferably contains 1 to 10 carbon atoms, more preferably 1 to 8 carbon atoms, and most preferably 1 to 4 carbon atoms.

Furthermore, the fluorination ratio of the fluorinated alkyl group is preferably within a range from 10 to 100%, and more preferably from 50 to 100%. Groups in which all of the hydrogen atoms have been substituted with fluorine atoms are particularly desirable as they yield stronger acids.

Specific examples of these types of preferred fluorinated alkyl groups include a trifluoromethyl group, heptafluoro-n-propyl group and nonafluoro-n-butyl group.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part or all of the hydrogen atoms within the aforementioned linear, branched or cyclic alkyl group, halogenated alkyl group, aryl group or alkenyl group may each be substituted with a substituent (an atom other than a hydrogen atom, or a group).

$R^{4'''}$ may have one substituent, or two or more substituents.

Examples of the substituent include a halogen atom, a hetero atom, an alkyl group, and a group represented by the formula $X^3$-Q'- (wherein Q' represents a divalent linking group containing an oxygen atom, and $X^3$ represents a hydrocarbon group of 3 to 30 carbon atoms which may have a substituent).

Examples of the halogen atom and the alkyl group include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X^3$-Q'-, Q' represents a divalent linking group containing an oxygen atom.

$Q^1$ may contain an atom other than the oxygen atom. Examples of these atoms other than the oxygen atom include a carbon atom, a hydrogen atom, a sulfur atom and a nitrogen atom.

Examples of the divalent linking group containing an oxygen atom include non-hydrocarbon, oxygen atom-containing linking groups such as an oxygen atom (an ether linkage; —O—), an ester linkage (—C(=O)—O—), an amide linkage (—C(=O)—NH—), a carbonyl group (—C(=O)—) and a carbonate linkage (—O—C(=O)—O—); and combinations of the aforementioned non-hydrocarbon, oxygen atom-containing linking groups with an alkylene group. A sulfonyl group (—$SO_2$—) may also be included in these combinations.

Specific examples of these combinations include —$R^{91}$—O—, —$R^{92}$—O—C(=O)—, —C(=O)—O—$R^{93}$—O—C(=O)—, —$SO_2$—O—$R^{94}$—O—C(=O)— and —$R^{95}$—$SO_2$—O—$R^{94}$—O—C(=O)— (wherein each of $R^{91}$ to $R^{95}$ independently represents an alkylene group).

The alkylene group for $R^{91}$ to $R^{95}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Q' is preferably a divalent linking group containing an ester linkage or an ether linkage, and is more preferably a group represented by —$R^{91}$—O—, —$R^{92}$—O—C(=O)— or —C(=O)—O—$R^{93}$—O—C(=O)—.

In the group represented by the formula $X^3$-Q'-, the hydrocarbon group for $X^3$ may be either an aromatic hydrocarbon group or an aliphatic hydrocarbon group.

The aromatic hydrocarbon group for $X^3$ is a hydrocarbon group having at least one aromatic ring.

There are no particular limitations on the aromatic ring, provided it is a cyclic conjugated system having 4n+2 (wherein n represents 0 or a natural number) π electrons, and the aromatic ring may be either monocyclic or polycyclic. The aromatic ring preferably has 5 to 30 carbon atoms, more preferably 5 to 20 carbon atoms, still more preferably 6 to 15 carbon atoms, and most preferably 6 to 12 carbon atoms. Here, this number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for $X^3$ include groups in which one hydrogen atom has been removed from an aromatic hydrocarbon ring or aromatic heterocyclic ring (namely, aryl groups or heteroaryl groups), groups in which one hydrogen atom has been removed from an aromatic compound having two or more aromatic rings (such as biphenyl or fluorene), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group, and heteroarylalkyl groups). The alkylene group that substitutes the hydrogen atom of an aforementioned aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group for $X^3$ may have a substituent. For example, a hydrogen atom bonded to the aromatic ring within the aromatic hydrocarbon group may be substituted with a substituent. Examples of this substituent include an alkyl group, alkoxy group, halogen atom, halogenated alkyl group, hydroxyl group and oxo group (=O).

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

The aliphatic hydrocarbon group for $X^3$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $X^3$, a portion of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on this "hetero atom" in $X^3$, as long as it is an atom other than a carbon atom or a hydrogen atom. Examples of the hetero atom include a halogen atom, an oxygen atom, a sulfur atom and a nitrogen atom.

Examples of the halogen atom include a fluorine atom, chlorine atom, iodine atom and bromine atom.

The substituent containing a hetero atom may consist solely of the hetero atom, or may be a group that also contains an atom or group of atoms in addition to the hetero atom.

Specific examples of the substituent for substituting a portion of the carbon atoms include —O—, —C(=O)—O—, —C(=O)—, —O—C(=O)—O—, —C(=O)—NH—, —NH— (wherein H may be replaced with a substituent such as an alkyl group or an acyl group), —S—, —S(=O)$_2$— and —S(=O)$_2$—O—. When the aliphatic hydrocarbon group is cyclic, any of these substituents may be included within the ring structure of the aliphatic hydrocarbon group.

Examples of the substituent for substituting part or all of the hydrogen atoms include an alkoxy group, halogen atom, halogenated alkyl group, hydroxyl group, oxo group (=O) and cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, chlorine atom, bromine atom and iodine atom, and a fluorine atom is preferable.

Examples of the aforementioned halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

The aliphatic hydrocarbon group for $X^3$ is preferably a linear or branched saturated hydrocarbon group, a linear or branched monovalent unsaturated hydrocarbon group, or a cyclic aliphatic hydrocarbon group (aliphatic cyclic group).

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, propenyl group (allyl group) and butynyl group. Examples of branched monovalent unsaturated hydrocarbon groups include a 1-methylpropenyl group and a 2-methylpropenyl group.

Among the above examples, the unsaturated hydrocarbon group is most preferably a propenyl group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 10]

(L1)

(L2)

(L3)

(L4)

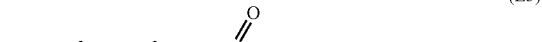
(L5)

(L6)

(S1)

(S2)

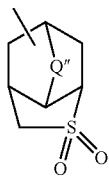

(S3)

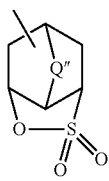

(S4)

In the formulas, Q" represents an alkylene group of 1 to 5 carbon atoms, —O—, —S—, —O—$R^{94'}$— or —S—$R^{95'}$— (wherein each of $R^{94'}$ and $R^{95'}$ independently represents an alkylene group of 1 to 5 carbon atoms), and m represents an integer of 0 or 1.

Examples of the alkylene groups for Q", $R^{94'}$ and $R^{95'}$ include the same alkylene groups as those described above for $R^{91}$ to $R^{95}$.

In these aliphatic cyclic groups, part of the hydrogen atoms bonded to the carbon atoms constituting the ring structure may be substituted with a substituent. Examples of the substituent include an alkyl group, alkoxy group, halogen atom, halogenated alkyl group, hydroxyl group and oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting part or all of the hydrogen atoms.

In the present invention, $X^3$ is preferably a cyclic group which may have a substituent. The cyclic group may be either an aromatic hydrocarbon group which may have a substituent, or an aliphatic cyclic group which may have a substituent, and an aliphatic cyclic group which may have a substituent is preferable.

The aromatic hydrocarbon group is preferably a naphthyl group which may have a substituent or a phenyl group which may have a substituent.

The aliphatic cyclic group which may have a substituent is preferably a polycyclic aliphatic cyclic group which may have a substituent. As this polycyclic aliphatic cyclic group, groups in which one or more hydrogen atoms have been removed from an aforementioned polycycloalkane, and groups represented by the above formulas (L2) to (L6), and (S3) and (S4) are preferable.

Among the above possibilities, $R^{4'''}$ is preferably a halogenated alkyl group or a group having $X^3$-Q'- as a substituent.

In those cases where $R^{4'''}$ has $X^3$-Q'- as a substituent, $R^{4'''}$ is preferably a group represented by the formula $X^3$-Q'-$Y^3$- (wherein $Q^1$ and $X^3$ are the same as defined above, and $Y^3$ represents an alkylene group of 1 to 4 carbon atoms which may have a substituent, or a fluorinated alkylene group of 1 to 4 carbon atoms which may have a substituent).

In the group represented by the formula $X^3$-Q'-$Y^3$—, examples of the alkylene group represented by $Y^3$ include those alkylene groups described above for $Q^1$ in which the number of carbon atoms is within a range from 1 to 4.

Examples of the fluorinated alkylene group for $Y^3$ include groups in which part or all of the hydrogen atoms of an aforementioned alkylene group have each been substituted with a fluorine atom.

Specific examples of $Y^3$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—, —CHF—, —$CH_2CF_2$—, —$CH_2CH_2CF_2$—, —$CH_2CF_2CF_2$—, —CH$(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)$ $CH_2CH_2$—, —$CH_2CH(CF_3)CH_2$—, —$CH(CF_3)CH$ $(CF_3)$—, —$C(CF_3)_2CH_2$—, —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)$ $CH_2CH_2$—, —$CH_2CH(CH_3)CH_2$—, —$CH(CH_3)CH$ $(CH_3)$—, —$C(CH_3)_2CH_2$—, —$CH(CH_2CH_3)CH_2$—, —CH$(CH_2CH_2CH_3)$— and —$C(CH_3)(CH_2CH_3)$—.

$Y^3$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)$ $CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group of atoms.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of $R^{4'''}SO_3^-$ in those cases where $R^{4'''}$ is a group represented by $X^3$-Q'-$Y^3$- include anions represented by formulas (b1) to (b9) shown below.

[Chemical Formula 11]

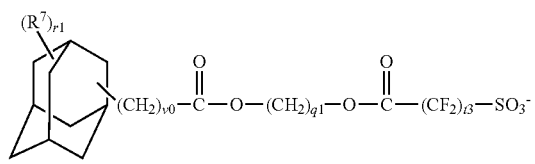

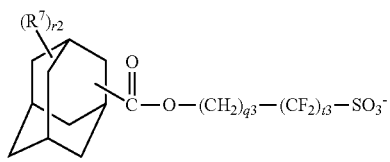
(b-3)

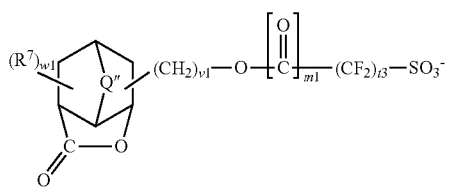
(b-4)

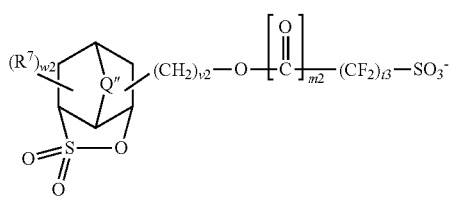
(b-5)

[Chemical Formula 12]

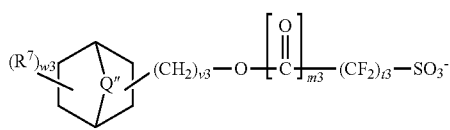
(b-6)

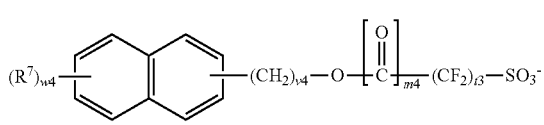
(b-7)

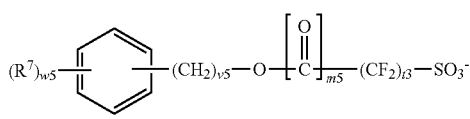
(b-8)

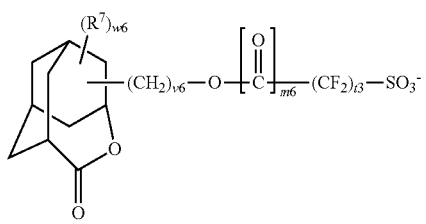
(b-9)

In the above formulas, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^7$ represents a substituent, each of m1 to m6 independently represents 0 or 1, each of v0 to v6 independently represents an integer of 0 to 3, each of w1 to w6 independently represents an integer of 0 to 3, and Q" is the same as defined above.

Examples of the substituent for $R^7$ include the same groups as those mentioned above, within the description relating to $X^3$, as substituents that may substitute part of the hydrogen atoms bonded to the carbon atoms that constitute the ring structure of an aliphatic cyclic group, or as substituents that may substitute the hydrogen atoms bonded to an aromatic ring within an aromatic hydrocarbon group.

When the subscript (r1, r2 or w1 to w6) appended to $R^7$ represents an integer of 2 or more, the corresponding plurality of $R^7$ groups within the compound may be the same or different.

Examples of $V^-$ in the aforementioned formula (a6-0-1) include anions represented by general formula (b-3) shown below, and anions represented by general formula (b-4) shown below.

[Chemical Formula 13]

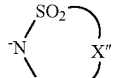
(b-3)

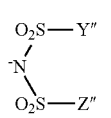
(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

In formula (b-3), X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In formula (b-4), each of Y" and Z" independently represents a linear or branched alkyl group in which at least one hydrogen atom has been substituted with a fluorine atom, wherein the alkyl group preferably has 1 to 10 carbon atoms, more preferably 1 to 7 carbon atoms, and most preferably 1 to 3 carbon atoms.

The smaller the number of carbon atoms in the alkylene group for X" or the alkyl group for Y" and Z" within the aforementioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or an electron beam is improved.

The fluorination ratio for the alkylene group or alkyl group is preferably within a range from 70 to 100%, and more preferably from 90 to 100%. A perfluoroalkylene or perfluoroalkyl group in which all the hydrogen atoms have been substituted with fluorine atoms is the most desirable.

$V^-$ in formula (a6-0-1) is preferably an anion represented by general formula $R^{4"}SO_3^-$ (and in particular, an anion of one of the above formulas (b1) to (b9), which represent anions in which $R^{4"}$ is a group represented by $X^3$-Q'-$Y^3$—).

Specific examples of the group represented by formula (a6-0-1) are shown below. In the chemical formulas shown below, $V^-$ is the same as defined above.

[Chemical Formula 14]

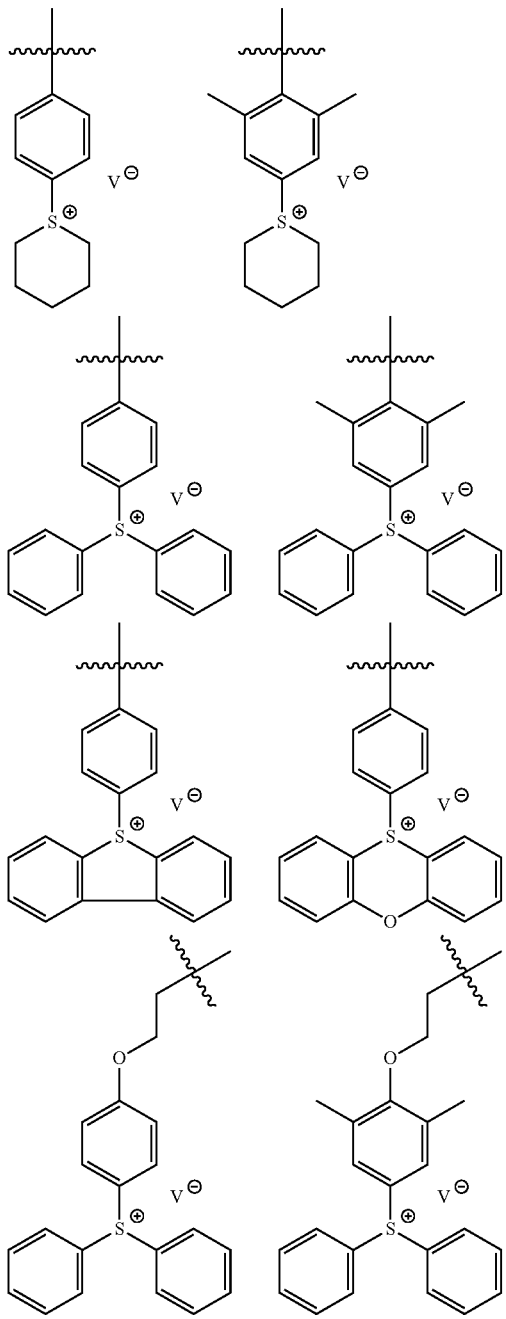

Although there are no particular limitations on the structural unit having a group represented by the aforementioned general formula (a6-0-1) (hereafter referred to as "structural unit (a6-1)"), provided that the structural unit includes a group represented by general formula (a6-0-1) within the structure, a structural unit derived from a compound having an ethylenic double bond is preferable.

Here, "a structural unit derived from a compound having an ethylenic double bond" describes a structural unit having a structure formed by cleavage of the ethylenic double bond in the compound having the ethylenic double bond, resulting in the formation of a single bond.

Examples of compounds having an ethylenic double bond include acrylic acid or an ester thereof in which the hydrogen atom bonded to the carbon atom on the α-position may be substituted with a substituent, acrylamide or a derivative thereof in which the hydrogen atom bonded to the carbon atom on the α-position may be substituted with a substituent, vinyl aromatic compounds in which the hydrogen atom bonded to the carbon atom on the α-position may be substituted with a substituent, cycloolefins and derivatives thereof, and vinyl sulfonates.

Among these compounds, acrylic acid or an ester thereof in which the hydrogen atom bonded to the carbon atom on the α-position may be substituted with a substituent, acrylamide or a derivative thereof in which the hydrogen atom bonded to the carbon atom on the α-position may be substituted with a substituent, and vinyl aromatic compounds in which the hydrogen atom bonded to the carbon atom on the α-position may be substituted with a substituent are preferred.

The term "acrylate ester" describes a compound in which the hydrogen atom at the carboxyl group terminal of acrylic acid ($CH_2$=CH—COOH) has been substituted with an organic group.

In the present description, an acrylic acid or acrylate ester in which the hydrogen atom bonded to the carbon atom on the α-position is substituted with a substituent may also be referred to as an "α-substituted acrylic acid" or "α-substituted acrylate ester" respectively. Further, the generic term "(α-substituted) acrylic acid" may be used to describe either or both acrylic acid and the α-substituted acrylic acid, and the generic term "(α-substituted) acrylate ester" may be used to describe either or both of the acrylate ester and the α-substituted acrylate ester.

Examples of the substituent bonded to the carbon atom on the α-position in an α-substituted acrylic acid or ester thereof include a halogen atom, an alkyl group of 1 to 5 carbon atoms, a halogenated alkyl group of 1 to 5 carbon atoms and a hydroxyalkyl group. Unless specified otherwise, the α-position of a structural unit derived from an acrylate ester (the α-position carbon atom) refers to the carbon atom having the carbonyl group bonded thereto.

Examples of the halogen atom for the α-position substituent include a fluorine atom, chlorine atom, bromine atom and iodine atom.

Specific examples of the alkyl group of 1 to 5 carbon atoms for the α-position substituent include linear and branched alkyl groups such as a methyl group, ethyl group, propyl group, isopropyl group, n-butyl group, isobutyl group, tert-butyl group, pentyl group, isopentyl group and neopentyl group.

Further, specific examples of the halogenated alkyl group of 1 to 5 carbon atoms for the α-position substituent include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

The hydroxyalkyl group for the α-position substituent is preferably a hydroxyalkyl group of i to 5 carbon atoms, and specific examples include groups in which part or all of the hydrogen atoms of an aforementioned alkyl group of 1 to 5 carbon atoms have each been substituted with a hydroxyl group.

In the present invention, a hydrogen atom, an alkyl group of 1 to 5 carbon atoms or a halogenated alkyl group of 1 to 5 carbon atoms is preferably bonded to the α-position carbon atom of the (α-substituted) acrylic acid or ester thereof, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

The organic group is the same as the organic group of $R^3$ to $R^5$ defined above.

Examples of the acrylamide or derivative thereof include acrylamides in which the hydrogen atom bonded to the carbon atom on the α-position may be substituted with a substituent (hereafter also referred to as an (α-substituted) acrylamide), and compounds in which one or both of the hydrogen atoms at the terminals of the amino group of an α-substituted) acrylamide have each been substituted with a substituent.

Examples of the substituent which may be bonded to the carbon atom on the α-position in an acrylamide or derivative thereof include the same groups as those mentioned above as the substituent bonded to the carbon atom on the α-position in an aforementioned α-substituted acrylate ester.

The substituents that substitute one or both of the hydrogen atoms at the terminals of the amino group of an (α-substituted) acrylamide are preferably organic groups. There are no particular limitations on these organic groups, and examples include the same organic groups as those in an (α-substituted) acrylate ester.

Examples of compounds in which one or both of the hydrogen atoms at the terminals of the amino group of an (α-substituted) acrylamide have been substituted with a substituent include, for example, compounds in which the —C(=O)—O— group bonded to the α-position carbon atom in an (α-substituted) acrylate ester has been substituted with —C(=O)—N($R^b$)— (wherein $R^b$ represents a hydrogen atom or an alkyl group of 1 to 5 carbon atoms).

In the above formula, the alkyl group for $R^b$ is preferably a linear or branched group.

A "vinyl aromatic compound" describes a compound having an aromatic ring and one vinyl group bonded to that aromatic ring, and examples include styrene or a derivative thereof, and vinylnaphthalene or a derivative thereof.

Examples of the substituent which may be bonded to the carbon atom on the α-position of the vinyl aromatic compound (namely, the carbon atom, among the carbon atoms within the vinyl group, that is bonded to the aromatic ring) include the same groups as those mentioned above as the substituent bonded to the carbon atom on the α-position in an aforementioned α-substituted acrylate ester.

Hereafter, the term "(α-substituted) vinyl aromatic compound" may be used to describe a vinyl aromatic compound in which the hydrogen atom bonded to the carbon atom on the α-position may be substituted with a substituent.

Examples of "styrene or a derivative thereof" include styrenes in which the hydrogen atom bonded to the carbon atom on the α-position may be substituted with a substituent, and in which the hydrogen atoms bonded to the benzene ring may each be substituted with a substituent other than a hydroxyl group (hereafter also referred to as "(α-substituted) styrene"), hydroxystyrenes in which the hydrogen atom bonded to the carbon atom on the α-position may be substituted with a substituent, and in which the hydrogen atoms bonded to the benzene ring may each be substituted with a substituent other than a hydroxyl group (hereafter also referred to as "(α-substituted) hydroxystyrene"), compounds in which the hydrogen atom of the hydroxyl group of an (α-substituted) hydroxystyrene has been substituted with an organic group, vinylbenzoic acids in which the hydrogen atom bonded to the carbon atom on the α-position may be substituted with a substituent, and in which the hydrogen atoms bonded to the benzene ring may each be substituted with a substituent other than a hydroxyl group or a carboxyl group (hereafter also referred to as "(α-substituted) vinylbenzoic acid"), and compounds in which the hydrogen atom of the carboxyl group of an (α-substituted) vinylbenzoic acid has been substituted with an organic group.

Hydroxystyrene is a compound in which a single vinyl group and at least one hydroxyl group are bonded to a benzene ring. The number of hydroxyl groups bonded to the benzene ring is preferably from 1 to 3, and most preferably 1. There are no particular limitations on the bonding position(s) of the hydroxyl group(s) on the benzene ring. When there is only one hydroxyl group, the bonding position of the vinyl group is preferably the para-position (4th position). When the number of hydroxyl groups is an integer of two or more, any arbitrary combination of bonding positions may be used.

Vinylbenzoic acid is a compound in which a single vinyl group is bonded to the benzene ring of benzoic acid. There are no particular limitations on the bonding position of the vinyl group on the benzene ring.

There are no particular limitations on the substituent other than a hydroxyl group or carboxyl group which may be bonded to the benzene ring of styrene or a derivative thereof, and examples include a halogen atom, an alkyl group of 1 to 5 carbon atoms, and a halogenated alkyl group of 1 to 5 carbon atoms. Examples of the halogen atom include a fluorine atom, chlorine atom, bromine atom and iodine atom, and a fluorine atom is particularly desirable.

Examples of "vinylnaphthalene or a derivative thereof" include vinylnaphthalenes in which the hydrogen atom bonded to the carbon atom on the α-position may be substituted with a substituent, and in which the hydrogen atoms bonded to the naphthalene ring may each be substituted with a substituent other than a hydroxyl group (hereafter also referred to as "(α-substituted) vinylnaphthalene"), vinyl(hydroxynaphthalenes) in which the hydrogen atom bonded to the carbon atom on the α-position may be substituted with a substituent, and in which the hydrogen atoms bonded to the naphthalene ring may each be substituted with a substituent other than a hydroxyl group (hereafter also referred to as "(α-substituted) vinyl(hydroxynaphthalene)"), and compounds in which the hydrogen atom of the hydroxyl group of an (α-substituted) vinyl(hydroxynaphthalene) has been substituted with a substituent.

Vinyl(hydroxynaphthalene) is a compound in which a single vinyl group and at least one hydroxyl group are bonded to a naphthalene ring. The vinyl group may be bonded to the 1st position or 2nd position of the naphthalene ring. The number of hydroxyl groups bonded to the naphthalene ring is preferably from 1 to 3, and most preferably 1. There are no particular limitations on the bonding position(s) of the hydroxyl group(s) on the naphthalene ring. When the vinyl group is bonded to the 1st position or 2nd position of the naphthalene ring, the hydroxyl group(s) are preferably bonded to any of the 5th to 8th positions. In particular, when there is only one hydroxyl group, the hydroxyl group is preferably bonded to any one of the 5th to 7th positions of the naphthalene ring, and is more preferably bonded to the 5th or 6th position. When the number of hydroxyl groups is an integer of two or more, any arbitrary combination of bonding positions may be used.

Examples of the substituent which may be bonded to the naphthalene ring of the vinylnaphthalene or derivative therefore include the same substituents as those mentioned above for the substituent which may be bonded to the benzene ring of the α-substituted) styrene.

Specific examples of structural units derived from an (α-substituted) acrylic acid or an ester thereof include structural units represented by general formula (U-1) shown below.

Specific examples of structural units derived from an (α-substituted) acrylamide or a derivative thereof include structural units represented by general formula (U-2) shown below.

Among the various (α-substituted) vinyl aromatic compounds, specific examples of structural units derived from an (α-substituted) styrene or a derivative thereof include structural units represented by general formula (U-3) shown below. Further, specific examples of structural units derived from an (α-substituted) vinylnaphthalene or a derivative thereof include structural units represented by general formula (U-4) shown below.

[Chemical Formula 15]

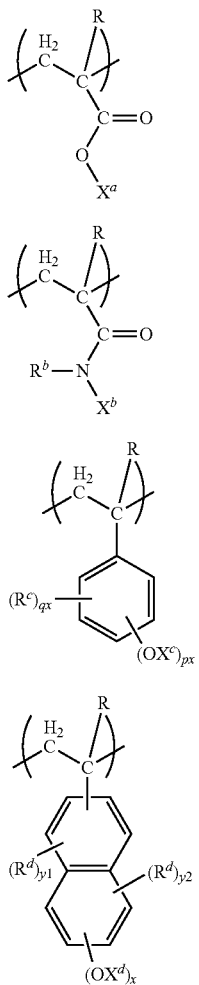

In the formulas, R represents a hydrogen atom, an alkyl group of 1 to 5 carbon atoms, or a halogenated alkyl group of 1 to 5 carbon atoms, each of $X^a$ to $X^d$ independently represents a hydrogen atom or an organic group, $R^b$ represents a hydrogen atom or an alkyl group of 1 to 5 carbon atoms, each of $R^c$ and $R^d$ independently represents a halogen atom, —COOX$^e$ (wherein $X^e$ represents a hydrogen atom or an organic group), an alkyl group of 1 to 5 carbon atoms or a halogenated alkyl group of 1 to 5 carbon atoms, px represents an integer of 0 to 3 and qx represents an integer of 0 to 5, provided that px+qx is from 1 to 5, when qx is an integer of 2 or greater, the plurality of $R^c$ groups may be the same or different, x represents an integer of 0 to 3, y1 represents an integer of 0 to 3, and y2 represents an integer of 0 to 4, provided that x+y1+y2 is from 1 to 7, and when y1+y2 is an integer of 2 or greater, the plurality of $R^d$ groups may be the same or different.

As the structural unit (a6-1), a structural unit derived from an acrylate ester in which the hydrogen atom bonded to the carbon atom on the α-position may be substituted with a substituent, and which also contains a group represented by the aforementioned general formula (a6-0-1) is particularly preferred. Examples of this type of structural unit include structural units represented by formula (a6-11) shown below.

[Chemical Formula 16]

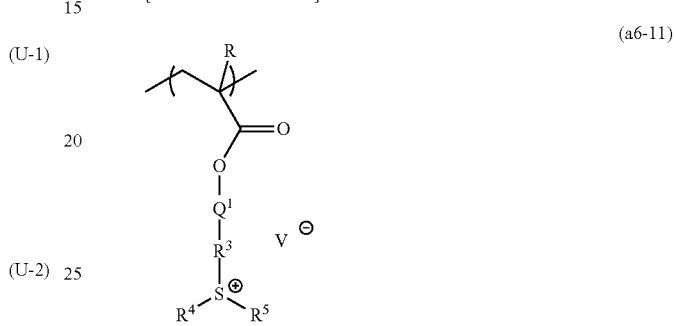

In the formula, R represents a hydrogen atom, an alkyl group of 1 to 5 carbon atoms or a halogenated alkyl group of 1 to 5 carbon atoms, and $Q^1$, $R^3$ to $R^5$ and $V^-$ are the same as defined above.

In formula (a6-11), the alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which part or all of the hydrogen atoms of an aforementioned alkyl group for R have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a6-11), $Q^1$, $R^3$ to $R^5$ and $V^-$ are the same as defined above.

—Structural Units Having a Group Represented by Formula (a6-0-2)

In formula (a6-0-2), $Q^2$ represents a single bond or a divalent linking group. Examples of the divalent linking group for $Q^2$ include the same groups as those described above for the divalent linking group for $Q^1$ in formula (a6-0-1). Of the various possibilities, $Q^2$ is preferably a single bond, a linear or branched alkylene group, a linear or branched fluorinated alkylene group, an arylene group which may have a substituent (preferably a fluorine atom), an ester linkage [—C(=O)—O—], or a combination thereof.

In formula (a6-0-2), A⁻ represents an organic group containing an anion.

There are no particular limitations on A⁻, provided it includes a region that generates an acid anion upon exposure, and groups that can generate a sulfonate anion, carbo anion, carboxylate anion, sulfonylimide anion, bis(alkylsulfonyl) imide anion or tris(alkylsulfonyl)methide anion are preferred.

Among such groups, A is preferably a group represented by one of formulas (a6-2-an1) to (a6-2-an4) shown below.

[Chemical Formula 17]

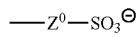
(a6-2-an1)

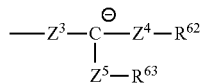
(a6-2-an2)

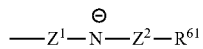
(a6-2-an3)

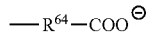
(a6-3-an4)

In the above formulas, $Z^0$ represents a hydrocarbon group of 1 to 30 carbon atoms which may have a substituent, $Z^3$ represents —C(=O)—O—, —SO$_2$— or a hydrocarbon group which may have a substituent, each of $Z^4$ and $Z^5$ independently represents —C(=O)—, or —SO$_2$—, each of $R^{62}$ and $R^{63}$ independently represents a hydrocarbon group which may have a fluorine atom, $Z^1$ represents —C(=O)—, —SO$_2$—, —C(=O)—O— or a single bond, $Z^2$ represents —C(=O)— or —SO$_2$—, $R^{61}$ represents a hydrocarbon group which may have a fluorine atom, and $R^{64}$ represents a hydrocarbon group which may have a fluorine atom or a single bond.

In formula (a6-2-an1), $Z^0$ represents a hydrocarbon group of 1 to 30 carbon atoms which may have a substituent.

The hydrocarbon group of 1 to 30 carbon atoms which may have a substituent represented by $Z^0$ may be either an aliphatic hydrocarbon group or an aromatic hydrocarbon group, and examples include the same aliphatic hydrocarbon groups and aromatic hydrocarbon groups as those described above as the divalent linking group for $Q^1$ in formula (a6-0-1).

Examples of preferred forms of $Z^0$ include groups represented by —[C(R$^{f1}$)(R$^{f2}$)]$_{p0}$—. In this formula, each of R$^{f1}$ and R$^{f2}$ independently represents a hydrogen atom, an alkyl group, a fluorine atom or a fluorinated alkyl group, provided that at least one of R$^{f1}$ and R$^{f2}$ represents a fluorine atom or a fluorinated alkyl group, and p0 represents an integer of 1 to 8.

In those cases where $Z^0$ is a group represented by —[C(R$^{f1}$)(R$^{f2}$)]$_{p0}$—, formula (a6-2-an1) can be represented by formula (a6-2-an1-1) shown below.

[Chemical Formula 18]

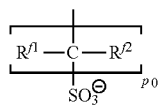
(a6-2-an1-1)

In the formula, each of R$^{f1}$ and R$^{f2}$ independently represents a hydrogen atom, an alkyl group, a fluorine atom or a fluorinated alkyl group, provided that at least one of R$^{f1}$ and R$^2$ represents a fluorine atom or a fluorinated alkyl group, and p0 represents an integer of 1 to 8.

In the formula —[C(R$^{f1}$)(R$^{f2}$)]$_{p0}$— and formula (a6-2-an1-1), each of R$^{f1}$ and R$^{f2}$ independently represents a hydrogen atom, an alkyl group, a fluorine atom or a fluorinated alkyl group, provided that at least one of R$^{f1}$ and R$^{f2}$ represents a fluorine atom or a fluorinated alkyl group.

The alkyl group for R$^{f1}$ and R$^{f2}$ is preferably an alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The fluorinated alkyl group for R$^{f1}$ and R$^{f2}$ is preferably a group in which part or all of the hydrogen atoms within an aforementioned alkyl group for R$^{f1}$ and R$^{f2}$ have each been substituted with a fluorine atom.

Each of R$^{f1}$ and R$^{f2}$ is preferably a fluorine atom or a fluorinated alkyl group.

In the formula —[C(R$^{f1}$)(R$^{f2}$)]$_{p0}$— and formula (a6-2-an1-1), p0 represents an integer of 1 to 8, and is preferably an integer of 1 to 4, and more preferably 1 or 2.

Other examples of preferred forms of $Z^0$ include aliphatic cyclic groups and aromatic hydrocarbon groups which may have a substituent. Among such groups, groups in which two or more hydrogen atoms have been removed from adamantane, norbornane, isobornane, tricyclodecane, tetracyclododecane, camphor or benzene (and which may have a substituent) are preferred.

In formula (a6-2-an2), $Z^3$ represents —C(=O)—O—, —SO$_2$— or a hydrocarbon group which may have a substituent. Examples of the hydrocarbon group which may have a substituent for $Z^3$ include the same groups as the "divalent hydrocarbon group which may have a substituent" mentioned above within the description for the divalent linking group for $Q^1$ in formula (a6-0-1). Among these possibilities, $Z^3$ is preferably —SO$_2$—.

In formula (a6-2-an2), each of $Z^4$ and $Z^5$ independently represents —C(=O)— or —SO$_2$—, and it is preferable that at least one of $Z^4$ and $Z^5$ represents —SO$_2$—, and more preferable that both of $Z^4$ and $Z^5$ represent —SO$_2$—.

Each of R$^{62}$ and R$^{63}$ independently represents a hydrocarbon group which may have a fluorine atom, and examples include the same groups as those described below for the hydrocarbon group which may have a fluorine atom for R$^{61}$.

In formula (a6-2-an3), $Z^1$ represents —C(=O)—, —SO$_2$—, —C(=O)—O— or a single bond. When $Z^1$ represents a single bond, the N in the formula is preferably not bonded directly to —C(=O)— on the side in the formula (namely, the left end in the formula) that is opposite the side where $Z^2$ is bonded.

In formula (a6-2-an3), $Z^2$ represents —C(=O)— or —SO$_2$—, and is preferably —SO$_2$—.

R$^{61}$ represents a hydrocarbon group which may have a fluorine atom. Examples of the hydrocarbon group for R$^{61}$ include alkyl groups, monovalent alicyclic hydrocarbon groups, aryl groups and aralkyl groups.

The alkyl group for R$^{61}$ preferably contains 1 to 8 carbon atoms, more preferably 1 to 6 carbon atoms, and still more preferably 1 to 4 carbon atoms, and may be either linear or branched. Specific examples of preferred alkyl groups include a methyl group, ethyl group, propyl group, butyl group, hexyl group and octyl group.

The monovalent alicyclic hydrocarbon group for R$^{61}$ preferably contains 3 to 20 carbon atoms and more preferably 3 to 12 carbon atoms, and may be either polycyclic or monocyclic. The monocyclic alicyclic hydrocarbon group is preferably a group in which one or more hydrogen atoms have been removed from a monocycloalkane. The monocycloalkane preferably contains 3 to 6 carbon atoms, and specific examples include cyclobutane, cyclopentane and cyclohexane. The polycyclic alicyclic hydrocarbon group is preferably a group in which one or more hydrogen atoms have been removed from a polycycloalkane, wherein the polycycloalkane preferably contains 7 to 12 carbon atoms, and specific examples include adamantane, norbornane, isobornane, tricyclodecane and tetracyclododecane.

The aryl group for $R^{61}$ preferably contains 6 to 18 carbon atoms and more preferably 6 to 10 carbon atoms, and a phenyl group is particularly desirable.

The aralkyl group for $R^{61}$ is preferably a group in which an alkylene group of 1 to 8 carbon atoms is bonded to an aforementioned "aryl group for $R^{61}$". An aralkyl group in which an alkylene group of 1 to 6 carbon atoms is bonded to an aforementioned "aryl group for $R^{61}$" is more preferred, and an aralkyl group in which an alkylene group of 1 to 4 carbon atoms is bonded to an aforementioned "aryl group for $R^{61}$" is particularly desirable.

In the hydrocarbon group for $R^{61}$, it is preferable that part or all of the hydrogen atoms within the hydrocarbon group are each substituted with a fluorine atom, and hydrocarbon groups in which 30 to 100% of the hydrocarbon group hydrogen atoms are substituted with fluorine atoms are more preferred. Among such groups, perfluoroalkyl groups in which all of the hydrogen atoms within an aforementioned alkyl group have been substituted with fluorine atoms are particularly desirable.

In the formula (a6-2-an4), $R^{64}$ represents a hydrocarbon group which may have a fluorine atom or a single bond. Examples of the hydrocarbon group for $R^{64}$ include alkylene groups, divalent alicyclic hydrocarbon groups, groups in which one or more hydrogen atoms have been removed from an aryl group, and groups in which one or more hydrogen atoms have been removed from an aralkyl group.

Specific examples of the hydrocarbon group for $R^{64}$ include groups in which one or more hydrogen atoms have been removed from the hydrocarbon group described above for $R^{61}$ (such as an alkyl group, monovalent alicyclic hydrocarbon group, aryl group or aralkyl group).

In the hydrocarbon group for $R^{64}$, it is preferable that part or all of the hydrogen atoms within the hydrocarbon group are each substituted with a fluorine atom, and groups in which 30 to 100% of the hydrocarbon group hydrogen atoms are substituted with fluorine atoms are more preferred.

Of the above possibilities, in those cases where $A^-$ has a group represented by formula (a6-2-an1) which has a fluorine atom (and particularly a group represented by formula (a6-2-an1-1)), a group represented by formula (a6-2-an2), or a group represented by formula (a6-2-an3) in which $Z^1$ and $Z^2$ both represent —$SO_2$—, performing exposure can generate a comparatively strong acid from the structural unit (a6), such as a fluorinated alkylsulfonate anion, carbo anion or sulfonylimide anion.

On the other hand, in those cases where $A^-$ has a group represented by formula (a6-2-an1) which does not contain a fluorine atom, a group represented by formula (a6-2-an4), or a group represented by formula (a6-2-an3) in which $Z^1$ and $Z^2$ both represent —C(=O)—, performing exposure can generate a comparatively weak acid from the structural unit (a6), such as an alkylsulfonate anion, arylsulfonate anion, carboxylate anion or imide anion.

As described above, because an acid having the desired acid strength can be generated from the structural unit (a6), the function of the acid generated from the structural unit (a6) within the resist composition can be selected as appropriate, and the anion $A^-$ can be selected in accordance with the function required.

For example, in those cases where the structural unit (a6) is to perform a similar function to an acid generator used in a conventional resist composition, an anion $A^-$ that generates a strong acid is preferably selected.

Further, in those cases where the structural unit (a6) is to perform a similar function to a quencher used in a conventional resist composition (namely, a quencher that undergoes salt exchange with a strong acid generated from an acid generator, thereby trapping the strong acid), an anion $A^-$ that generates a weak acid is preferably selected.

Here, whether an acid is deemed a strong acid or a weak acid is determined on the basis of the relationship relative to the activation energy of the type of acid-decomposable group contained within the structural unit (a1) described below which decomposes under the action of acid, and the relationship relative to the acid strength of any acid generators that are also used in the composition. Accordingly, an aforementioned "comparatively weak acid" may not necessarily be able to be used as a quencher.

In formula (a6-0-2), $M^{m+}$ represents an organic cation having a valency of m, wherein m represents an integer of 1 to 3.

There are no particular limitations on the organic cation for $M^{m+}$, and for example, any of the photodegradable bases used in conventional resist composition quenchers, or the organic cations known as the cations for onium salt acid generators or the like within conventional resist compositions can be used.

Examples of these types of organic cations include cations represented by general formula (m1-1) or general formula (m2-1) shown below.

[Chemical Formula 19]

In the formulas, each of $R^{11''}$ to $R^{13''}$, and $R^{15''}$ and $R^{16''}$ independently represents an aryl group, alkyl group or alkenyl group which may have a substituent. In formula (m1-1), two of $R^{11''}$ to $R^{13''}$ may be bonded to each other to form a ring in combination with the sulfur atom in the formula.

In formula (m1-1), examples of the aryl group which may have a substituent, alkyl group which may have a substituent, or alkenyl group which may have a substituent for $R^{11''}$ to $R^{13''}$ include the same groups as the aryl groups, alkyl groups and alkenyl groups described above for $R^4$ and $R^5$ in general formula (a6-0-1).

Examples of the ring that is formed in those cases where two of $R^{11''}$ to $R^{13''}$ are bonded to each other to form a ring in combination with the sulfur atom in the formula include the same rings as those formed when $R^4$ and $R^5$ in formula (a6-0-1) are bonded to each other to form a ring in combination with the sulfur atom in the formula.

In formula (m2-1), examples of the aryl group which may have a substituent, alkyl group which may have a substituent, or alkenyl group which may have a substituent for $R^{15''}$ and $R^{6'''}$ include the same groups as those described above for $R^{11''}$ to $R^{13''}$.

Specific examples of preferred cations represented by formula (m2-1) include diphenyliodonium and bis(4-tert-butylphenyl)iodonium.

Specific examples of preferred cations represented by formula (m1-1) are shown below.
[Chemical Formula 20]
(m1-1-1)
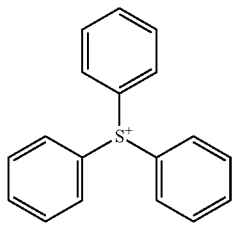
(m1-1-2)
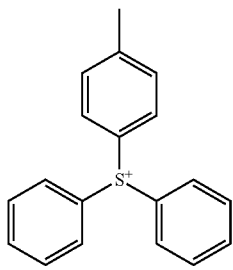
(m1-1-3)
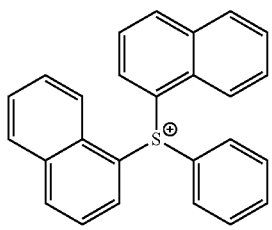
(m1-1-4)
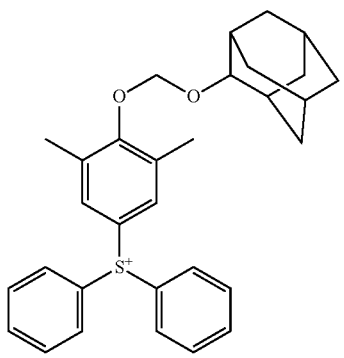
(m1-1-5)
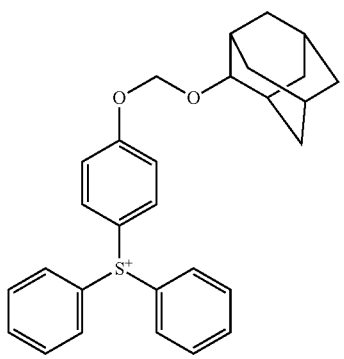
(m1-1-6)
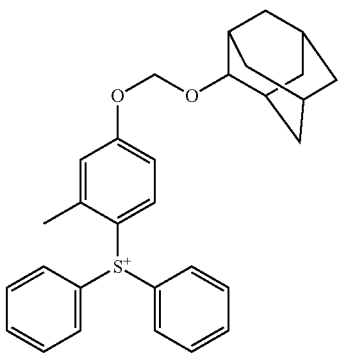
(m1-1-7)
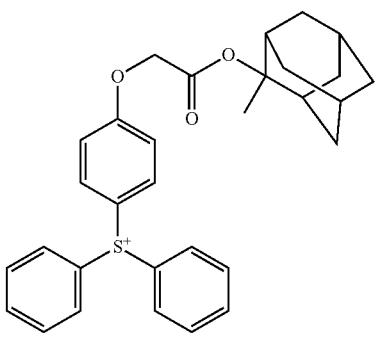
(m1-1-8)
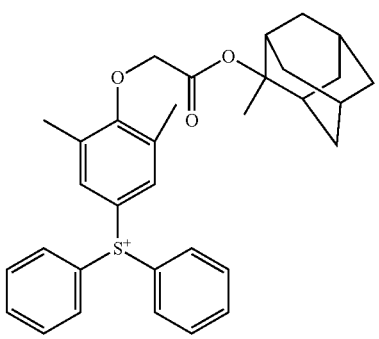
(m1-1-9)
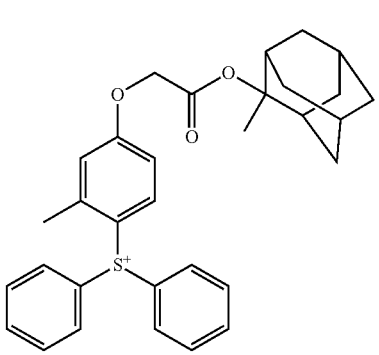

[Chemical Formula 21]
(m1-1-10)
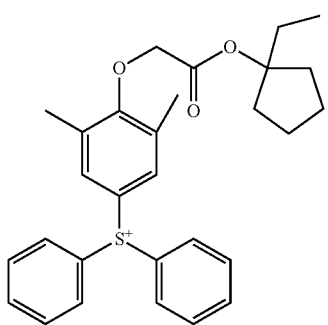
(m1-1-11)
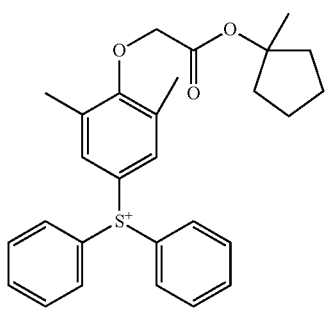
(m1-1-12)
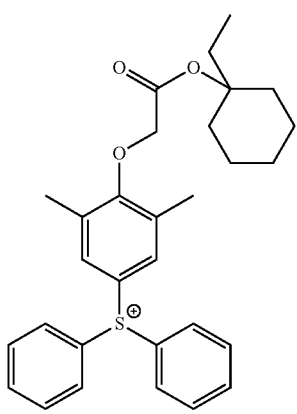
(m1-1-13)
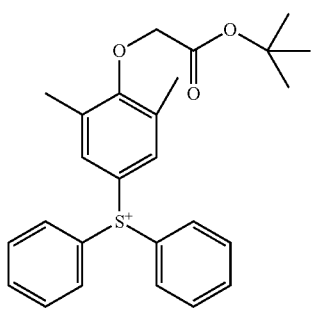
(m1-1-14)
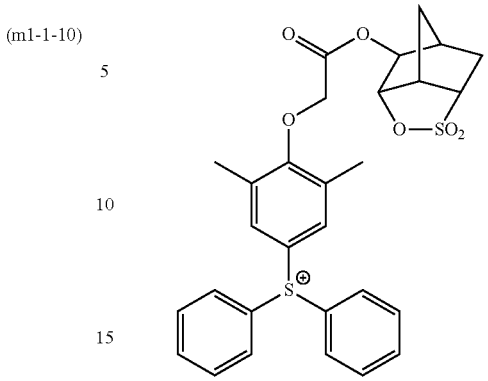
(m1-1-15)
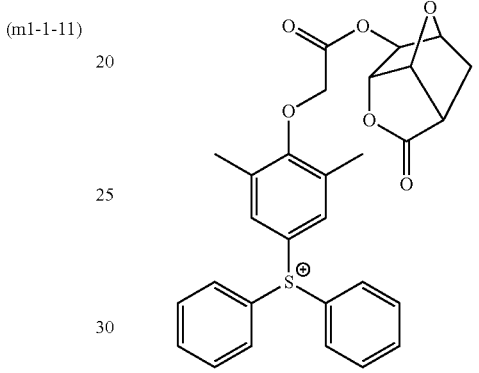
(m1-1-16)
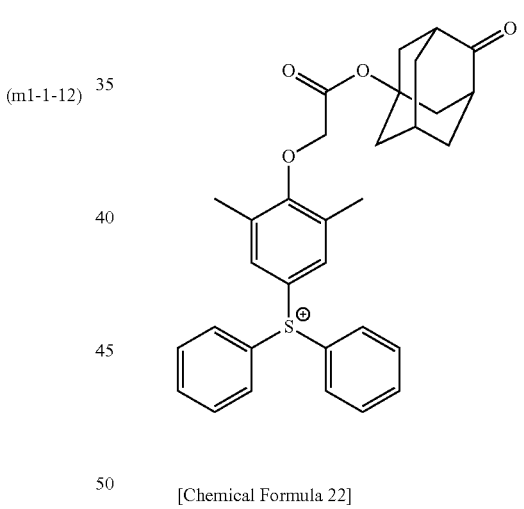
[Chemical Formula 22]
(m1-1-17)
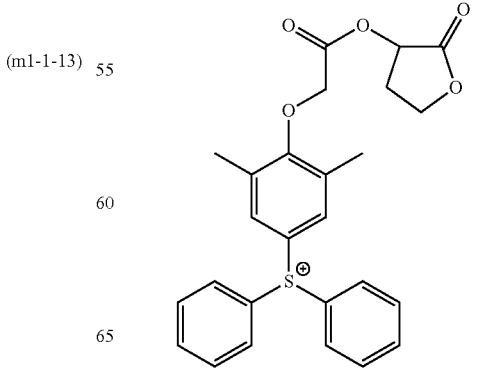

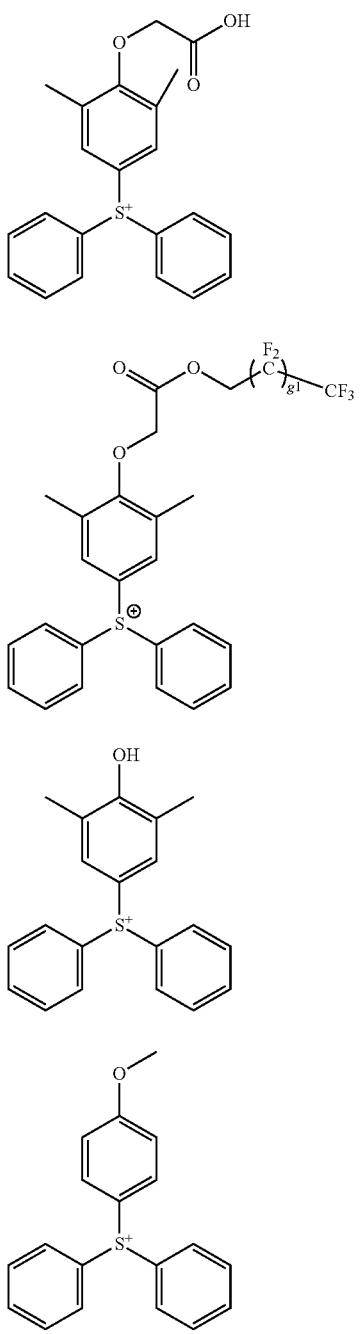
(m1-1-18)
(m1-1-19)
(m1-1-20)
(m1-1-21)
(m1-1-22)
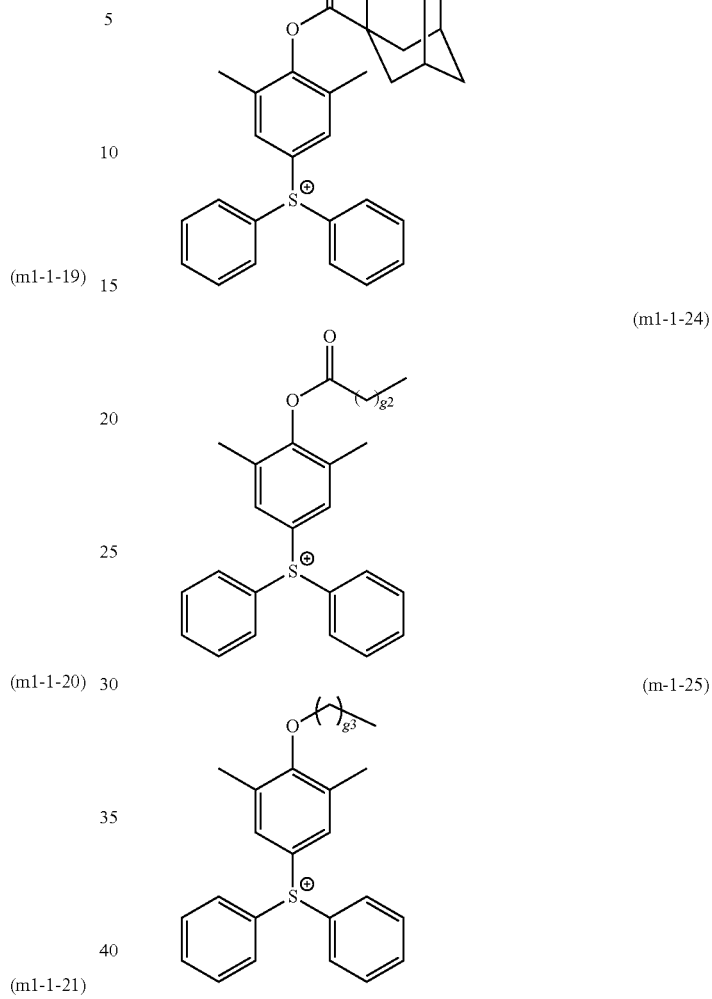
(m1-1-23)
(m1-1-24)
(m-1-25)
In the above formulas, g1 represents a number of repeating units, and is typically an integer of 1 to 5, and each of g2 and g3 represents a number of repeating units, wherein g2 represents an integer of 0 to 20, and g3 represents an integer of 0 to 20.
[Chemical Formula 23]
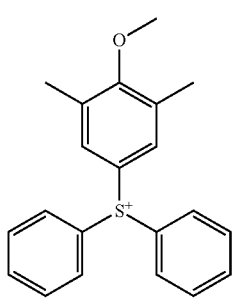
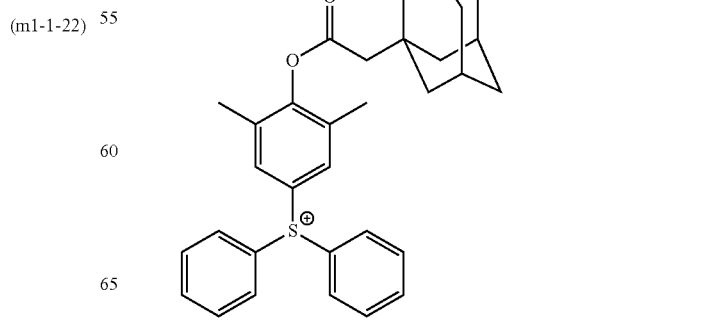
(m1-1-26)

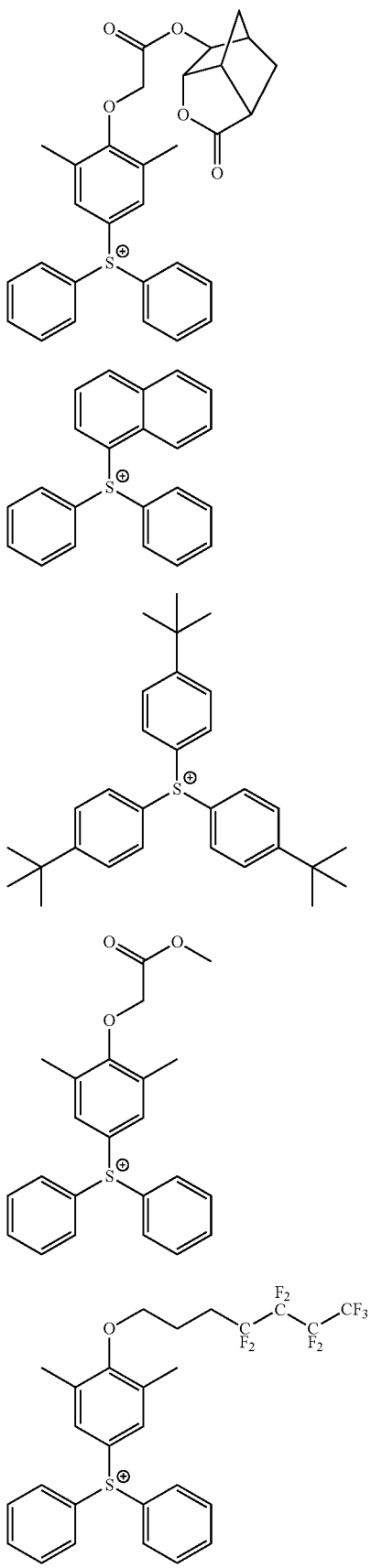

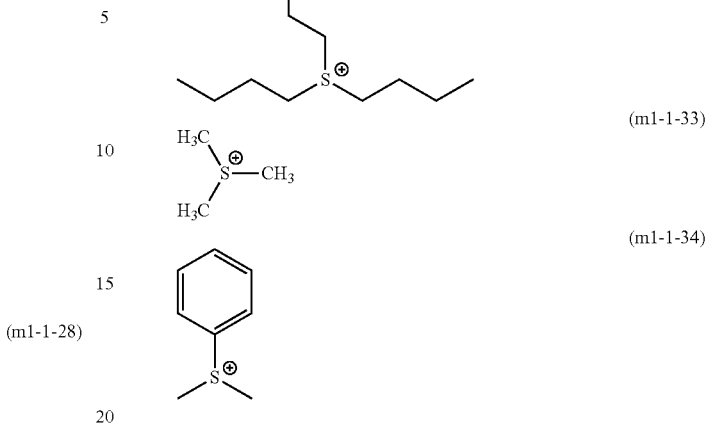

Furthermore, specific examples of preferred cations represented by the above formula (m1-1) in those cases where two of $R^{11\prime\prime}$ to $R^{13\prime\prime}$ are bonded to each other to form a ring in combination with the sulfur atom in the formula include cations represented by formulas (m1-2), (m1-3) and (m1-4) shown below.

[Chemical Formula 24]

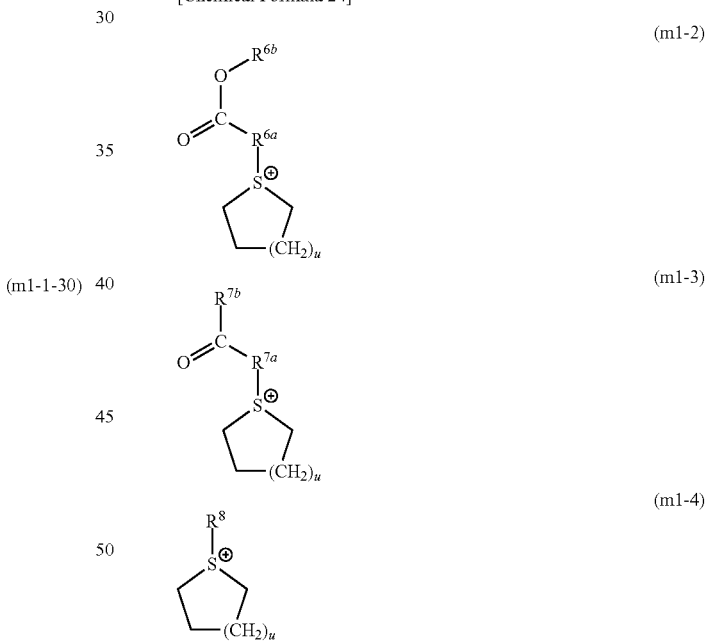

In the formulas, u represents an integer of 1 to 3, $R^{6a}$ represents an alkylene group which may have a substituent, $R^{6b}$ represents a hydrogen atom, an alkyl group which may have a substituent, or a phenyl group or naphthyl group which may have a non-aromatic substituent, $R^{7a}$ represents an alkylene group which may have a substituent, $R^{7b}$ represents an alkyl group which may have a substituent, or a phenyl group or naphthyl group which may have a substituent, and $R^8$ represents an alkyl group which may have a substituent, or a phenyl group or naphthyl group which may have a non-aromatic substituent.

In the formulas, u represents an integer of 1 to 3, and is most preferably 1 or 2.

In the formulas, the alkylene group for each of $R^{6a}$ and $R^{7a}$ is preferably a linear or branched alkylene group. The alkylene group preferably contains 1 to 12 carbon atoms, more preferably 1 to 5 carbon atoms, still more preferably 1 to 3 carbon atoms, and most preferably 1 or 2 carbon atoms.

Examples of the substituent which the alkylene group may have include the same substituents as those mentioned above for the substituent in a substituted alkylene group within the description relating to $R^3$ in general formula (a6-0-1) (namely, a halogen atom, oxo group (=O), cyano group, alkyl group, alkoxyalkyloxy group, alkoxycarbonylalkyloxy group, —C(=O)—O—$R^{7\prime\prime}$, —O—C(=O)—$R^{8\prime\prime}$, —O—$R^{9\prime\prime}$, and aryl group).

Examples of the alkyl group which may have a substituent for $R^{6b}$, $R^{7b}$ and $R^8$ include the same groups as those mentioned above for the substituted alkyl group within the description relating to $R^4$ and $R^5$ in general formula (a6-0-1).

Examples of the non-aromatic substituent which the phenyl group or naphthyl group may have in $R^{6b}$, $R^{7b}$ and $R^8$ include the same substituents as those mentioned above for the non-aromatic substituent which the substituted aryl group may have within the description relating to $R^4$ and $R^5$ in formula (a6-0-1).

Examples of preferred cations represented by one of the above formulas (m1-2), (m1-3) or (m1-4) include the cations shown below.

[Chemical Formula 25]

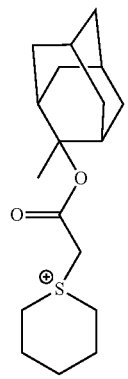

(m1-2-1)

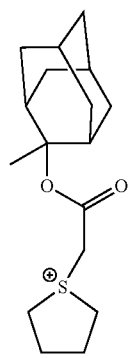

(m1-2-2)

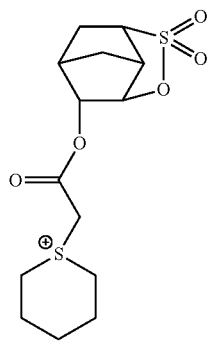

(m1-2-3)

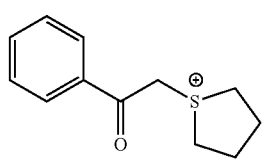

(m1-3-1)

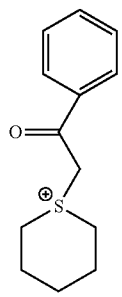

(m1-3-2)

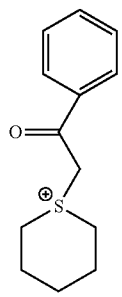

[Chemical Formula 26]

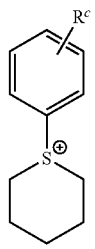

(m1-4-1)

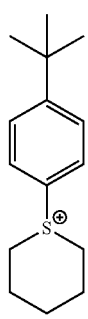

(m1-4-2)

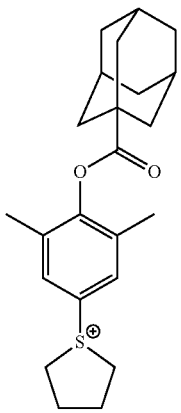

(m1-4-3)

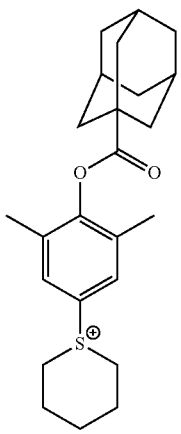

(m1-4-4)

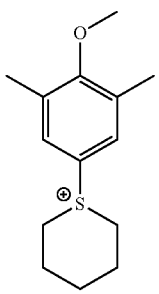

(m1-4-5)

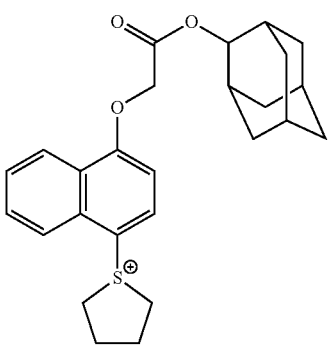

(m1-4-6)

In formula (m1-4-1), $R^C$ represents a substituent. Examples of this substituent include the substituents mentioned above in the description relating to the substituted aryl group (namely, an alkyl group, alkoxy group, alkoxyalkyloxy group, alkoxycarbonylalkyloxy group, halogen atom, hydroxyl group, oxo group (=O), aryl group, —C(=O)—O—R$^{7\prime\prime}$, —O—C(=O)—R$^{8\prime\prime}$ and —O—R$^{9\prime\prime}$).

Further, examples of the cation represented by the above formula (m1-1) include cations represented by formula (m1-5) or formula (m1-6) shown below.

[Chemical Formula 27]

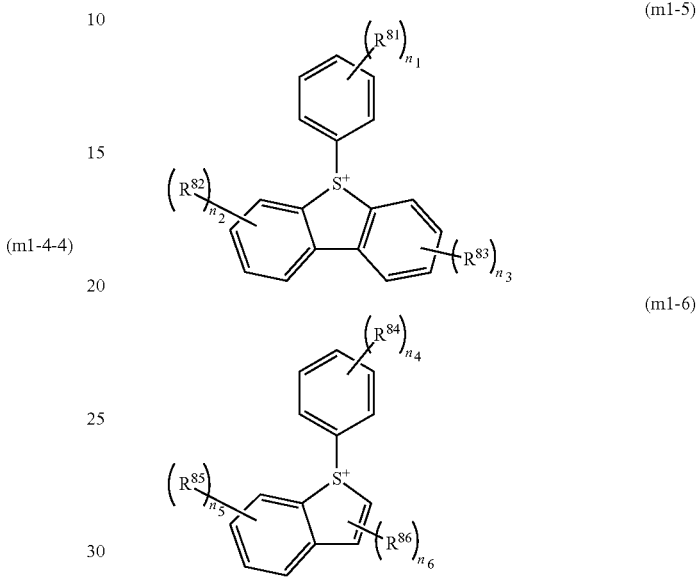

In the formulas, each of R$^{81}$ to R$^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for R$^{81}$ to R$^{86}$ is preferably an alkyl group of 1 to 5 carbon atoms, and among such groups, is more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, and among such groups, is more preferably a linear or branched alkoxy group, and most preferably a methoxy group or an ethoxy group.

The hydroxyalkyl group is preferably a group in which one or more of the hydrogen atoms within an aforementioned alkyl group have each been substituted with a hydroxyl group, and specific examples include a hydroxymethyl group, hydroxyethyl group and hydroxypropyl group.

When the subscripts $n_1$ to $n_6$ appended to R$^{81}$ to R$^{86}$ represent an integer of 2 or more, the corresponding plurality of R$^{81}$ to R$^{86}$ groups may be the same or different.

$n_1$ is preferably 0 to 2, more preferably 0 or 1, and still more preferably 0.

It is preferable that each of $n_2$ and n3 independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Specific examples of preferred cations represented by the above formula (m1-5) or formula (m1-6) include the cations shown below.

[Chemical Formula 28]

(m1-5-1) 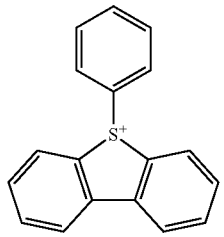

(m1-5-2) 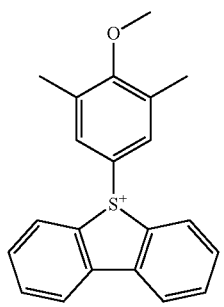

(m1-5-3) 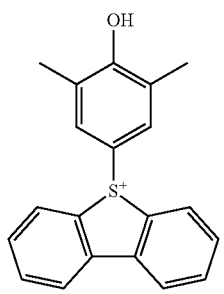

(m1-5-4) 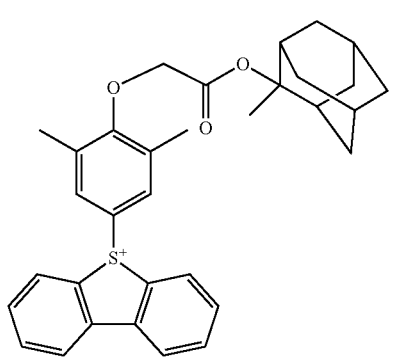

(m1-5-5) 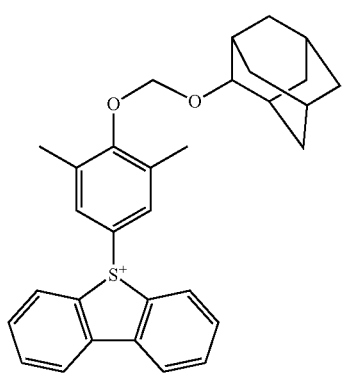

(m1-5-6) 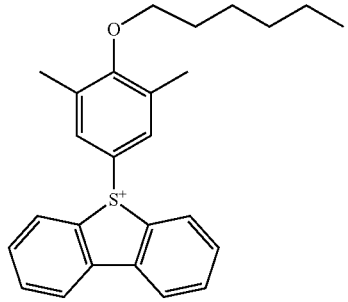

(m1-6-1) 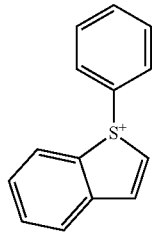

(m1-6-2) 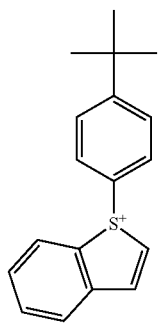

Although there are no particular limitations on the structural unit having a group represented by the aforementioned general formula (a6-0-2) (hereafter referred to as "structural unit (a6-2)"), provided that the structural unit includes a group represented by general formula (a6-0-2) within the structure, a structural unit which is derived from a compound having an ethylenic double bond and also contains a group represented by general formula (a6-0-2) is preferable, and a structural unit represented by general formula (a6-21) shown below is particularly desirable.

[Chemical Formula 29]

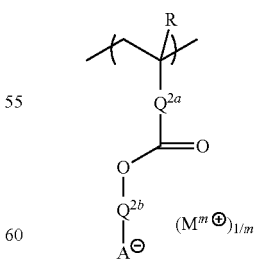

(a6-21)

In the formula, R represents a hydrogen atom, an alkyl group of 1 to 5 carbon atoms or a halogenated alkyl group of 1 to 5 carbon atoms, $Q^{2a}$ represents a single bond or a divalent linking group, $Q^{2b}$ represents a single bond or a divalent linking group, $A^-$ represents an organic group containing an anion, and $M^{m+}$ represents an organic cation having a valency of m, wherein m represents an integer of 1 to 3.

In formula (a6-21), R is the same as defined above for R in formula (a6-11).

$A^-$ and $(M^{m+})_{1/m}$ are the same as defined above for $A^-$ and $(M^{m+})_{1/m}$ in formula (a6-0-2).

Examples of the divalent linking group for $Q^{2a}$ include the same groups as those mentioned above for the divalent linking group for $Q^1$ in formula (a6-0-1).

Among such groups, $Q^{2a}$ is preferably a single bond, or a group represented by —C(=O)-$Q^{22}$-N(R″)— or -$Q^{23}$-CF($R^{q1}$)—.

In formula —C(=O)-$Q^{22}$-N(R″)—, $Q^{22}$ represents a divalent linking group, and R″ represents a hydrogen atom or an alkyl group of 1 to 5 carbon atoms.

In formula -$Q^{23}$-CF($R^{q1}$)—, $Q^{23}$ represents a group containing —O—, —CH$_2$—O— or —C(=O)—O—, and $R^{q1}$ represents a fluorine atom or a fluorinated alkyl group.

In formula —C(=O)-$Q^{22}$-N(R″)—, examples of the divalent linking group for $Q^{22}$ include the same groups as those mentioned above for the divalent linking group for $Q^1$ in formula (a6-0-1), and among these groups, a linear or branched alkylene group, a cyclic aliphatic hydrocarbon group, or a divalent aromatic hydrocarbon group is preferred, a linear alkylene group is more preferred, and a methylene group or an ethylene is the most desirable.

Examples of the alkyl group of 1 to 5 carbon atoms for R″ include the same groups as those mentioned above for the alkyl group of 1 to 5 carbon atoms for R. Among the various possibilities, R″ is most preferably a hydrogen atom or a methyl group.

In formula -$Q^{23}$-CF($R^{q1}$)—, specific examples of $Q^{23}$ include groups consisting solely of —O—, —CH$_2$—O— or —C(=O)—O—, and groups composed of a combination of —O—, —CH$_2$—O— or —C(=O)—O—, and a divalent hydrocarbon group which may have a substituent.

Examples of this divalent hydrocarbon group which may have a substituent include the same groups as those mentioned above for the divalent hydrocarbon group which may have a substituent mentioned within the description of the divalent linking group for $Q^1$ in formula (a6-0-1). Of these groups, the "divalent hydrocarbon group" in $Q^{23}$ is preferably an aliphatic hydrocarbon group, and more preferably a linear or branched alkylene group.

$Q^{23}$ is preferably a group composed of a combination of —C(=O)—O— and a divalent hydrocarbon group which may have a substituent, is more preferably a group composed of a combination of —C(=O)—O— and an aliphatic hydrocarbon group, and is still more preferably a group composed of a combination of —C(=O)—O— and a linear or branched alkylene group.

In formula -$Q^{23}$-CF($R^{q1}$)—, in the fluorinated alkyl group for $R^1$, the alkyl group in a state prior to the fluorine atom substitution may be linear, branched or cyclic.

In the case of a linear or branched alkyl group, the alkyl group preferably contains 1 to 5 carbon atoms, more preferably 1 to 3 carbon atoms, and still more preferably 1 or 2 carbon atoms.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracylododecane.

In the fluorinated alkyl group, the ratio of the number of fluorine atoms relative to the combined total of all the fluorine atoms and hydrogen atoms within the fluorinated alkyl group (namely, the fluorination ratio (%)) is preferably within a range from 30 to 100%, and more preferably from 50 to 100%. A higher fluorination ratio enhances the hydrophobicity of the resist film.

Among the above possibilities, $R^{q1}$ is most preferably a fluorine atom.

In formula (a6-21), examples of the divalent linking group for $Q^{2b}$ include the same groups as those mentioned above for the divalent linking group for $Q^1$ in formula (a6-0-1). Among such groups, $Q^{2b}$ is preferably a linear or branched alkylene group, a cyclic aliphatic hydrocarbon group, an aromatic hydrocarbon group, or a divalent linking group containing a hetero atom, is more preferably a linear or branched alkylene group, a combination of a linear or branched alkylene group and a divalent linking group containing a hetero atom, a combination of a cyclic aliphatic hydrocarbon group and a divalent linking group containing a hetero atom, or a combination of an aromatic hydrocarbon group and a divalent linking group containing a hetero atom, is still more preferably a linear or branched alkylene group, a combination of a linear or branched alkylene group and an ester linkage [—C(=O)—O—], or a combination of a divalent alicyclic hydrocarbon group and an ester linkage [—C(=O)—O—], and is most preferably a linear or branched alkylene group, or a combination of a linear or branched alkylene group and an ester linkage [—C(=O)—O—].

The structural unit (a6-2) is preferably at least one structural unit selected from the group consisting of structural units represented by formulas (a6-2-11) to (a6-2-13), formulas (a6-2-21) to (a6-2-25), formulas (a6-2-31) to (a6-2-32), and formulas (a6-2-41) to (a6-2-44) shown below.

Of these structural units, the structural units represented by formulas (a6-2-11) to (a6-2-13) are preferably structural units represented by formulas (a6-2-11-1), (a6-2-12-1) and (a6-2-13-1) respectively shown below.

[Chemical Formula 30]

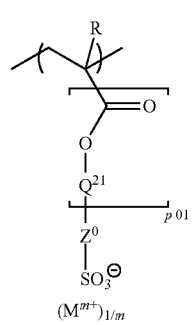

(a6-2-11)

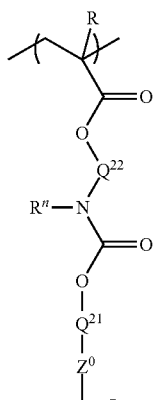

(a6-2-12)

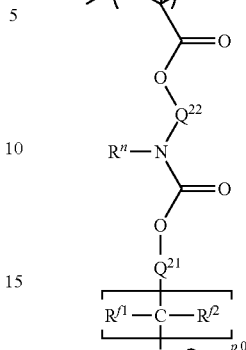

(a6-2-12-1)

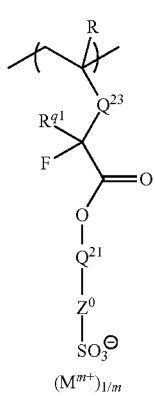

(a6-2-13)

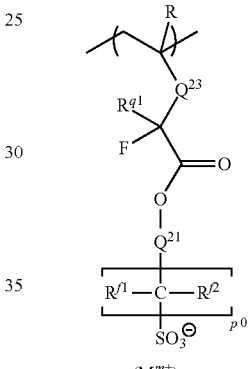

(a6-2-13-1)

In the formulas, R, $Z^0$ and $(M^{m+})_{1/m}$ are the same as defined above, each $Q^{21}$ independently represents a single bond or a divalent linking group, $Q^{22}$ represents a divalent linking group, $Q^{23}$ represents a group containing —O—, —CH$_2$—O— or —C(=O)—O—, $R^{q1}$ represents a fluorine atom or a fluorinated alkyl group, $R^n$ represents a hydrogen atom or an alkyl group of 1 to 5 carbon atoms, and p01 represents 0 or 1.

In the above formulas, R, $R^{f1}$, $R^{f2}$, $R^{q1}$, $R^n$, $Q^{21}$ to $Q^{23}$, p0 and $(M^{m+})_{1/m}$ are the same as defined above.

[Chemical Formula 32]

[Chemical Formula 31]

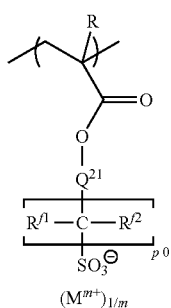

(a6-2-11-1)

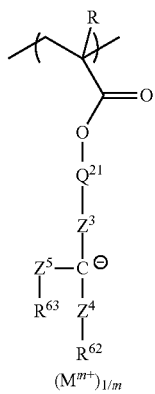

(a6-2-21)

(a6-2-22)

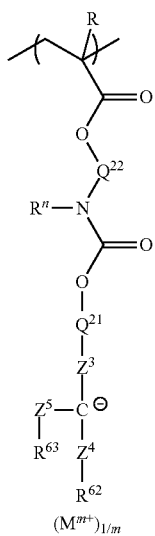

(a6-2-23)

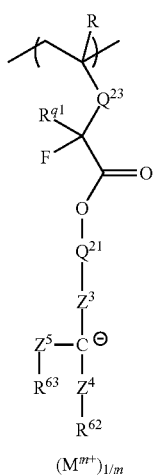

(a6-2-24)

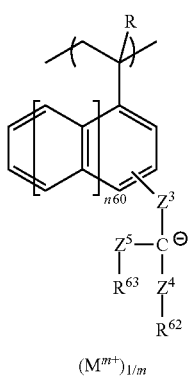

(a6-2-25)

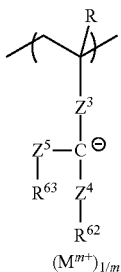

In the above formulas, R, $Q^{21}$ to $Q^{23}$, $Z^3$ to $Z^5$, $R^{62}$ to $R^{63}$, $R^n$, $R^{q1}$ and $(M^{m+})_{1/m}$ are the same as defined above, and n60 represents an integer of 0 to 3.

[Chemical Formula 33]

(a6-2-31)

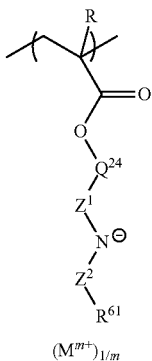

(a6-2-32)

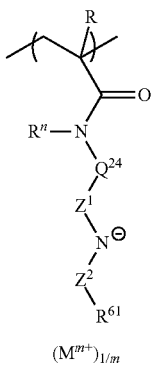

In the above formulas, R, $Z^1$ to $Z^2$, $R^{61}$, $R^n$ and $(M^{m+})_{1/m}$ are the same as defined above, and each of $Q^{24}$ and $Q^{25}$ independently represents a single bond or a divalent linking group.

[Chemical Formula 34]

(a6-2-41)

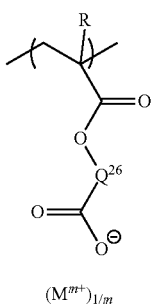

(a6-2-42)

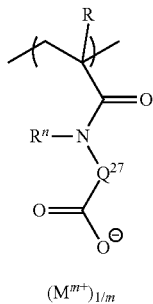

$(M^{m+})_{1/m}$ (a6-2-43)

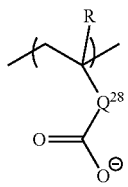

$(M^{m+})_{1/m}$ (a6-2-44)

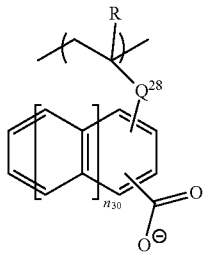

$(M^{m+})_{1/m}$

In the above formulas, R, R" and $(M^{m+})_{1/m}$ are the same as defined above, each of $Q^{26}$ to $Q^{28}$ independently represents a single bond or a divalent linking group, and n30 represents an integer of 0 to 3.

In formulas (a6-2-11) to (a6-2-13), R and $(M^{m+})_{1/m}$ are the same as defined for R and $(M^{m+})_{1/m}$ in formula (a6-21).

$Z^0$ is the same as $Z^0$ in formula (a6-2-an1).

$Q^{21}$ represents a single bond or a divalent linking group. Examples of the divalent linking group for $Q^{21}$ include the same groups as those mentioned above for the divalent linking group for $Q^1$ in formula (a6-0-1). Among such groups, $Q^{21}$ is preferably a linear or branched alkylene group, a cyclic aliphatic hydrocarbon group, an aromatic hydrocarbon group, or a divalent linking group containing a hetero atom, is more preferably a linear or branched alkylene group, a combination of a linear or branched alkylene group and a divalent linking group containing a hetero atom, a combination of a cyclic aliphatic hydrocarbon group and a divalent linking group containing a hetero atom, or a combination of an aromatic hydrocarbon group and a divalent linking group containing a hetero atom, is still more preferably a linear or branched alkylene group, a combination of a linear or branched alkylene group and an ester linkage [—C(=O)—O—], or a combination of a divalent alicyclic hydrocarbon group and an ester linkage [—C(=O)—O—], and is most preferably a linear or branched alkylene group, or a combination of a linear or branched alkylene group and an ester linkage [—C(=O)—O—].

p01 represents 0 or 1, and is preferably 1.

In formula (a6-2-12), $Q^{22}$ represents a divalent linking group, and examples include the same groups as those mentioned above for the divalent linking group for $Q^1$ in formula (a6-0-1). Among such groups, $Q^{22}$ is preferably a linear or branched alkylene group, a cyclic aliphatic hydrocarbon group, or a divalent aromatic hydrocarbon group, is more preferably a linear alkylene group, and is most preferably a methylene group or an ethylene group.

In formula (a6-2-12), R" represents a hydrogen atom or an alkyl group of 1 to 5 carbon atoms. Examples of the alkyl group of 1 to 5 carbon atoms include the same groups as those described above for the alkyl group of 1 to 5 carbon atoms for R. Of the various possibilities, R" is preferably a hydrogen atom or a methyl group.

In formula (a6-2-13), $Q^{23}$ is a group containing —O—, —$CH_2$—O— or —C(=O)—O—.

Specific examples of $Q^{23}$ include groups consisting solely of —O—, —$CH_2$—O— or —C(=O)—O—, and groups composed of a combination of —O—, —$CH_2$—O— or —C(=O)—O—, and a divalent hydrocarbon group which may have a substituent.

Examples of this divalent hydrocarbon group which may have a substituent include the same groups as those mentioned above for the divalent hydrocarbon group which may have a substituent mentioned within the description of the divalent linking group for $Q^1$ in formula (a6-0-1). Of these groups, the "divalent hydrocarbon group" is preferably an aliphatic hydrocarbon group, and more preferably a linear or branched alkylene group.

$Q^{23}$ is preferably a group composed of a combination of —C(=O)—O— and a divalent hydrocarbon group which may have a substituent, is more preferably a group composed of a combination of —C(=O)—O— and an aliphatic hydrocarbon group, and is still more preferably a group composed of a combination of —C(=O)—O— and a linear or branched alkylene group.

Specific examples of preferred groups for $Q^{23}$ include the groups represented by general formula ($Q^{23}$-1) shown below.

[Chemical Formula 35]

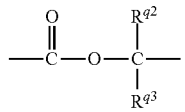

($Q^{23}$-1)

In formula ($Q^{23}$-1), each of $R^{q2}$ and $R^{q3}$ independently represents a hydrogen atom, an alkyl group or a fluorinated alkyl group, or $R^{q2}$ and $R^{q3}$ may be bonded to each other to form a ring.

In formula ($Q^{23}$-1), the alkyl group for $R^{q2}$ and $R^{q3}$ may be linear, branched or cyclic, but is preferably a linear or branched group.

In the case of a linear or branched alkyl group, a group of 1 to 5 carbon atoms is preferred, an ethyl group or methyl group is more preferred, and an ethyl group is particularly desirable.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane. Among these, a group in which one or more hydrogen atoms have been removed adamantane is preferred.

The fluorinated alkyl group for $R^{q2}$ and $R^{q3}$ is a group in which part or all of the hydrogen atoms within an alkyl group have each been substituted with a fluorine atom.

In the fluorinated alkyl group, the alkyl group in a state prior to the fluorine atom substitution may be linear, branched or cyclic, and examples include the same groups as those mentioned above for the alkyl group for $R^{q2}$ and $R^{q3}$.

$R^{q2}$ and $R^{q3}$ may be bonded to each other to form a ring, and examples of the ring formed by $R^{q2}$, $R^{q3}$ and the carbon atom bonded thereto include groups in which two hydrogen atoms have been removed from a monocycloalkane or polycycloalkane mentioned above for the cyclic alkyl group, and of such rings, a 4- to 10-membered ring is preferable, and a 5- to 7-membered ring is particularly desirable.

Of the various possibilities described above, each of $R^{q2}$ and $R^{q3}$ is preferably a hydrogen atom or an alkyl group.

In formula (a6-2-13), $R^{q1}$ represents a fluorine atom or a fluorinated alkyl group.

In the fluorinated alkyl group for $R^{q1}$, the alkyl group in a state prior to the fluorine atom substitution may be linear, branched or cyclic.

In the case of a linear or branched alkyl group, the alkyl group preferably contains 1 to 5 carbon atoms, more preferably 1 to 3 carbon atoms, and still more preferably 1 or 2 carbon atoms.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane.

In the fluorinated alkyl group, the ratio of the number of fluorine atoms relative to the combined total of all the fluorine atoms and hydrogen atoms within the fluorinated alkyl group (namely, the fluorination ratio (%)) is preferably within a range from 30 to 100%, and more preferably from 50 to 100%. A higher fluorination ratio enhances the hydrophobicity of the resist film.

Among the above possibilities, $R^{q1}$ is most preferably a fluorine atom.

In formulas (a6-2-11-1), (a6-2-12-1) and (a6-2-13-1), R, $Q^{21}$ to $Q^{23}$, R″, $R^{q1}$ and $(M^{m+})_{1/m}$ are the same as defined above for R, $Q^{21}$ to $Q^{23}$, R″, $R^{q1}$ and $(M^{m+})_{1/m}$ in formulas (a6-2-11) to (a6-2-13).

$R^{f1}$, $R^{f2}$ and p0 are the same as defined above for $R^{f1}$, $Rf^2$ and p0 in formula (a6-2-an1-1).

In formulas (a6-2-21) to (a6-2-25), R, $Q^{21}$ to $Q^{23}$, R″, $R^{q1}$ and $(M^{m+})_{1/m}$ are the same as defined above for R, $Q^{21}$ to $Q^{23}$, R″, $R^{q1}$ and $(M^{m+})_{1/m}$ in formulas (a6-2-11) to (a6-2-13).

$Z^3$ to $Z^5$ and $R^{62}$ to $R^{63}$ are the same as defined above for $Z^3$ to $Z^5$ and $R^{62}$ to $R^{63}$ in formula (a6-2-an2).

In formula (a6-2-24), n60 represents an integer of 0 to 3, and is preferably 0 or 1.

In formulas (a6-2-31) to (a6-2-32), R, R″ and $(M^{m+})_{1/m}$ are the same as defined above for R, R″ and $(M^{m+})_{1/m}$ in formulas (a6-2-11) to (a6-2-13).

$Z^1$, $Z^2$ and $R^{61}$ are the same as defined above for $Z^1$, $Z^2$ and $R^{61}$ in formula (a6-2-an3).

Each of $Q^{24}$ and $Q^{25}$ independently represents a single bond or a divalent linking group.

Examples of the divalent linking group for $Q^{24}$ and $Q^{25}$ include the same groups as those described above for the divalent linking group for $Q^1$ in formula (a6-0-1). As mentioned above, when $Z^1$ is a single bond, the terminal of $Q^{24}$ or $Q^{25}$ that is bonded to $Z^1$ is preferably not —C(=O)—. The divalent linking group for $Q^{24}$ and $Q^{25}$ is preferably a linear or branched alkylene group, a cyclic aliphatic hydrocarbon group, or a divalent linking group containing a hetero atom. Among these groups, a linear or branched alkylene group or a cyclic aliphatic hydrocarbon group is preferred, and a linear alkylene group or a cyclic aliphatic hydrocarbon group is particularly desirable.

In formulas (a6-2-41) to (a6-2-44), R, R″ and $(M^{m+})_{1/m}$ are the same as defined above for R, R″ and $(M^{m+})_{1/m}$ in formulas (a6-2-11) to (a6-2-13).

Each of $Q^{26}$ to $Q^{28}$ independently represents a single bond or a divalent linking group. $Q^{26}$ to $Q^{28}$ are the same as defined above for $Q^{24}$ and $Q^{25}$.

In formula (a6-2-44), n30 represents an integer of 0 to 3, and is preferably 0 or 1.

Specific examples of the structural unit (a6-2) are shown below. In each of the following formulas, $R^\alpha$ represents a hydrogen atom, a methyl group, or a trifluoromethyl group, and $(M^{m+})_{1/m}$ is the same as defined above.

[Chemical Formula 36]

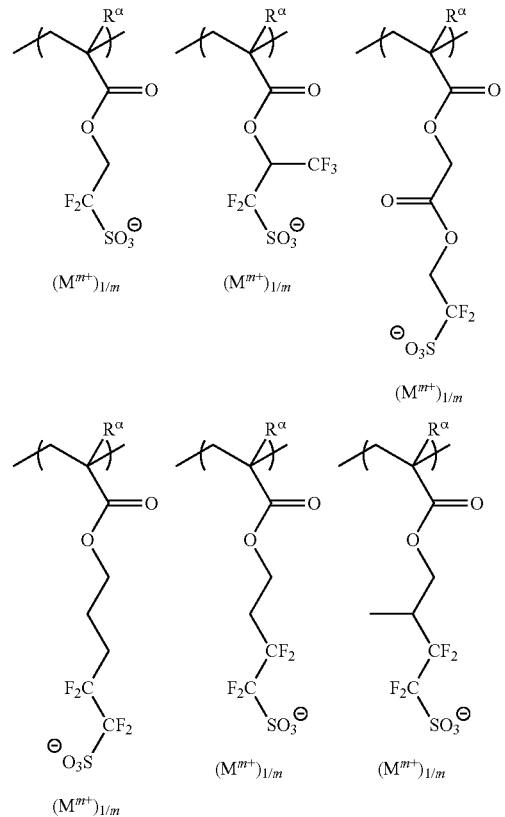

-continued
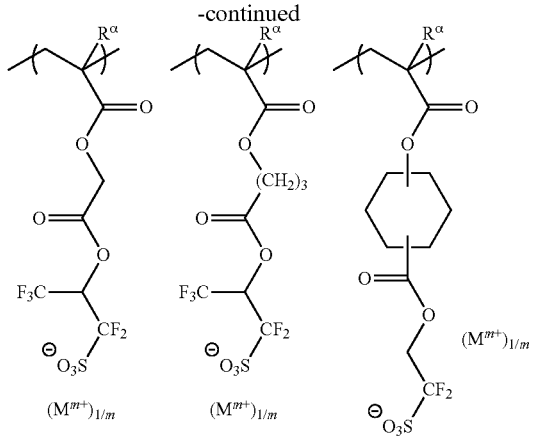
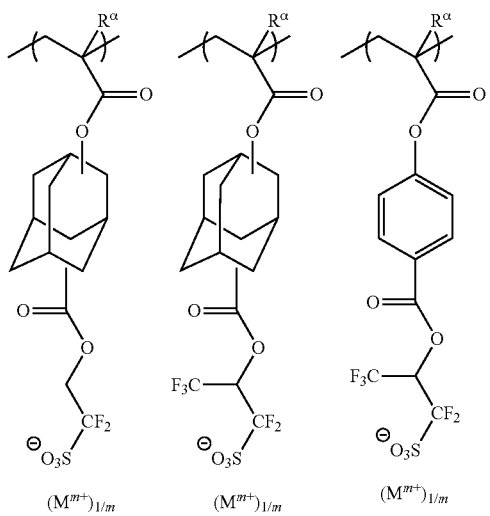
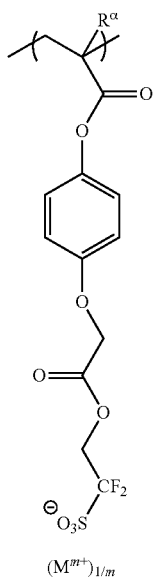
[Chemical Formula 37]
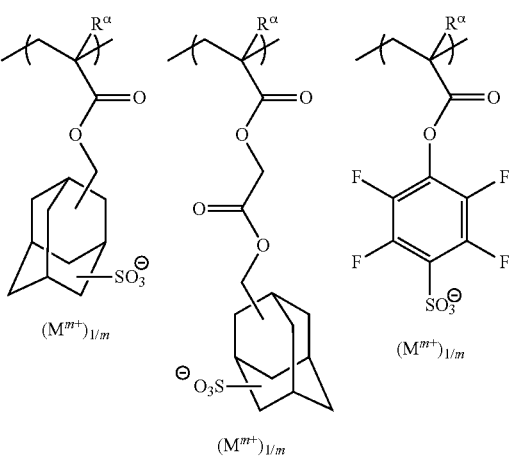
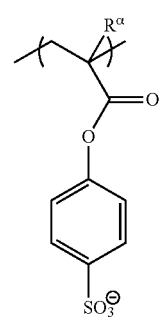
[Chemical Formula 38]
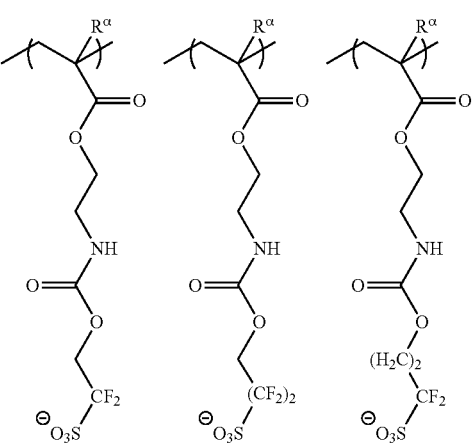

-continued
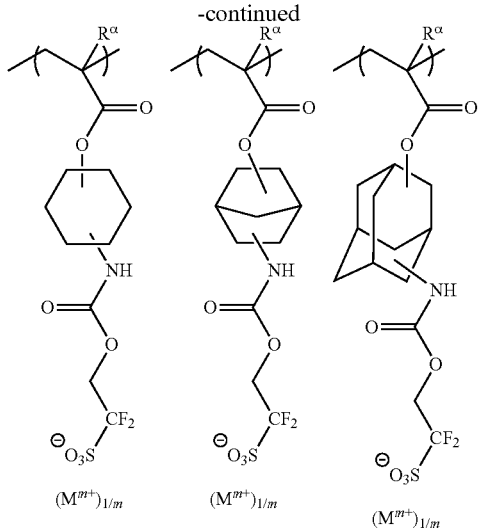
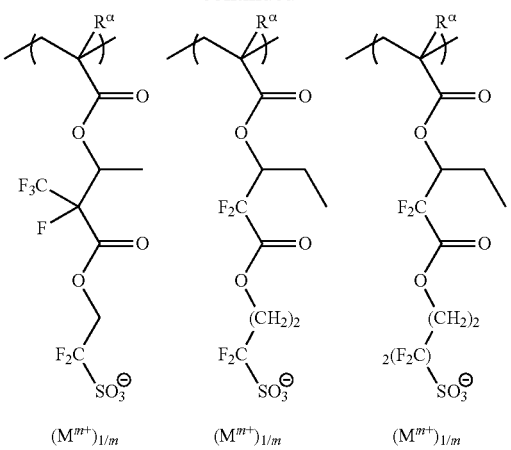
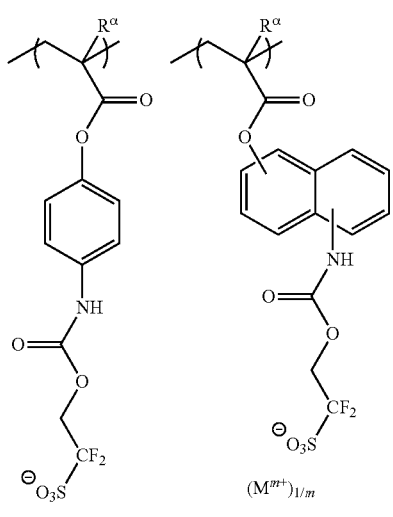
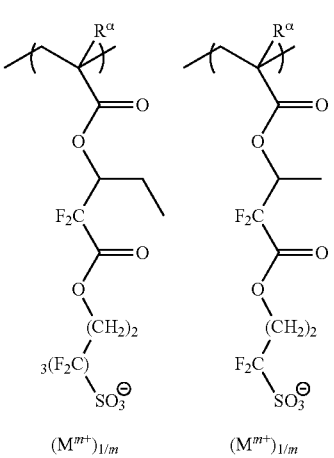
[Chemical Formula 39]
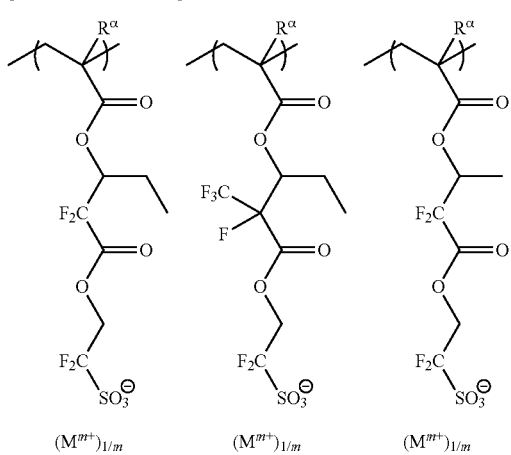
[Chemical Formula 40]
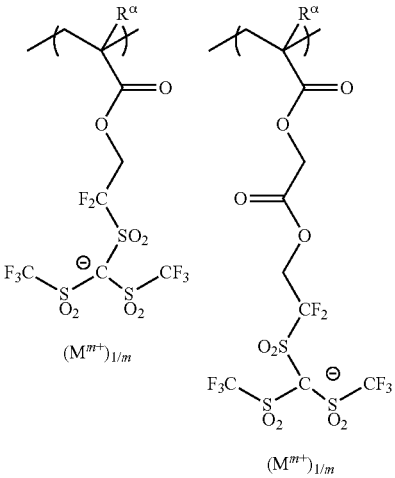

81
-continued
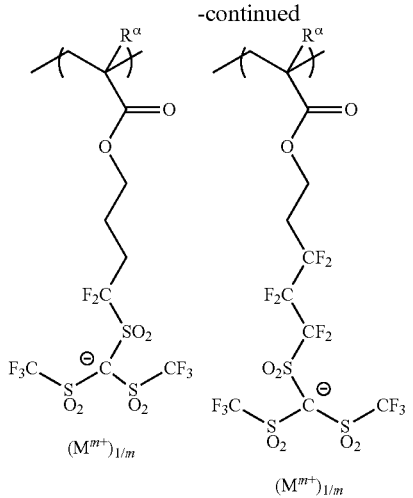
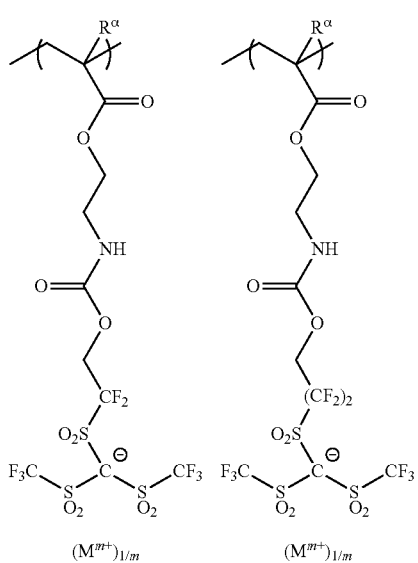
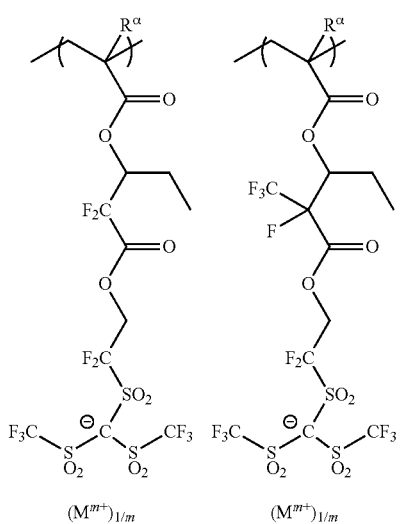
82
-continued
[Chemical Formula 41]
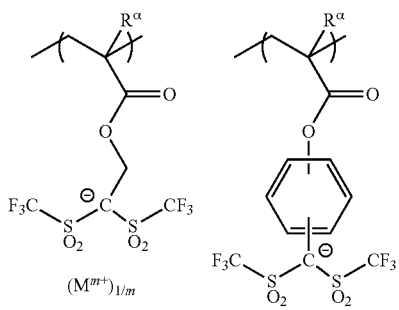
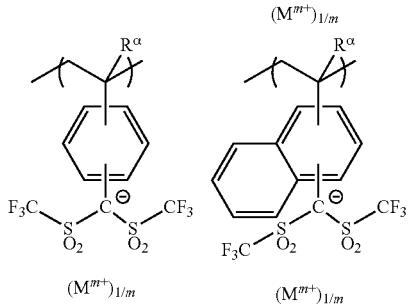
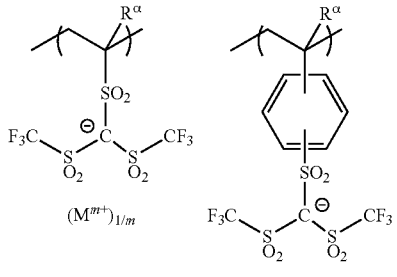
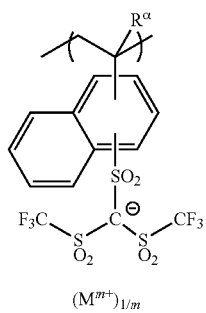
[Chemical Formula 42]
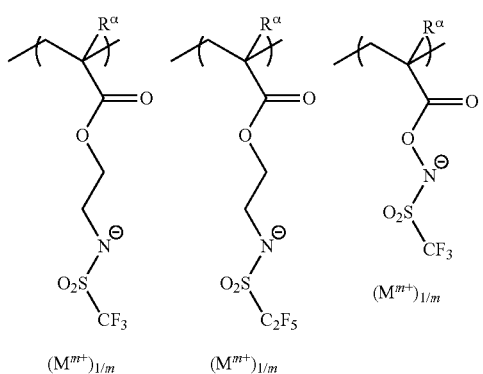

-continued

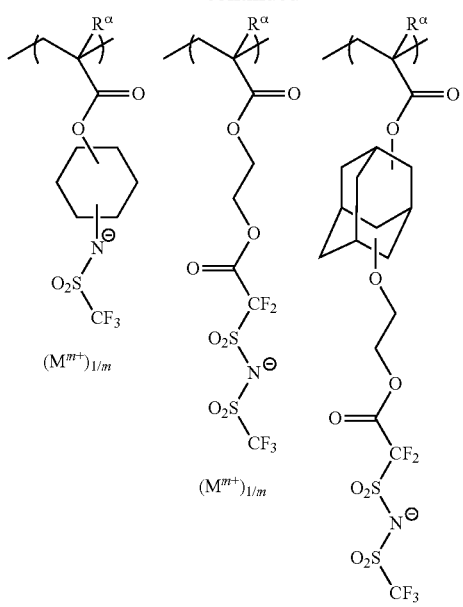

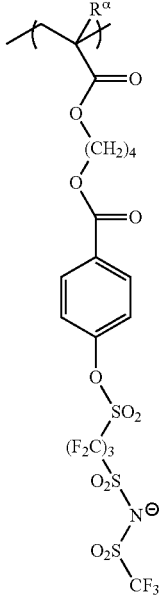

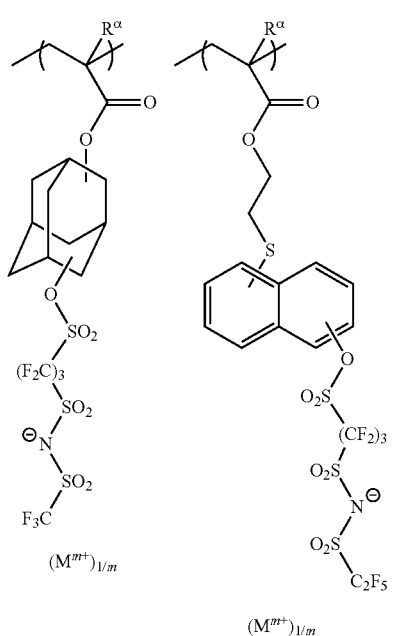

-continued

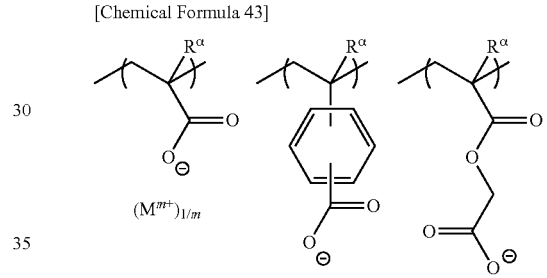

[Chemical Formula 43]

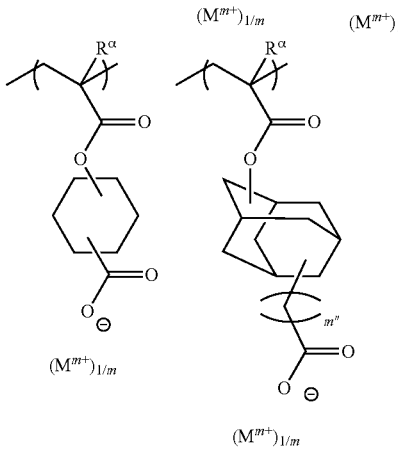

The component (A1-1) may have a single type of the structural unit (a6), or a combination of two or more types.

The amount of the structural unit (a6) within the component (A1-1), based on the combined total of all the structural units that constitute the component (A1-1), is preferably within a range from 1 to 50 mol %, more preferably from 1 to 45 mol %, still more preferably from 3 to 40 mol %, and most preferably from 5 to 35 mol %.

When the amount of the structural unit (a6) is at least 1 mol %, the effects of the invention in improving the lithography properties such as the sensitivity and the resolution, and improving the resist pattern shape can be achieved satisfactorily. On the other hand, when the amount of the structural unit (a6) is not more than the upper limit of the above range, a good balance can be achieved with the other structural units. Further, satisfactory solubility in the resist solvent (a component (S) described below) can be ensured.

—Structural Unit (a1)

In the present invention, the structural unit (a1) is a structural unit containing an acid-decomposable group that exhibits increased polarity under the action of acid.

The "acid-decomposable group" in the structural unit (a1) is a group exhibiting acid decomposability in which at least part of the bonding within the structure of the acid-decomposable group can be cleaved by the action of acid.

Examples of acid-decomposable groups that exhibit increased polarity under the action of acid include groups which are decomposed by the action of acid to form a polar group.

Examples of the polar group include a carboxyl group, a hydroxyl group, an amino group and a sulfo group ($-SO_3H$). Among these groups, polar groups that contain an —OH within the structure (hereinafter also referred to as "OH-containing polar groups") are preferred, a carboxyl group or a hydroxyl group is more preferred, and a carboxyl group is particularly desirable.

More specific examples of the acid-decomposable groups include groups in which the aforementioned polar group is protected with an acid-dissociable group (such as groups in which the hydrogen atom of an OH-containing polar group is protected with an acid-dissociable group).

An "acid-dissociable group" is a group exhibiting acid dissociability in which at least the bond between the acid-dissociable group and the atom adjacent to this acid-dissociable group can be cleaved by the action of acid. It is necessary that the acid-dissociable group that constitutes the acid-decomposable group is a group which exhibits a lower polarity than the polar group generated by the dissociation of the acid-dissociable group. Thus, when the acid-dissociable group is dissociated by the action of acid, a polar group exhibiting a higher polarity than that of the acid-dissociable group is generated, thereby increasing the polarity. As a result, the polarity of the entire component (A1-1) is increased. Increasing the polarity causes a relative change in the solubility within a developing solution, and the solubility increases when the developing solution is an alkali developing solution, whereas the solubility decreases when the developing solution is a developing solution containing an organic solvent (an organic developing solution).

There are no particular limitations on the acid-dissociable group, and any of the groups that have been proposed as acid-dissociable groups for the base resins of chemically amplified resists can be used. Generally, groups that form either a cyclic or chain-like tertiary alkyl ester with the carboxyl group of (meth)acrylic acid or the like, and acetal-type acid-dissociable groups such as alkoxyalkyl groups are widely known.

Here, a tertiary alkyl ester describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched, acid-dissociable groups and acid-dissociable groups containing an aliphatic cyclic group.

Here, the term "aliphatic branched" refers to a branched structure having no aromaticity. The "aliphatic branched, acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, acid-dissociable group include groups represented by the formula —$C(R^{71})(R^{72})(R^{73})$. In this formula, each of $R^{71}$ to $R^{73}$ independently represents a linear alkyl group of 1 to 5 carbon atoms. The group represented by the formula —$C(R^{71})(R^{72})(R^{73})$ preferably has 4 to 8 carbon atoms, and specific examples include a tert-butyl group, 2-methyl-2-butyl group, 2-methyl-2-pentyl group and 3-methyl-3-pentyl group.

Among these, a tert-butyl group is particularly desirable.

The term "aliphatic cyclic group" refers to a monocyclic group or polycyclic group that has no aromaticity.

The aliphatic cyclic group within the "acid-dissociable group containing an aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the "aliphatic cyclic group" exclusive of substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either monocyclic or polycyclic.

Examples of the aliphatic cyclic group include groups in which one or more hydrogen atoms have been removed from either a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, in these alicyclic hydrocarbon groups, part of the carbon atoms that constitute the ring structure may be replaced with an ether group (—O—).

Examples of acid-dissociable groups containing an aliphatic cyclic group include:

(i) a group which forms a tertiary carbon atom on the ring structure of a monovalent aliphatic cyclic group in which a substituent (a group or an atom other than hydrogen) is bonded to the carbon atom to which an atom adjacent to the acid dissociable group (e.g., "—O—" within "—C(=O)—O— group") is bonded; and (ii) a group which have a monovalent aliphatic cyclic group, and a branched alkylene group containing a tertiary carbon atom that is bonded to the monovalent aliphatic cyclic group.

In a group of type (i) described above, as the substituent bonded to the carbon atom to which an atom adjacent to the acid dissociable group is bonded on the ring skeleton of the aliphatic cyclic group, an alkyl group can be mentioned. Examples of such alkyl groups include the same groups as those described below for $R^{14}$ in formulas (1-1) to (1-9).

Specific examples of groups of type (i) include groups represented by general formulas (1-1) to (1-9) shown below.

Specific examples of groups of type (ii) include groups represented by general formulas (2-1) to (2-6) shown below.

[Chemical Formula 44]

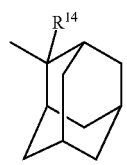
(1-1)

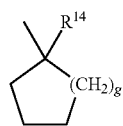
(1-2)

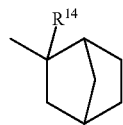
(1-3)

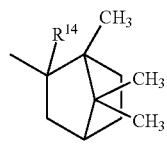
(1-4)

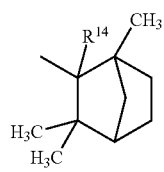
(1-5)

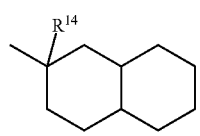
(1-6)

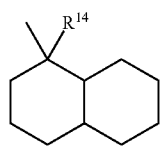
(1-7)

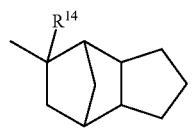
(1-8)

-continued

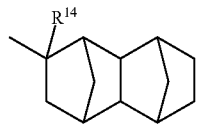
(1-9)

In the formulas above, $R^{14}$ represents an alkyl group, and g represents an integer of 0 to 8.

[Chemical Formula 45]

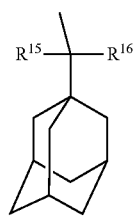
(2-1)

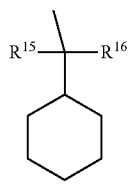
(2-2)

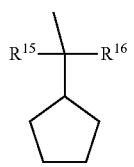
(2-3)

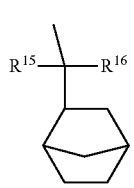
(2-4)

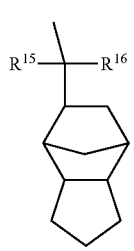
(2-5)

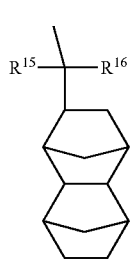
(2-6)

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

g is preferably an integer of 0 to 3, more preferably an integer of 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and formulas (2-1) to (2-6), a portion of the carbon atoms that constitute the ring(s) may be replaced with an ethereal oxygen atom (—O—).

Further, in formulas (1-1) to (1-9) and (2-1) to (2-6), one or more of the hydrogen atoms bonded to the carbon atoms that constitute the ring(s) may each be substituted with a substituent. Examples of the substituent include an alkyl group of 1 to 5 carbon atoms, a fluorine atom and a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. Under the action of acid, the bond between the acetal-type acid-dissociable group and the oxygen atom to which the acetal-type acid-dissociable group is bonded is broken, thereby forming an OH-containing polar group such as a carboxyl group or hydroxyl group.

Examples of acetal-type acid-dissociable groups include groups represented by a general formula (p1) shown below.

[Chemical Formula 46]

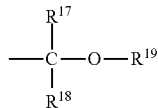
(p1)

In the formula, each of $R^{1'}$ and $R^{2'}$ independently represents a hydrogen atom or an alkyl group of 1 to 5 carbon atoms, n represents an integer of 0 to 3, and Y' represents an alkyl group of 1 to 5 carbon atoms or an aliphatic cyclic group.

In formula (p1), n is preferably an integer of 0 to 2, more preferably 0 or 1, and most preferably 0.

Examples of the alkyl group for $R^{1'}$ and $R^{2'}$ include linear or branched alkyl groups such as a methyl group, ethyl group, propyl group, isopropyl group, n-butyl group, isobutyl group, tert-butyl group, pentyl group, isopentyl group and neopentyl group, and of these, a methyl group or ethyl group is preferable, and a methyl group is the most desirable.

In the present invention, it is preferable that at least one of $R^{1'}$ and $R^{2'}$ is a hydrogen atom. In other words, it is preferable that the acid-dissociable group (p1) is a group represented by general formula (p1-1) shown below.

[Chemical Formula 47]

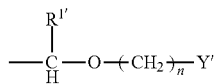
(p1-1)

In the formula, $R^{1'}$, n and Y' are the same as defined above.

Examples of the alkyl group for Y' include linear or branched alkyl groups such as a methyl group, ethyl group, propyl group, isopropyl group, n-butyl group, isobutyl group, tert-butyl group, pentyl group, isopentyl group and neopentyl group.

As the aliphatic cyclic group for Y', any of the monocyclic or polycyclic aliphatic cyclic groups that have been proposed for conventional ArF resists or the like can be selected and used as appropriate. For example, the same aliphatic cyclic groups as those described above in connection with the "acid-dissociable group containing an aliphatic cyclic group" can be used.

Further, as the acetal-type, acid-dissociable group, groups represented by general formula (p2) shown below can also be used.

[Chemical Formula 48]

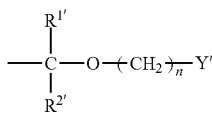
(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein the terminal of $R^{17}$ and the terminal of $R^{19}$ are bonded to each other to form a ring.

The alkyl group for $R^{17}$ and $R^{18}$ preferably has 1 to 15 carbon atoms, and may be either linear or branched. The alkyl group is preferably an ethyl group or methyl group, and most preferably a methyl group.

It is particularly desirable that one of $R^{17}$ and $R^{18}$ is a hydrogen atom, and the other is a methyl group.

$R^{19}$ represents a linear, branched or cyclic alkyl group, which preferably has 1 to carbon atoms, and may be any of linear, branched or cyclic.

When $R^{19}$ represents a linear or branched alkyl group, it is preferably an alkyl group of 1 to 5 carbon atoms, more preferably a methyl group or ethyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (preferably an alkylene group of 1 to 5 carbon atoms), wherein t $R^{19}$ and $R^{17}$ may be bonded to each other.

In such a case, a cyclic group is formed by $R^{11}$, $R^{19}$, the oxygen atom having $R^{19}$ bonded thereto, and the carbon atom having the oxygen atom and $R^{17}$ bonded thereto. This cyclic group is preferably a 4- to 7-membered ring, and more preferably a 4- to 6-membered ring. Specific examples of the cyclic group include a tetrahydropyranyl group and a tetrahydrofuranyl group.

Provided the structural unit (a1) contains an acid-decomposable group, there are no particular limitations on the remaining structure of the structural unit, but examples of particularly preferred structures include a structural unit (a11) derived from an acrylate ester in which the hydrogen atom bonded to the carbon atom on the α-position may be substituted with a substituent, and containing an acid-decomposable group, a structural unit (a12) derived from a hydroxystyrene in which the hydrogen atom bonded to the carbon atom on the α-position may be substituted with a substituent, in which the hydrogen atoms bonded to the benzene ring may be substituted with a substituent other than a hydroxyl group, and in which the hydrogen atom of the hydroxyl group is substituted with an acid-dissociable group or a substituent containing an acid-dissociable group, and a structural unit (a13) derived from a vinyl(hydroxynaphthalene) in which the hydrogen atom bonded to the carbon atom on the α-position may be substituted with a substituent, in which the hydrogen atoms bonded to the naphthalene ring may be substituted with a substituent other than a hydroxyl group, and in which the hydrogen atom of the hydroxyl group is substituted with an acid-dissociable group or a substituent containing an acid-dissociable group.

Among these structural units, the structural unit (a11) is preferred in terms of improving roughness (namely, reducing line width roughness and line edge roughness), and the structural unit (a12) or the structural unit (a13) is preferred in terms of control of the absorption of the exposure radiation.

In the present description and claims, a "structural unit derived from an acrylate ester" refers to a structural unit that is formed by the cleavage of the ethylenic double bond of an acrylate ester.

An "acrylate ester" refers to a compound in which the hydrogen atom at the carboxyl group terminal of acrylic acid ($CH_2=CH-COOH$) has been substituted with an organic group.

In the acrylate ester, the hydrogen atom bonded to the carbon atom on the α-position may be substituted with a substituent. The substituent that substitutes the hydrogen atom bonded to the carbon atom on the α-position is an atom or group other than a hydrogen atom, and examples thereof include an alkyl group of 1 to 5 carbon atoms, a halogenated alkyl group of 1 to 5 carbon atoms and a hydroxyalkyl group. Unless specified otherwise, the carbon atom on the α-position of an acrylate ester refers to the carbon atom having the carbonyl group bonded thereto.

Hereafter, an acrylic acid or acrylate ester in which the hydrogen atom bonded to the carbon atom on the α-position is substituted with a substituent is sometimes referred to as an "α-substituted acrylic acid" or "α-substituted acrylate ester" respectively.

With respect to the α-substituted acrylate ester, the alkyl group as the substituent on the α-position is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Further, specific examples of the halogenated alkyl group as the substituent on the α-position include groups in which part or all of the hydrogen atoms of an aforementioned "alkyl group as the substituent on the α-position" have each been substituted with a halogen atom. Examples of the halogen atom include a fluorine atom, chlorine atom, bromine atom and iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the α-substituted acrylate ester, and a hydrogen atom, an alkyl group of 1 to 5 carbon atoms or a fluorinated alkyl group of 1 to 5 carbon atoms is more preferable. In terms of industrial availability, a hydrogen atom or a methyl group is the most desirable.

A "structural unit derived from a hydroxystyrene" refers to a structural unit that is formed by the cleavage of the ethylenic double bond of a hydroxystyrene.

A hydroxystyrene is a compound in which one vinyl group and at least one hydroxyl group are bonded to a benzene ring. The number of hydroxyl groups bonded to the benzene ring is preferably from 1 to 3, and 1 is particularly desirable. There are no particular limitations on the bonding position(s) of the hydroxyl group(s) on the benzene ring. When there is only one hydroxyl group, the bonding position of the vinyl group is preferably the para-position (4th position). When the number of hydroxyl groups is an integer of two or more, any arbitrary combination of bonding positions may be used.

A "structural unit derived from a vinyl(hydroxynaphthalene)" refers to a structural unit that is formed by the cleavage of the ethylenic double bond of a vinyl(hydroxynaphthalene).

A vinyl(hydroxynaphthalene) is a compound in which a single vinyl group and at least one hydroxyl group are bonded to a naphthalene ring. The vinyl group may be bonded to the 1st position or 2nd position of the naphthalene ring. The number of hydroxyl groups bonded to the naphthalene ring is preferably from 1 to 3, and 1 is particularly desirable. There are no particular limitations on the bonding position(s) of the hydroxyl group(s) on the naphthalene ring. When the vinyl group is bonded to the 1st position or 2nd position of the naphthalene ring, the hydroxyl group(s) are preferably bonded to any of the 5th to 8th positions. In particular, when there is only one hydroxyl group, the hydroxyl group is preferably bonded to any one of the 5th to 7th positions of the naphthalene ring, and more preferably bonded to the 5th or 6th position. When the number of hydroxyl groups is an integer of two or more, any arbitrary combination of bonding positions may be used.

—tructural Unit (a11):

The structural unit (a11) is a structural unit derived from an acrylate ester in which the hydrogen atom bonded to the carbon atom on the α-position may be substituted with a substituent and containing an acid-decomposable group.

Specific examples of the structural unit (a11) include structural units represented by general formula (a1-0-1) shown below and structural units represented by general formula (a1-0-2) shown below.

[Chemical Formula 49]

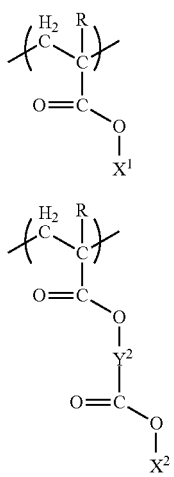

In the formulas, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In the general formula (a1-0-1), examples of the alkyl group of 1 to 5 carbon atoms for R include linear or branched alkyl groups such as a methyl group, ethyl group, propyl group, isopropyl group, n-butyl group, isobutyl group, tert-butyl group, pentyl group, isopentyl group and neopentyl group.

Examples of the halogenated alkyl group of 1 to 5 carbon atoms for R include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, a tertiary alkyl ester-type acid-dissociable group is preferable.

In the general formula (a1-0-2), R is the same as defined above.

$X^2$ is the same as defined for $X^1$ in formula (a1-0-1).

Although there are no particular limitations on the divalent linking group for $Y^2$ preferred examples include divalent hydrocarbon groups which may have a substituent, and divalent linking groups containing a hetero atom.

Examples of the divalent linking group for $Y^2$ include the same groups as those mentioned above for the divalent linking group for $R^2$ in formula (a5-0).

Of the various possibilities, $Y^2$ is preferably a linear or branched alkylene group or a divalent linking group containing a hetero atom, and is more preferably a linear or branched alkylene group, a group represented by the above formula —$Y^{21}$—O—$Y^{22}$—, a group represented by the above formula —[$Y^{21}$—C(=O)—O]$_{m'}$—$Y^{22}$—, or a group represented by the above formula —$Y^{21}$—O—C(=O)—$Y^{22}$—.

Specific examples of the structural unit (a1) include structural units represented by general formulas (a1-1) to (a1-4) shown below.

[Chemical Formula 50]

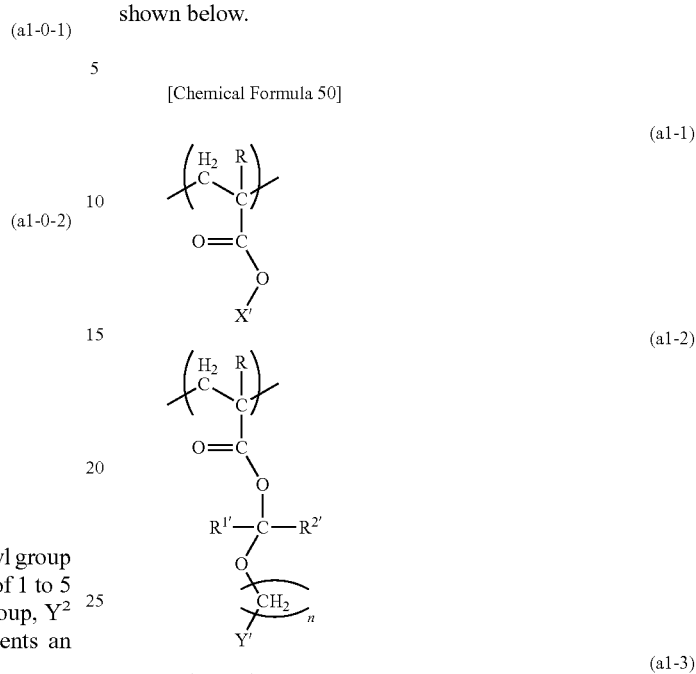

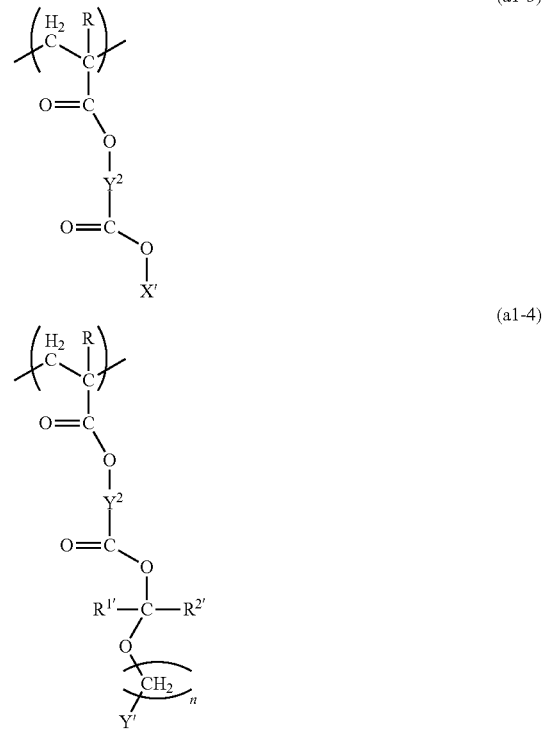

In the formulas, R, $R^{1'}$, $R^{2'}$, n, Y' and $Y^2$ are each the same as defined above, and X' represents a tertiary alkyl ester-type acid-dissociable group.

In the above formulas, examples of X' include the same tertiary alkyl ester-type acid-dissociable groups as those described above.

$R^{1'}$, $R^{2'}$, n and Y' are the same as defined above for $R^{1'}$, $R^{2'}$, n and Y' respectively in general formula (p1) within the description relating to the "acetal-type acid-dissociable group".

Examples of $Y^2$ include the same groups as those described above for $Y^2$ in general formula (a1-0-2).
Specific examples of structural units represented by general formula (a1-1) to (a1-4) are shown below.
In the formulas shown below, $R^\alpha$ represents a hydrogen atom, a methyl group or a trifluoromethyl group.
[Chemical Formula 51]
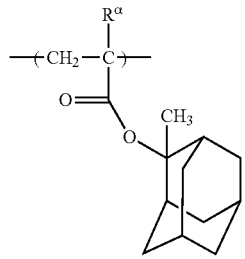
(a1-1-1)
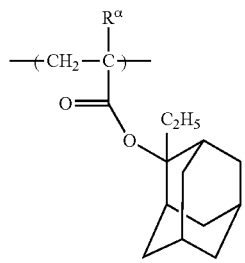
(a1-1-2)
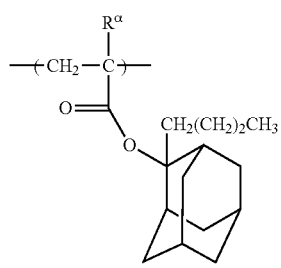
(a1-1-3)
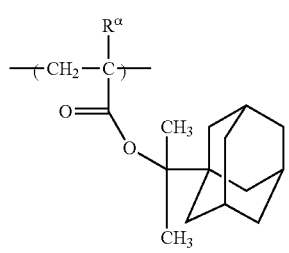
(a1-1-4)
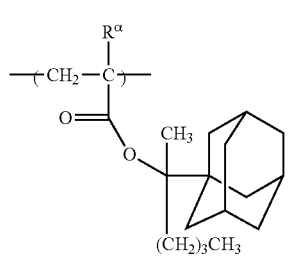
(a1-1-5)
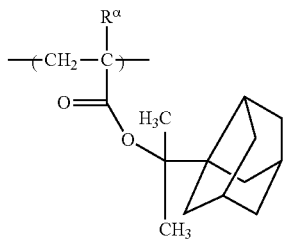
(a1-1-6)
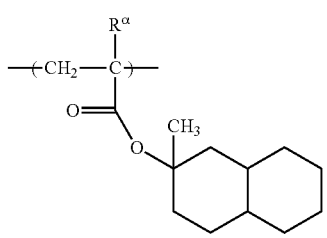
(a1-1-7)
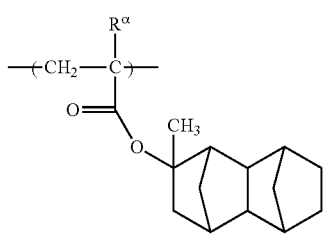
(a1-1-8)
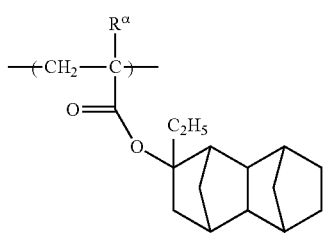
(a1-1-9)
[Chemical Formula 52]
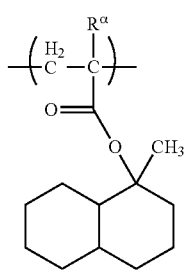
(a1-1-10)
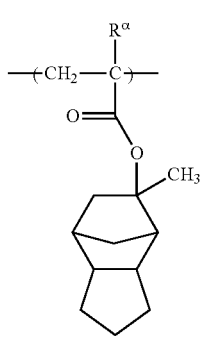
(a1-1-11)

-continued
(a1-1-12) 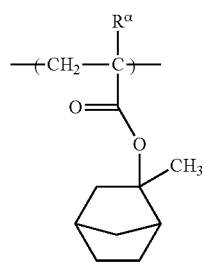
(a1-1-13) 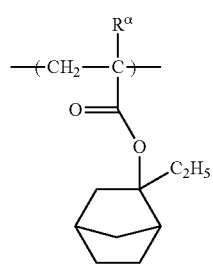
(a1-1-14) 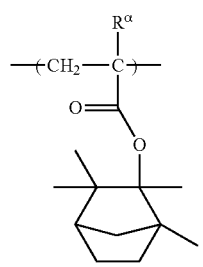
(a1-1-15) 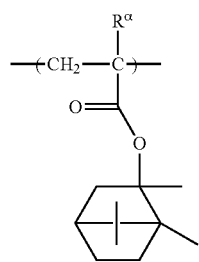
(a1-1-16) 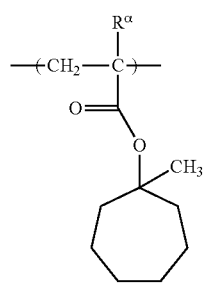
(a1-1-17) 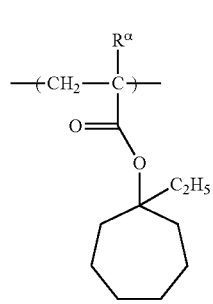
-continued
(a1-1-18) 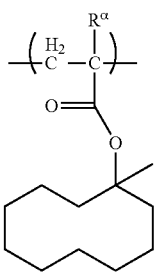
(a1-1-19) 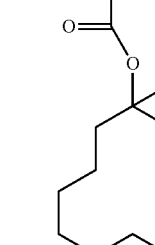
(a1-1-20) 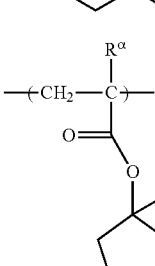
(a1-1-21) 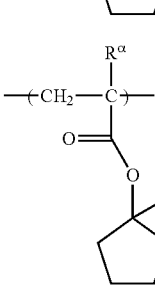
[Chemical Formula 53]
(a1-1-22) 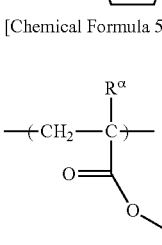
(a1-1-23) 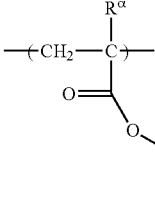

-continued
(a1-1-24)
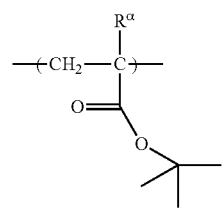
(a1-1-25)
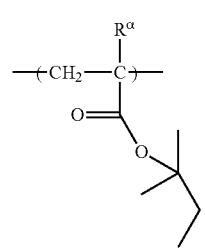
(a1-1-26)
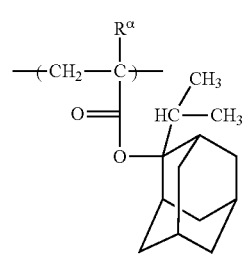
(a1-1-27)
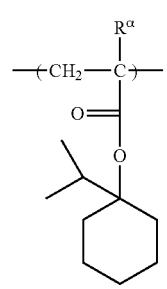
(a1-1-28)
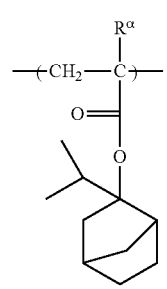
(a1-1-29)
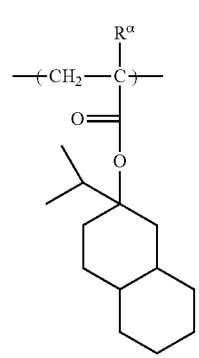
-continued
(a1-1-30)
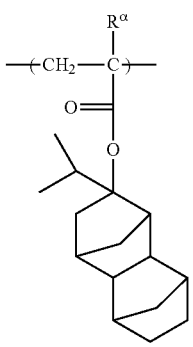
(a1-1-31)
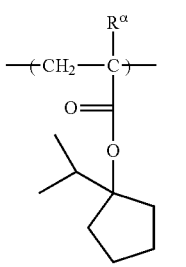
(a1-1-32)
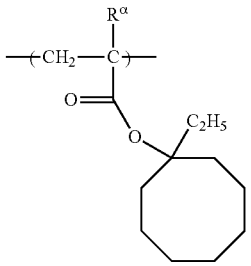
(a1-1-33)
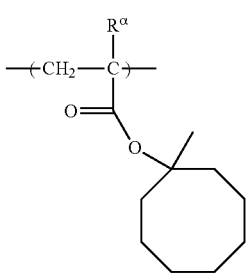
(a1-1-34)
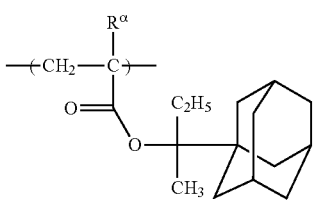
(a1-1-35)
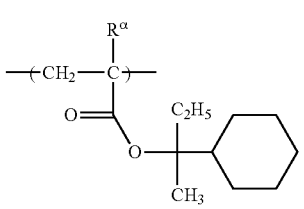

(a1-1-36)
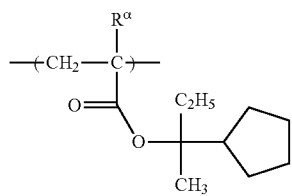
[Chemical Formula 54]
(a1-2-1)
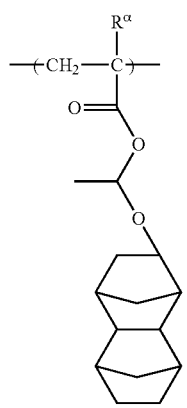
(a1-2-2)
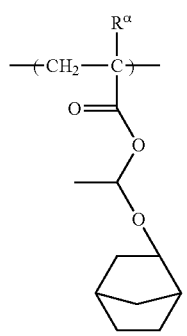
(a1-2-3)
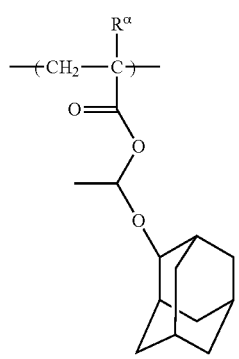
(a1-2-4)
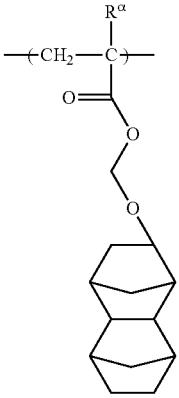
(a1-2-5)
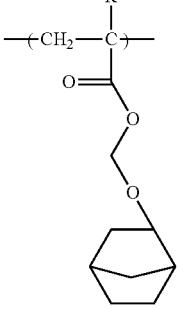
(a1-2-6)
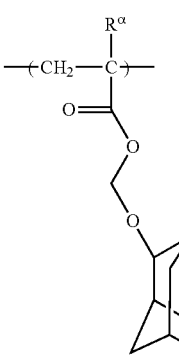
(a1-2-7)
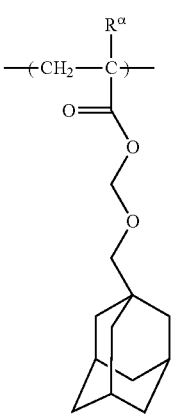

(a1-2-8) 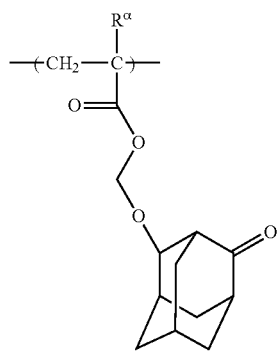
(a1-2-12) 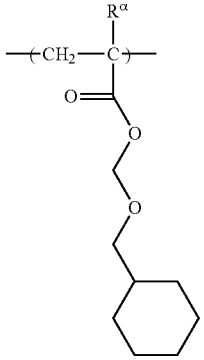
(a1-2-9) 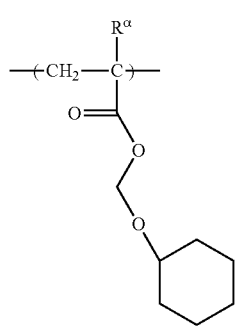
(a1-2-13) 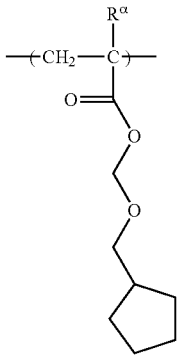
(a1-2-10) 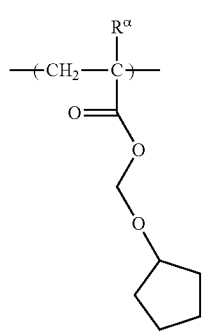
(a1-2-14) 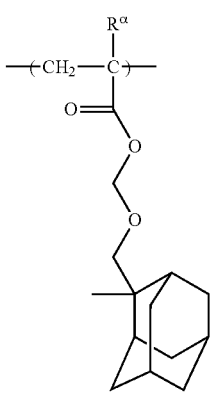
(a1-2-11) 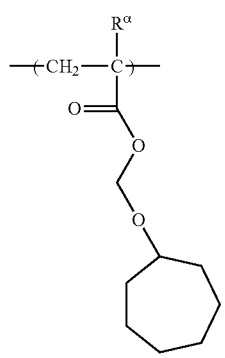
(a1-2-15)

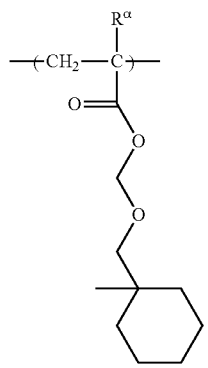 (a1-2-16)
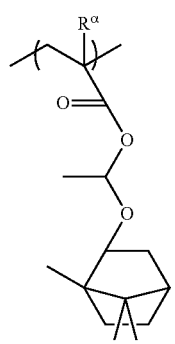 (a1-2-17)
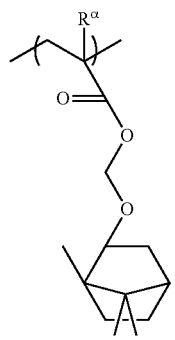 (a1-2-18)
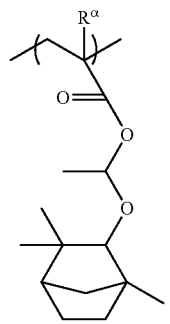 (a1-2-19)
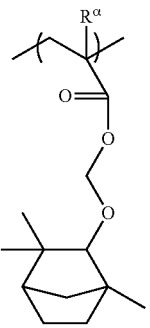 (a1-2-20)
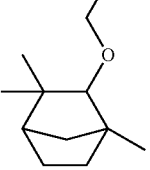 (a1-2-21)
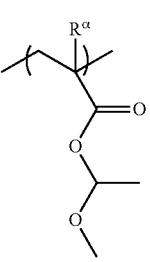 (a1-2-22)
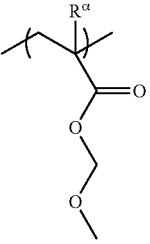 (a1-2-23)
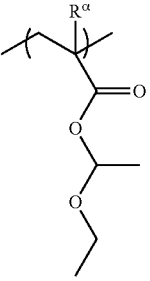 (a1-2-24)
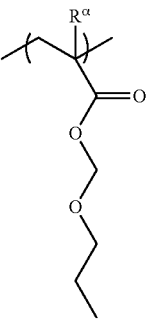

[Chemical Formula 55]
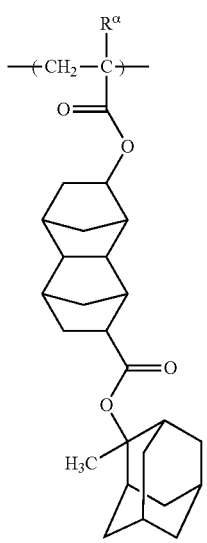 (a1-3-1)
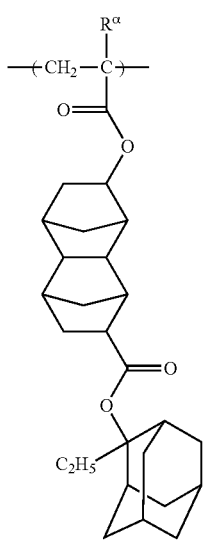 (a1-3-2)
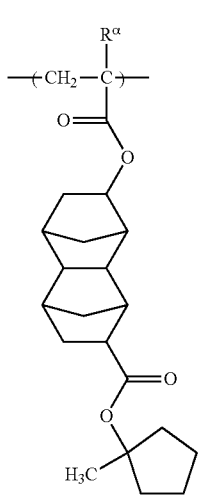 (a1-3-3)
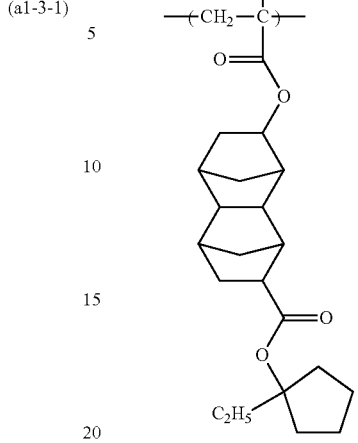 (a1-3-4)
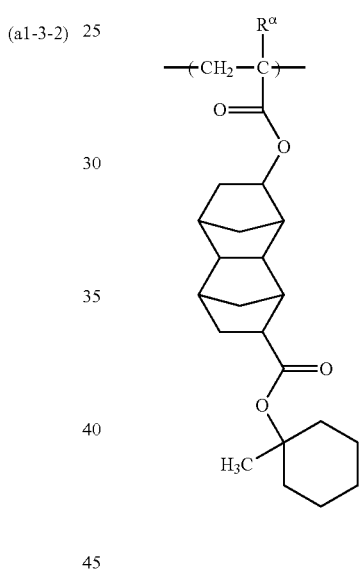 (a1-3-5)
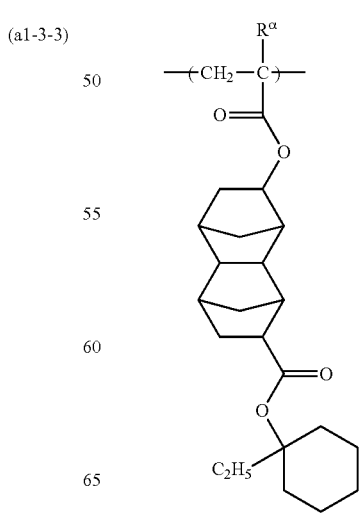 (a1-3-6)

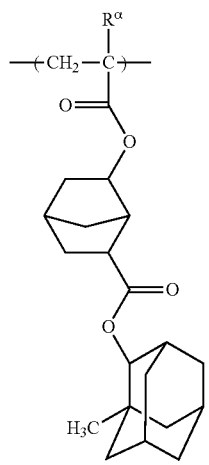
(a1-3-7)
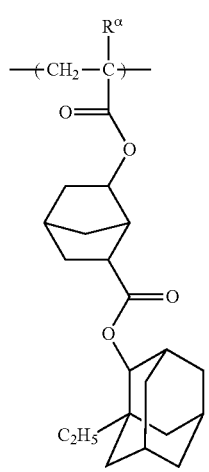
(a1-3-8)
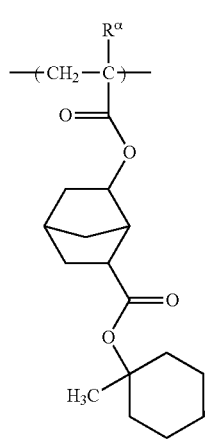
(a1-3-9)
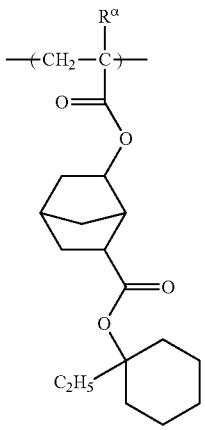
(a1-3-10)
(a1-3-11)
(a1-3-12)
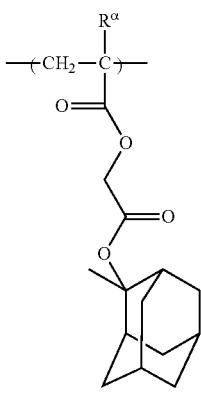
(a1-3-13)

-continued
(a1-3-14)
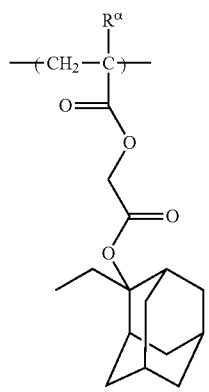
(a1-3-15)
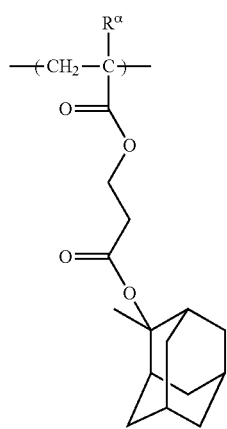
(a1-3-16)
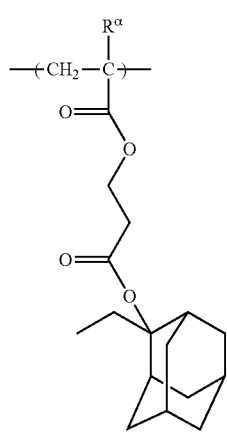
(a1-3-17)
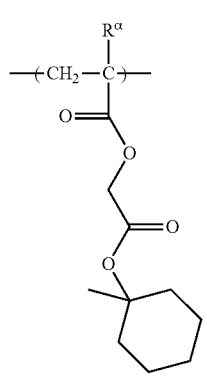
-continued
(a1-3-18)
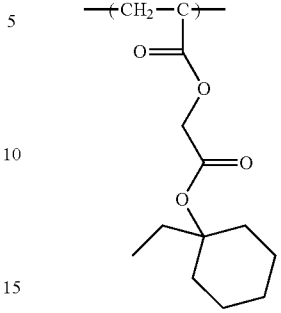
[Chemical Formula 56]
(a1-3-19)
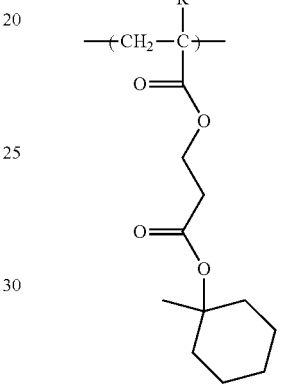
(a1-3-20)
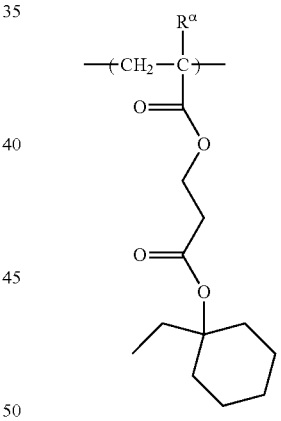
(a1-3-21)
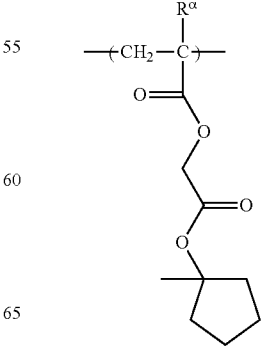

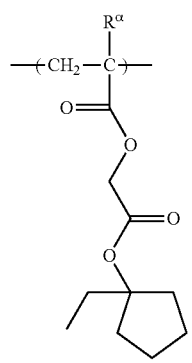 (a1-3-22)
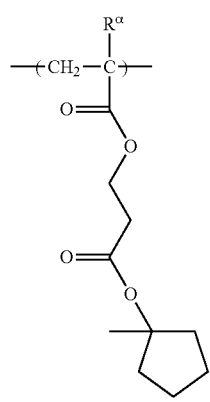 (a1-3-23)
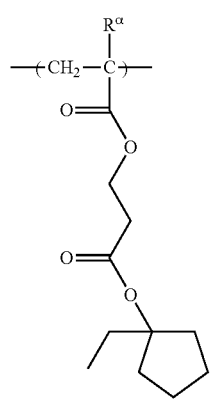 (a1-3-24)
[Chemical Formula 57]
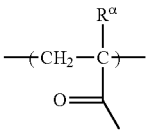 (a1-3-25)
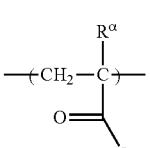 (a1-3-26)
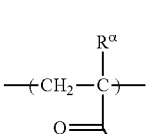 (a1-3-27)

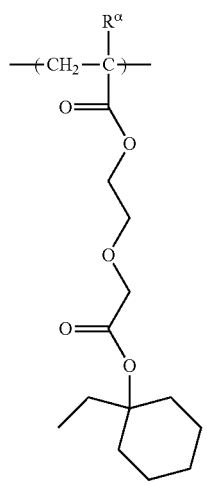
(a1-3-28)
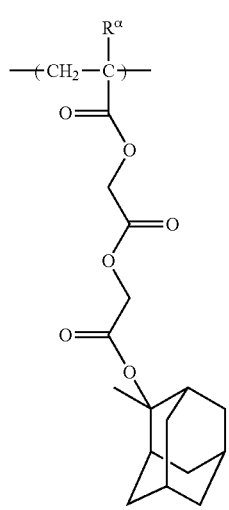
(a1-3-29)
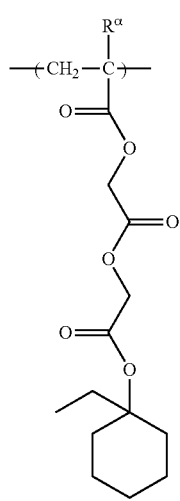
(a1-3-30)
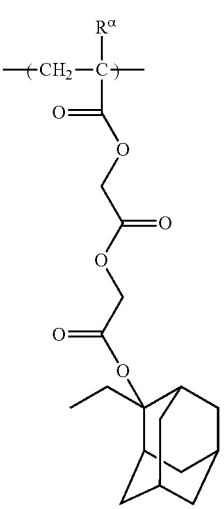
(a1-3-31)
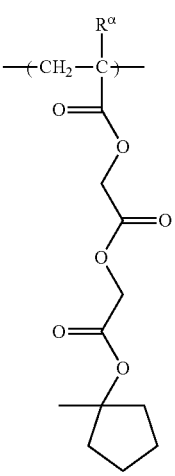
(a1-3-32)
[Chemical Formula 58]
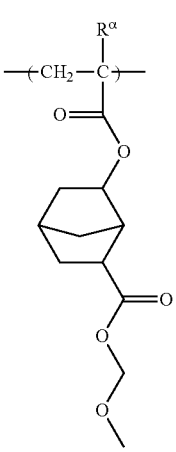
(a1-4-1)

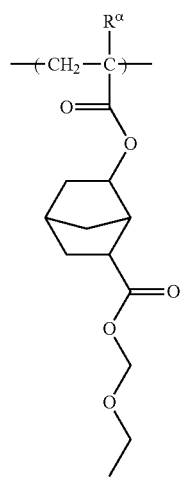 (a1-4-2)
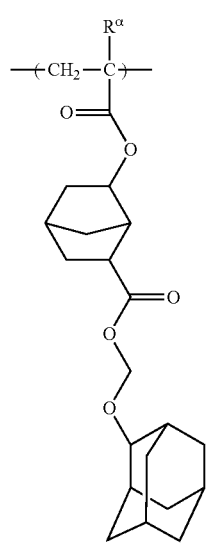 (a1-4-3)
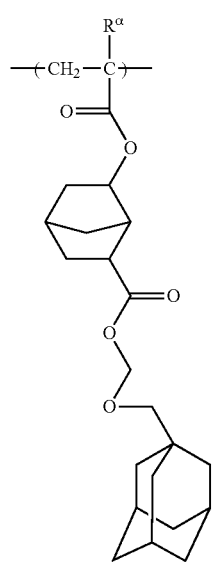 (a1-4-4)
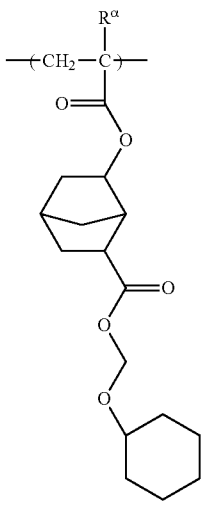 (a1-4-5)
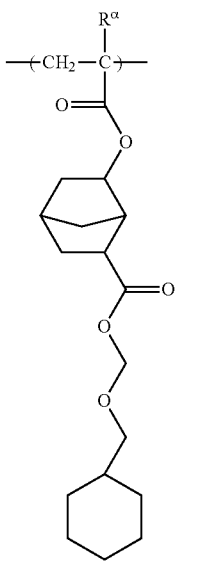 (a1-4-6)
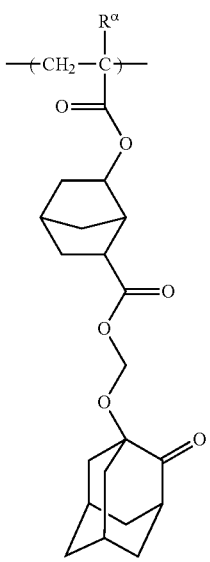 (a1-4-7)

119
-continued
(a1-4-8)
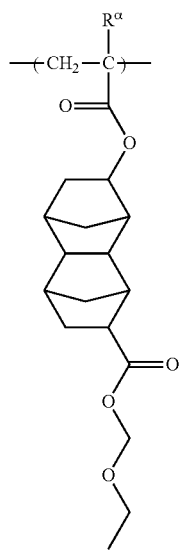
(a1-4-9)
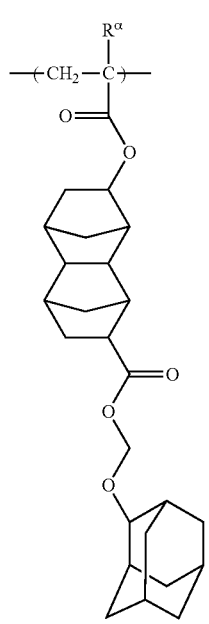
120
-continued
(a1-4-10)
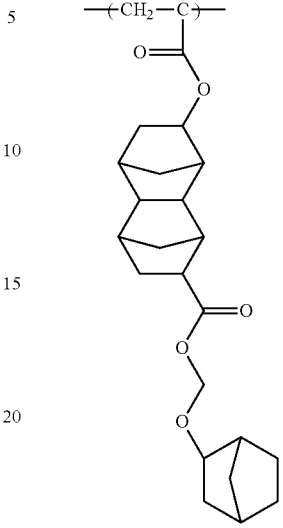
(a1-4-11)
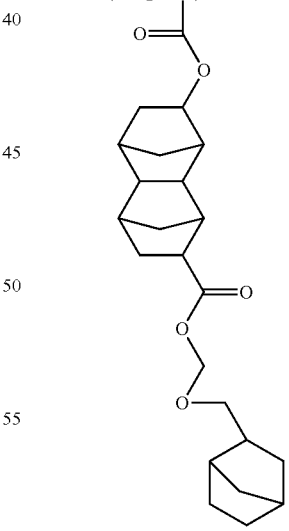

-continued (a1-4-12)

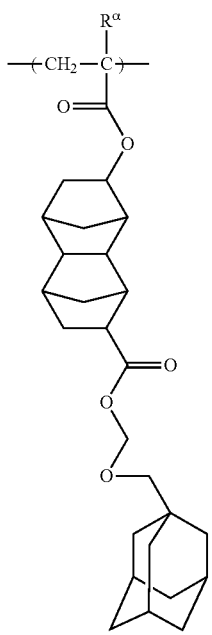

(a1-4-13)

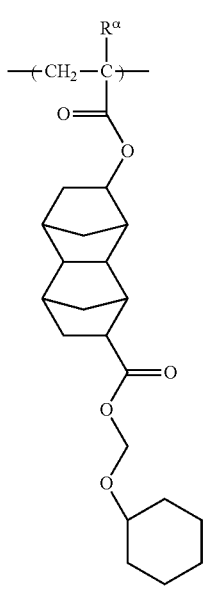

-continued (a1-4-14)

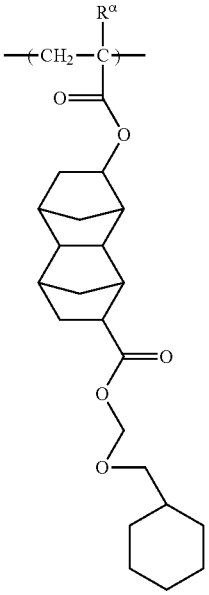

(a1-4-15)

In the present invention, the polymeric compound preferably includes, as the structural unit (a1), at least one structural unit selected from the group consisting of structural units represented by general formulas (a1-0-11) to (a1-0-15), formula (a1-2) and formula (a1-0-2) shown below, more preferably includes at least one structural unit selected from the group consisting of structural units represented by general formula (a1-0-11), formula (a1-0-12) and formula (a1-0-13) shown below, and most preferably includes a structural unit represented by general formula (a1-0-12) shown below.

[Chemical Formula 59]

(a1-0-11)
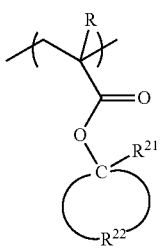

(a1-0-12)
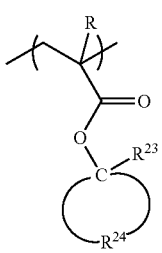

(a1-0-13)
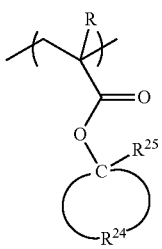

(a1-0-14)
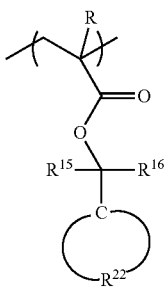

(a1-0-15)
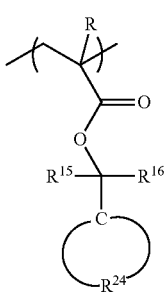

(a1-2)
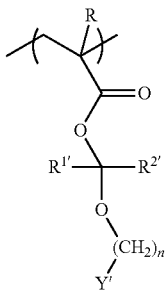

(a1-0-2)
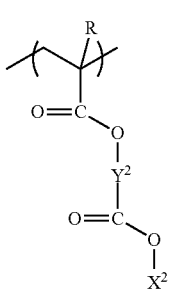

In the formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group which forms an aliphatic monocyclic group in combination with the carbon atom to which this $R^{22}$ group is bonded, $R^{23}$ represents a branched alkyl group, $R^{24}$ represents a group which forms an aliphatic polycyclic group in combination with the carbon atom to which this $R^{24}$ group is bonded, $R^{25}$ represents a linear alkyl group of 1 to carbon atoms, each of $R^{15}$ and $R^{16}$ independently represents an alkyl group, each of $R^{1\prime}$ and $R^{2\prime}$ independently represents a hydrogen atom or an alkyl group of 1 to 5 carbon atoms, n represents an integer of 0 to 3, Y' represents an alkyl group of 1 to 5 carbon atoms or an aliphatic cyclic group, $Y^2$ represents a divalent linking group, and $X^2$ represents an acid-dissociable group.

In each of the above formulas, R, $Y^2$ and $X^2$ are the same as defined above.

In formula (a1-0-11), examples of the alkyl group for $R^{21}$ include the same alkyl groups as those described above for $R^{14}$ in formulas (1-1) to (1-9), and of these, a methyl group, ethyl group or isopropyl group is preferred, and a methyl group or ethyl group is particularly desirable.

In terms of $R^{22}$, examples of the aliphatic monocyclic group that is formed in combination with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

A portion of the carbon atoms that constitute the ring of the monocycloalkane may or may not be substituted with an ether group (—O—).

Further, the monocycloalkane may include an alkyl group of 1 to 5 carbon atoms, a fluorine atom, or a fluorinated alkyl group of 1 to 5 carbon atoms as a substituent.

Examples of the $R^{22}$ group that constitutes the aliphatic monocyclic group include linear alkylene groups which may have an ether group (—O—) interposed between the carbon atoms.

Specific examples of the structural units represented by formula (a1-0-11) include structural units represented by the above formulas (a1-1-16) to (a1-1-23), (a1-1-27), and (a1-1-31) to (a1-1-33). Among these, structural units represented by general formula (a1-1-02) shown below, which includes the structural units represented by formulas (a1-1-16) and (a1-1-17), formulas (a1-1-20) to (a1-1-23), formula (a1-1-27), and formulas (a1-1-31) to (a1-1-33) are preferred. Furthermore, structural units represented by general formula (a1-1-02') shown below are also preferred.

In each of the formulas below, h is preferably 1 or 2.

[Chemical Formula 60]

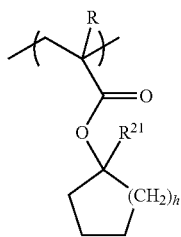

(a1-1-02)

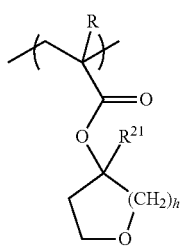

(a1-1-02')

In the formulas, R and $R^{21}$ are each the same as defined above, and h represents an integer of 1 to 4.

In formula (a1-0-12), examples of the branched alkyl group for $R^{23}$ include the same branched alkyl groups as those described above for the alkyl group for $R^{14}$ in formulas (1-1) to (1-9), and an isopropyl group is particularly desirable.

Examples of the aliphatic polycyclic group formed by $R^{24}$ in combination with the carbon atom to which $R^{24}$ is bonded include the same groups as the polycyclic groups among the aliphatic cyclic groups described above in connection with the tertiary alkyl ester-type acid-dissociable group.

Specific examples of structural units represented by general formula (a1-0-12) include the structural units represented by the above formula (a1-1-26) and formulas (a1-1-28) to (a1-1-30).

The structural unit represented by formula (a1-0-12) is preferably a structural unit in which the aliphatic polycyclic group formed by $R^{24}$ in combination with the carbon atom to which $R^{24}$ is bonded is a 2-adamantyl group, and a structural unit represented by the above formula (a1-1-26) is particularly desirable.

In formula (a1-0-13), R and $R^{24}$ are each the same as defined above.

Examples of the linear alkyl group for $R^{25}$ include the same linear alkyl groups as those described above for the alkyl group for $R^{14}$ in formulas (1-1) to (1-9), and a methyl group or an ethyl group is the most desirable.

Specific examples of the structural units represented by formula (a1-0-13) include the structural units represented by formulas (a1-1-1) to (a1-1-3) and (a1-1-7) to (a1-1-15) which were described above as specific examples of the aforementioned general formula (a1-1).

The structural unit represented by formula (a1-0-13) is preferably a structural unit in which the aliphatic polycyclic group formed by $R^{24}$ in combination with the carbon atom to which $R^{24}$ is bonded is a 2-adamantyl group, and a structural unit represented by one of the above formulas (a1-1-1), (a1-1-2) or (a1-1-9) is particularly desirable.

In formula (a1-0-14), R and $R^{22}$ are each the same as defined above. $R^{15}$ and $R^{16}$ are the same as defined above for $R^{15}$ and $R^{16}$ respectively in the aforementioned general formulas (2-1) to (2-6).

Specific examples of the structural units represented by formula (a1-0-14) include the structural units represented by formulas (a1-1-35) and (a1-1-36) which were described above as specific examples of the general formula (a1-1).

In formula (a1-0-15), R and $R^{24}$ are each the same as defined above. $R^{15}$ and $R^{16}$ are each the same as defined above for $R^{15}$ and $R^{16}$ respectively in the aforementioned general formulas (2-1) to (2-6).

Specific examples of the structural units represented by formula (a1-0-15) include the structural units represented by formulas (a1-1-4) to (a1-1-6) and (a1-1-34) which were described above as specific examples of the aforementioned general formula (a1-1).

In formula (a1-2), $R^{1\prime}$, $R^{2\prime}$, n and Y' are each the same as defined above.

It is preferable that at least one of $R^{1\prime}$ and $R^{2\prime}$ is a hydrogen atom, and the case in which both of $R^{1\prime}$ and $R^{2\prime}$ are hydrogen atoms is particularly desirable.

n is preferably 0 or 1, and most preferably 0.

Y' is preferably an aliphatic cyclic group, and examples include the same aliphatic cyclic groups as those described above for the "acid-dissociable group containing an aliphatic cyclic group". A group in which one or more hydrogen atoms have been removed from a polycycloalkane is particularly desirable.

Specific examples of the structural units represented by formula (a1-2) include structural units represented by formula (a1-2-6).

Examples of the structural units represented by formula (a1-0-2) include structural units represented by the above formulas (a1-3) and (a1-4), and of these, a structural unit represented by formula (a1-3) is particularly desirable.

Among structural units represented by general formula (a1-0-2), those in which $Y^2$ in the formula is a group represented by one of the aforementioned formulas —$Y^{21}$—O—$Y^{22}$—, —[$Y^{21}$—C(=O)—O]$_{m\prime}$—$Y^{22}$— or —$Y^{21}$—C(=O)—O—$Y^{22}$— is particularly desirable.

Preferred examples of such structural units include structural units represented by general formula (a1-3-01) shown below, structural units represented by general formula (a1-3-02) shown below, and structural units represented by general formula (a1-3-03) shown below.

[Chemical Formula 61]

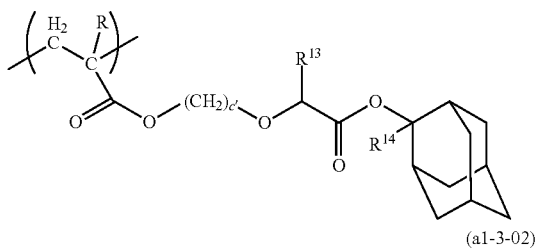

(a1-3-01)

(a1-3-02)

In the formulas, R is the same as defined above, $R^{13}$ represents a hydrogen atom or a methyl group, $R^{14}$ represents an alkyl group, c' represents an integer of 1 to 10, and n' represents an integer of 0 to 3.

[Chemical Formula 62]

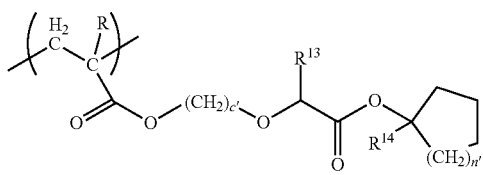

(a1-3-03)

In the formula, R is the same as defined above, each of $Y^{2\prime}$ and $Y^{2\prime\prime}$ independently represents a divalent linking group, X' represents an acid-dissociable group, and w represents an integer of 0 to 3.

In formulas (a1-3-01) to (a1-3-02), $R^{13}$ is preferably a hydrogen atom.

$R^{14}$ is the same as defined for $R^{14}$ in the aforementioned formulas (1-1) to (1-9).

c' is preferably an integer of 1 to 8, more preferably an integer of 1 to 5, and most preferably 1 or 2.

n' is preferably 1 or 2, and most preferably 2.

Specific examples of the structural units represented by formula (a1-3-01) include the structural units represented by the above formulas (a1-3-25) and (a1-3-26).

Specific examples of structural units represented by general formula (a1-3-02) include the structural units represented by the aforementioned formulas (a1-3-27) and (a1-3-28).

Examples of the divalent linking groups for $Y^{2\prime}$ and $Y^{2\prime\prime}$ in formula (a1-3-03) include the same groups as those described above for $Y^2$ in general formula (a1-3).

$Y^{2\prime}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

$Y^{2\prime\prime}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

The acid-dissociable group for X' is the same as defined above, is preferably a tertiary alkyl ester-type acid-dissociable group, is more preferably a group of type (i) described above, in which a substituent is bonded to the carbon atom within the ring structure of a monovalent aliphatic cyclic group that is bonded to the atom adjacent to the acid-dissociable group, thereby forming a tertiary carbon atom on the ring structure of the monovalent aliphatic cyclic group, and is most preferably a group represented by the above general formula (1-1).

w represents an integer of 0 to 3, and is preferably an integer of 0 to 2, more preferably 0 or 1, and most preferably 1.

The structural unit represented by general formula (a1-3-03) is preferably a structural unit represented by general formula (a1-3-03-1) or (a1-3-03-2) shown below, and among these, is most preferably a structural unit represented by formula (a1-3-03-1).

[Chemical Formula 63]

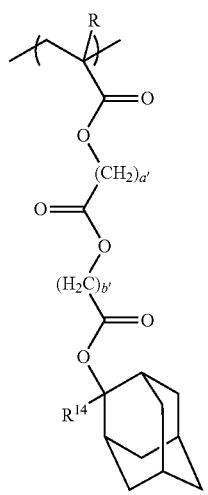

(a1-3-03-1)

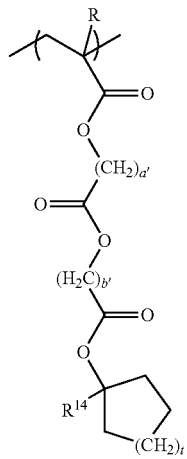

(a1-3-03-2)

In the formulas, R and $R^{14}$ are the same as defined above, a' represents an integer of 1 to 10, b' represents an integer of 1 to 10, and t represents an integer of 0 to 3.

In formulas (a1-3-03-1) and (a1-3-03-2), a' is preferably an integer of 1 to 8, more preferably an integer of 1 to 5, and most preferably 1 or 2.

b' is preferably an integer of 1 to 8, more preferably an integer of 1 to 5, and most preferably 1 or 2.

t is preferably an integer of 1 to 3, and most preferably 1 or 2.

Specific examples of the structural units represented by formulas (a1-3-03-1) and (a1-3-03-2) include the structural units represented by the above formulas (a1-3-29) to (a1-3-32).

—Structural Unit (a12):

The structural unit (a12) is a structural unit derived from a hydroxystyrene in which the hydrogen atom bonded to the carbon atom on the α-position may be substituted with a substituent, in which the hydrogen atoms bonded to the benzene ring may be substituted with a substituent other than a hydroxyl group, and in which the hydrogen atom of the hydroxyl group is substituted with an acid-dissociable group or a substituent containing an acid-dissociable group.

Examples of the acid-dissociable group include groups that substitutes the hydrogen atom of the hydroxyl group include the same groups as those described above, and of these, a tertiary alkyl ester-type acid-dissociable group or an acetal-type acid-dissociable group is preferred, and an acetal-type acid-dissociable group is particularly preferred.

Examples of the substituent containing an acid-dissociable group include groups composed of an acid-dissociable group and a divalent linking group. Examples of this divalent linking group include the same groups as those mentioned above for the divalent linking group for $Y^2$ in formula (a1-0-2), and groups in which the terminal structure on the side of the acid-dissociable group is a carbonyloxy group are preferred. In such cases, the acid-dissociable group is preferably bonded to the oxygen atom (—O—) of the carbonyloxy group.

The substituent containing an acid-dissociable group is preferably a group represented by $R^{11'}$—O—C(=O)— or a group represented by $R^{11'}$—O—C(=O)—$R^{12'}$—. In these formulas, $R^{1'}$ represents an acid-dissociable group, and $R^{12'}$ represents a linear or branched alkylene group.

The acid-dissociable group for $R^{11'}$ is preferably a tertiary alkyl ester-type acid-dissociable group or an acetal-type acid-dissociable group, and is more preferably a tertiary alkyl ester-type acid-dissociable group. Examples of preferred tertiary alkyl ester-type acid-dissociable groups include aliphatic branched, acid-dissociable groups represented by the aforementioned formula —C($R^{71}$)($R^{72}$)($R^{73}$), groups represented by formulas (1-1) to (1-9), and groups represented by formulas (2-1) to (2-6).

Examples of the alkylene group for $R^{12'}$ include a methylene group, ethylene group, trimethylene group, tetramethylene group and 1,1-dimethylethylene group. $R^{12'}$ is preferably a linear alkylene group.

—Structural Unit (a13):

The structural unit (a13) is a structural unit derived from a vinyl(hydroxynaphthalene) in which the hydrogen atom bonded to the carbon atom on the α-position may be substituted with a substituent, in which the hydrogen atoms bonded to the naphthalene ring may be substituted with a substituent other than a hydroxyl group, and in which the hydrogen atom of the hydroxyl group is substituted with an acid-dissociable group or a substituent containing an acid-dissociable group.

In the structural unit (a13), examples of the acid-dissociable group or substituent containing an acid-dissociable group that substitutes the hydrogen atom of the hydroxyl group include the same groups and substituents as those mentioned above within the description of the structural unit (a12).

In those cases where the component (A1-1) includes the structural unit (a1), the structural unit (a1) may be a single type of structural unit, or a combination of two or more types.

The amount of the structural unit (a1) within the component (A1-1), based on the combined total of all the structural units that constitute the component (A1-1), is preferably within a range from 15 to 70 mol %, more preferably from 15 to 60 mol %, and still more preferably from 20 to 55 mol %.

When the amount of the structural unit (a1) is at least as large as the lower limit of the above range, a pattern can be formed easily using a resist composition prepared from the component (A1-1), and the lithography properties such as the sensitivity, the resolution and the pattern shape also improve. On the other hand, when the amount of the structural unit (a1) is not more than the upper limit of the above range, a good balance can be achieved with the other structural units.

—Structural Unit (a2)

In the present invention, the structural unit (a2) is a structural unit containing an —$SO_2$-containing cyclic group or a lactone-containing cyclic group.

When the component (A1-1) is used in forming a resist film, the —$SO_2$-containing cyclic group or lactone-containing cyclic group of the structural unit (a2) is effective in improving the adhesion of the resist film to the substrate.

In those cases where the structural unit (a5), (a6) or (a1) includes an —$SO_2$-containing cyclic group or a lactone-containing cyclic group within the unit structure, although the structural unit may also be classified as a structural unit (a2), in this description, this type of structural unit is classified as the structural unit (a5), (a6) or (a1), and not as the structural unit (a2).

Here, an "—$SO_2$-containing cyclic group" refers to a cyclic group having a ring ring containing —$SO_2$— within the ring structure, and refers specifically to a cyclic group in which the sulfur atom (S) within —$SO_2$— forms a part of the ring structure of the cyclic group. In the —$SO_2$-containing cyclic group, the ring containing —$SO_2$— within the ring structure is counted as the first ring. A cyclic group in which the only ring structure is the ring that contains —$SO_2$— in the ring structure is referred to as a monocyclic group, and a group containing other ring structures is described as a polycyclic group regardless of the structure of the other rings. The —$SO_2$-containing cyclic group may be either a monocyclic group or a polycyclic group.

The —$SO_2$-containing cyclic group is preferably a cyclic group containing —O—$SO_2$-within the ring structure, namely a cyclic group containing a sultone ring in which the —O—S— within the —O—$SO_2$— forms a part of the ring structure of the cyclic group.

The —$SO_{02}$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which part of the carbon atoms that constitute the ring structure have been substituted with either —SO₂— or —O—SO₂—. More specific examples include groups in which at least one hydrogen atom has been removed from an aliphatic hydrocarbon ring in which a —CH₂— group that constitutes part of the ring structure has been substituted with an —SO₂— group, and groups in which at least one hydrogen atom has been removed from an aliphatic hydrocarbon ring in which a —CH₂—CH₂— group that constitutes part of the ring structure has been substituted with an —O—SO₂— group.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Specific Examples of the polycycloalkane include adamantane, norbornane, isobornane, tricyclodecane and tetracyclododecane.

The —SO₂-containing cyclic group may have a substituent. Examples of the substituent include an alkyl group, alkoxy group, halogen atom, halogenated alkyl group, hydroxyl group, oxygen atom (=O), —COOR", —OC(=O)R", hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group substituent have each been substituted with an aforementioned halogen atom. A fluorinated alkyl group is preferred as the halogenated alkyl group, and a perfluoroalkyl group is particularly desirable.

In the aforementioned —COOR" group and —OC(=O)R" group, R" preferably represents a hydrogen atom, or a linear, branched or cyclic alkyl group of 1 to 15 carbon atoms.

When R" represents a linear or branched alkyl group, the alkyl group preferably contains 1 to 10 carbon atoms, and more preferably 1 to 5 carbon atoms, and is most preferably a methyl group or an ethyl group.

When R" is a cyclic alkyl group (cycloalkyl group), it preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples include groups in which at least one hydrogen atom within an aforementioned alkyl group for the substituent has been substituted with a hydroxyl group.

More specific examples of the —SO₂-containing cyclic group include groups represented by general formulas (3-1) to (3-4) shown below.

[Chemical Formula 64]

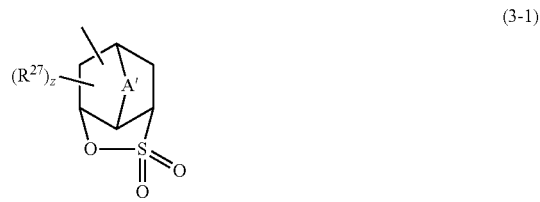

(3-1)

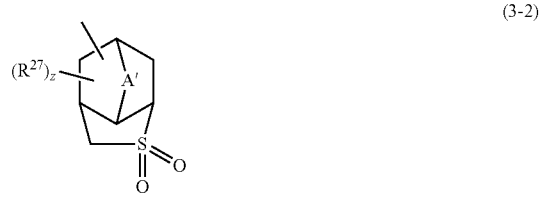

(3-2)

(3-3)

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In the above general formulas (3-1) to (3-4), A' represents an oxygen atom (—O—), a sulfur atom (—S—), or an alkylene group of 1 to 5 carbon atoms which may contain an oxygen atom or a sulfur atom.

The alkylene group of 1 to 5 carbon atoms represented by A' is preferably a linear or branched alkylene group, and specific examples include a methylene group, ethylene group, n-propylene group and isopropylene group.

Examples of alkylene groups that contain an oxygen atom or a sulfur atom include the aforementioned alkylene groups in which —O— or —S— is either bonded to the terminal of the alkylene group or interposed between carbon atoms of the alkylene group. Specific examples of such alkylene groups include —O—CH₂—, —CH₂—O—CH₂—, —S—CH₂— and —CH₂—S—CH₂—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^{27}$ groups may be the same or different.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above as the substituent for the —$SO_2$-containing cyclic group.

Specific examples of the cyclic groups represented by general formulas (3-1) to (3-4) are shown below. In the formulas shown below, "Ac" represents an acetyl group.

[Chemical Formula 65]

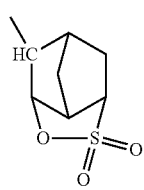

(3-1-1)

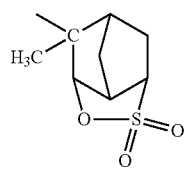

(3-1-2)

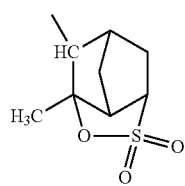

(3-1-3)

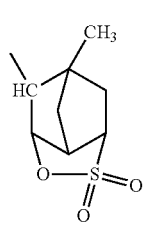

(3-1-4)

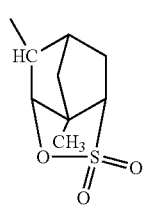

(3-1-5)

-continued

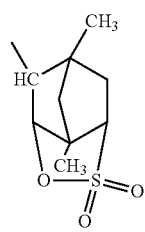

(3-1-6)

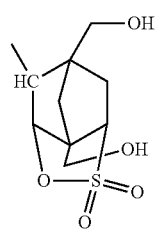

(3-1-7)

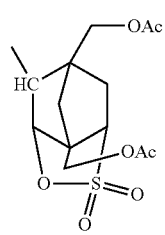

(3-1-8)

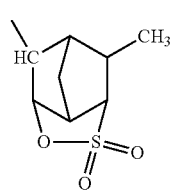

(3-1-9)

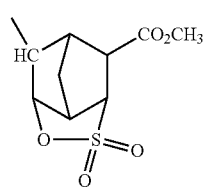

(3-1-10)

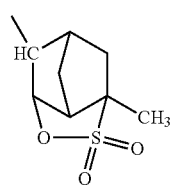

(3-1-11)

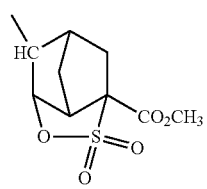

(3-1-12)

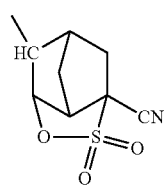

(3-1-13)

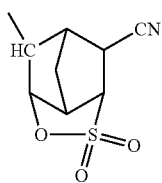 (3-1-14)
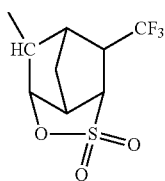 (3-1-15)
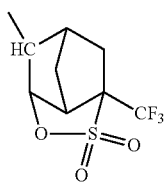 (3-1-16)
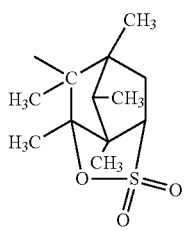 (3-1-17)
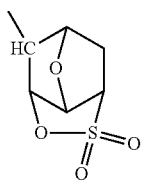 (3-1-18)
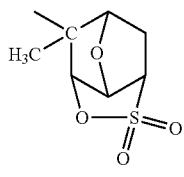 (3-1-19)
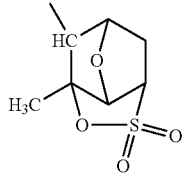 (3-1-20)
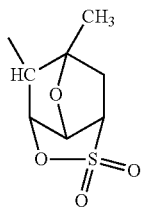 (3-1-21)
[Chemical Formula 66]
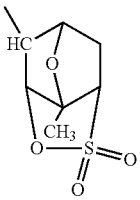 (3-1-22)
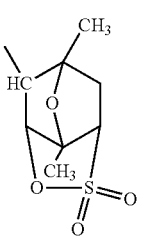 (3-1-23)
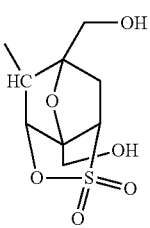 (3-1-24)
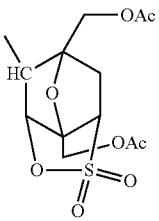 (3-1-25)
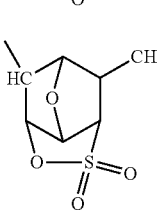 (3-1-26)
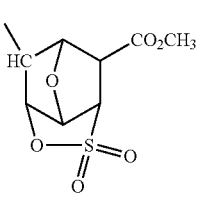 (3-1-27)
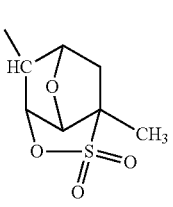 (3-1-28)

-continued (3-1-29) 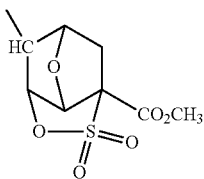

(3-1-30) 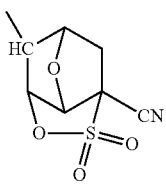

(3-1-31) 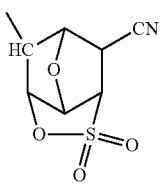

(3-1-32) 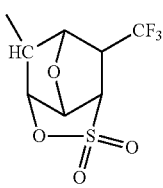

(3-1-33) 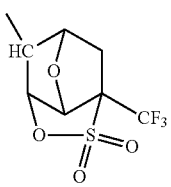

[Chemical Formula 67]

(3-2-1) 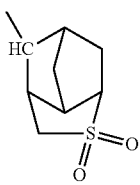

(3-2-2) 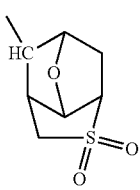

(3-3-1) 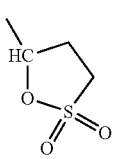

(3-4-1) 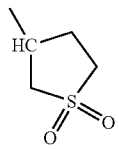

Of the groups shown above, the —SO$_2$-containing cyclic group is preferably a group represented by the aforementioned general formula (3-1), more preferably at least one group selected from the group consisting of groups represented by the above chemical formulas (3-1-1), (3-1-18), (3-3-1) and (3-4-1), and most preferably a group represented by the above chemical formula (3-1-1).

The term "lactone-containing cyclic group" refers to a cyclic group including a ring (lactone ring) containing —O—C(=O)— within the ring structure. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be monocyclic or polycyclic.

There are no particular limitations on the lactone-containing cyclic group in the structural unit (a2), and any arbitrary structural unit may be used. Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a bicycloalkane, tricycloalkane or tetracycloalkane that contains a lactone ring.

Provided the structural unit (a2) contains an —SO$_2$-containing cyclic group or a lactone-containing cyclic group, there are no particular limitations on the other portions of the structural unit, but the structural unit (a2) is preferably at least one structural unit selected from the group consisting of a structural unit (a2$^S$) derived from an acrylate ester in which the hydrogen atom bonded to the carbon atom on the α-position may be substituted with a substituent and containing an —SO$_2$-containing cyclic group, and a structural unit (a2$^L$) derived from an acrylate ester in which the hydrogen atom bonded to the carbon atom on the α-position may be substituted with a substituent and containing a lactone-containing cyclic group.

—Structural Unit (a2$^S$):

Specific examples of the structural unit (a2$^S$) include structural units represented by general formula (a2-0) shown below.

[Chemical Formula 68]

(a2-0)

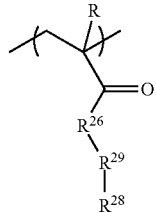

In the formula, R represents a hydrogen atom, an alkyl group of 1 to 5 carbon atoms or a halogenated alkyl group of 1 to 5 carbon atoms, $R^{26}$ represents —O— or —NH—, $R^{28}$ represents an —$SO_2$-containing cyclic group, and $R^{29}$ represents a single bond or a divalent linking group.

In formula (a2-0), R is the same as defined above.

$R^{26}$ represents —O— or —NH—.

$R^{28}$ is the same as the —$SO_2$-containing cyclic group described above.

$R^{29}$ may be either a single bond or a divalent linking group. A divalent linking group is preferable in terms of achieving superior effects for the present invention.

There are no particular limitations on the divalent linking group for $R^{29}$, and examples include the same groups as those mentioned above for the divalent linking group for $R^2$ in formula (a5-0). Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above for the aliphatic hydrocarbon group for $R^2$ in formula (a5-0).

The divalent linking group containing an ester linkage is preferably a group represented by general formula: —$R^{30}$—C(=O)—O—(wherein $R^{30}$ represents a divalent linking group). In other words, the structural unit (a2$^S$) is preferably a structural unit represented by general formula (a2-O-1) shown below.

[Chemical Formula 69]

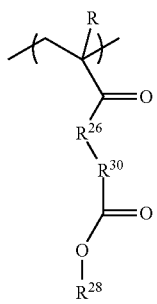

(a2-0-1)

In the formula, R, $R^{26}$ and $R^{28}$ are each the same as defined above, and $R^{30}$ represents a divalent linking group.

There are no particular limitations on $R^{30}$, and examples include the same groups as the divalent linking groups mentioned above for $R^2$ in formula (a5-0).

The divalent linking group for $R^{30}$ is preferably a linear or branched alkylene group, an aliphatic hydrocarbon group that includes a ring within the structure, or a divalent linking group containing a hetero atom, and is more preferably a linear or branched alkylene group, or a divalent linking group containing an oxygen atom as a hetero atom.

As the linear alkylene group, a methylene group or ethylene group is preferred, and a methylene group is particularly desirable.

As the branched alkylene group, an alkylmethylene group or alkylethylene group is preferred, and —CH($CH_3$)—, —C($CH_3$)$_2$— and —C($CH_3$)$_2$$CH_2$— are particularly desirable.

As the divalent linking group containing an oxygen atom, divalent linking groups containing an ether linkage or an ester linkage are preferred, and groups represented by the aforementioned formulas —$Y^{21}$—O—$Y^{22}$—, —[$Y^{21}$—C(=O)—O]$_{m'}$—$Y^{22}$— or —$Y^{21}$—O—C(=O)—$Y^{22}$— are more preferred. Each of $Y^{21}$ and $Y^{22}$ independently represents a divalent hydrocarbon group which may have a substituent, and m' represents an integer of 0 to 3. Among these groups, a group represented by —$Y^{21}$—O—C(=O)—$Y^{22}$— is preferable, and a group represented by —($CH_2$)$_c$—O—C(=O)—($CH_2$)$_d$— is particularly desirable. c represents an integer of 1 to 5, and is preferably 1 or 2. d represents an integer of 1 to 5, and is preferably 1 or 2.

As the structural unit (a2$^S$), a structural unit represented by general formula (a2-O-11) or (a2-0-12) shown below is preferred, and a structural unit represented by formula (a2-0-12) is particularly desirable.

[Chemical Formula 70]

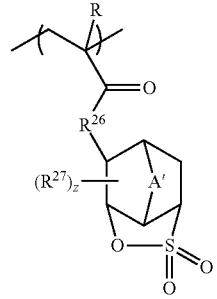

(a2-0-11)

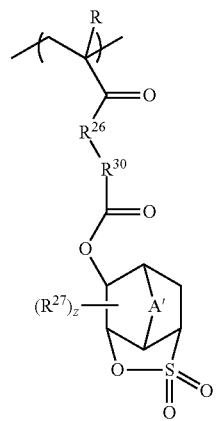

(a2-0-12)

In the formulas, R, A', $R^{26}$, $R^{27}$, z and $R^{30}$ are each the same as defined above.

In formula (a2-0-11), A' is preferably a methylene group, an oxygen atom (—O—) or a sulfur atom (—S—).

$R^{30}$ is preferably a linear or branched alkylene group, or a divalent linking group containing an oxygen atom. Examples of the linear or branched alkylene group and the divalent linking group containing an oxygen atom for $R^{30}$ include the same linear or branched alkylene groups and divalent linking groups containing an oxygen described above.

As the structural unit represented by formula (a2-0-12), a structural unit represented by general formula (a2-0-12a) or (a2-0-12b) shown below is particularly desirable.

[Chemical Formula 71]

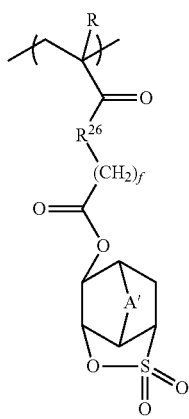
(a2-0-12a)

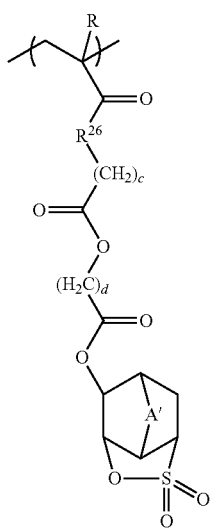
(a2-0-12b)

In the formulas, R, $R^{26}$ and A' are each the same as defined above, and each of c, d and f independently represents an integer of 1 to 3.

—Structural Unit ($a2^L$):

Examples of the structural unit ($a2^L$) include structural units of the above general formula (a2-0) in which $R^{28}$ has been substituted with a lactone-containing cyclic group, and more specific examples include structural units represented by general formulas (a2-1) to (a2-5) shown below.

[Chemical Formula 72]

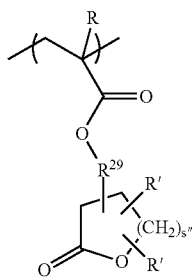
(a2-1)

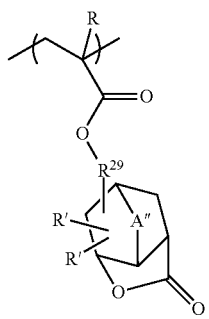
(a2-2)

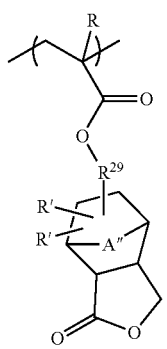
(a2-3)

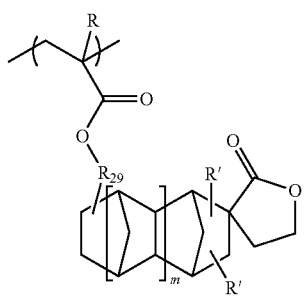
(a2-4)

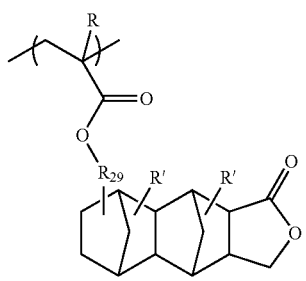
(a2-5)

In the formulas, R represents a hydrogen atom, an alkyl group of 1 to 5 carbon atoms or a halogenated alkyl group of 1 to 5 carbon atoms, each $R^1$ independently represents a hydrogen atom, alkyl group, alkoxy group, halogenated alkyl group, hydroxyl group, —COOR", —OC(=O)R", hydroxyalkyl group or cyano group, wherein R" represents a hydrogen atom or an alkyl group, $R^{29}$ represents a single bond or a divalent linking group, s" represents an integer of 0 to 2, A⁻ represents an oxygen atom, a sulfur atom or an alkylene group of 1 to 5 carbon atoms which may contain an oxygen atom or a sulfur atom, and m represents 0 or 1.

In general formulas (a2-1) to (a2-5), R is the same as defined above.

Examples of the alkyl group, alkoxy group, halogenated alkyl group, —COOR", —OC(=O)R" and hydroxyalkyl group for R' include the same alkyl groups, alkoxy groups, halogenated alkyl groups, —COOR" groups, —OC(=O)R" groups and hydroxyalkyl groups as those mentioned above for the substituent of the —SO$_2$-containing cyclic group.

In terms of factors such as industrial availability, R' is preferably a hydrogen atom.

The alkyl group for R" may be a linear, branched or cyclic alkyl group.

When R" is a linear or branched alkyl group, the alkyl group preferably contains 1 to 10 carbon atoms, and more preferably 1 to 5 carbon atoms.

When R" is a cyclic alkyl group, the cycloalkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, or from a polycycloalkane such as adamantane, norbornane, isobornane, tricyclodecane or tetracyclododecane.

Examples of A" include the same groups as those described above for A' in general formula (3-1). A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or dimethylmethylene group is preferable, and a methylene group is the most desirable.

$R^{29}$ is the same as defined above for $R^{29}$ in general formula (a2-0).

In formula (a2-1), s" is preferably 1 or 2.

Specific examples of the structural units represented by general formulas (a2-1) to (a2-5) are shown below. In each of the following formulas, $R^\alpha$ represents a hydrogen atom, a methyl group or a trifluoromethyl group.

[Chemical Formula 73]

(a2-1-1)

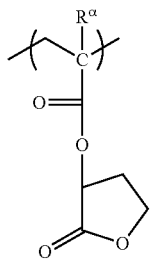

(a2-1-2)

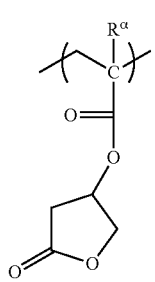

-continued (a2-1-3)

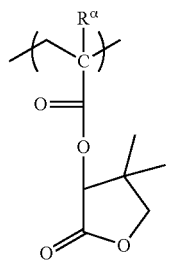

(a2-1-4)

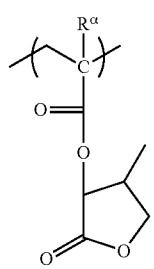

(a2-1-5)

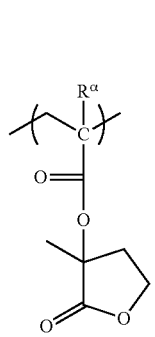

(a2-1-6)

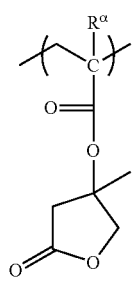

(a2-1-7)

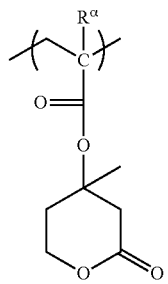

(a2-1-8)
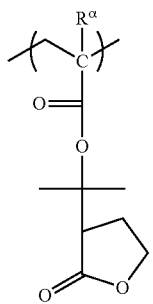
(a2-1-9)
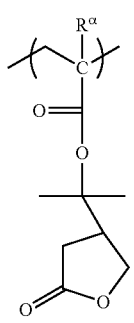
(a2-1-10)
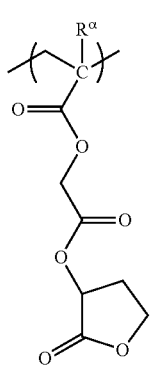
(a2-1-11)
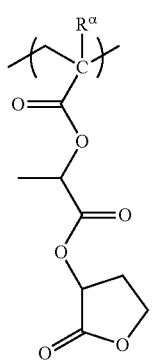
(a2-1-12)
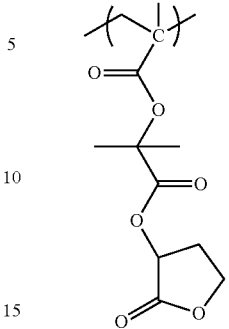
(a2-1-13)
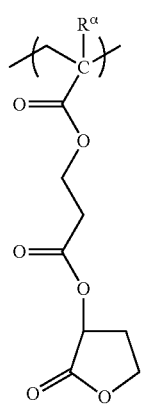
[Chemical Formula 74]
(a2-2-1)
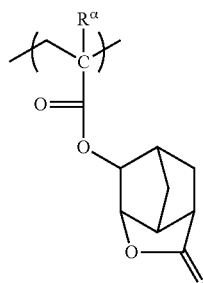
(a2-2-2)
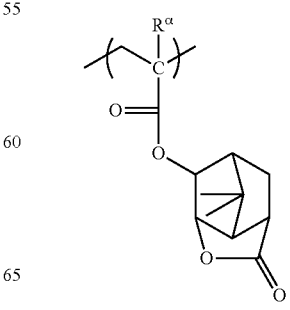

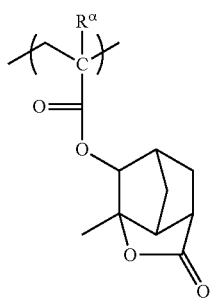 (a2-2-3)
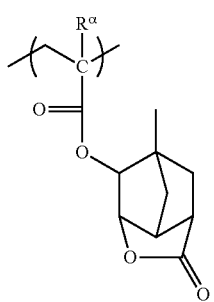 (a2-2-4)
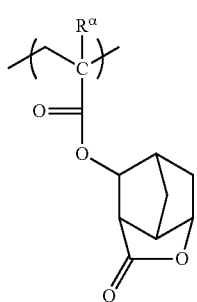 (a2-2-5)
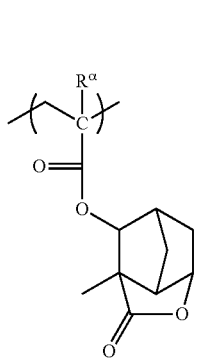 (a2-2-6)
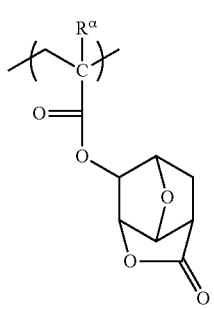 (a2-2-7)
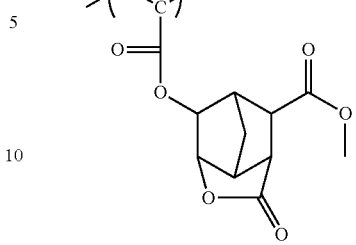 (a2-2-8)
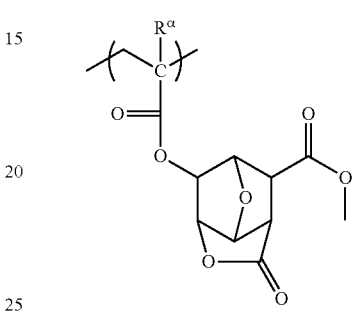 (a2-2-9)
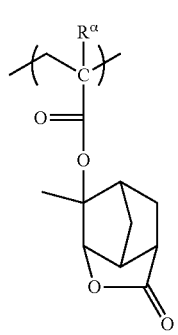 (a2-2-10)
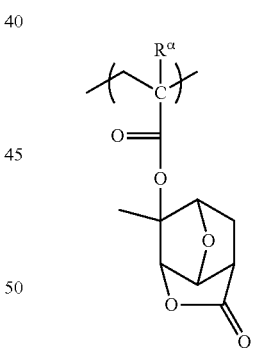 (a2-2-11)
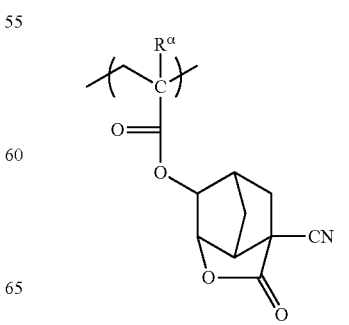 (a2-2-12)

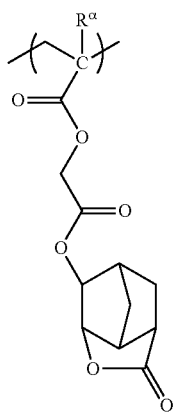 (a2-2-13)
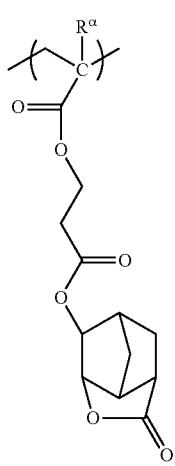 (a2-2-14)
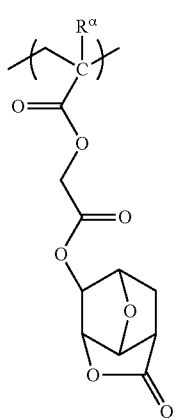 (a2-2-15)
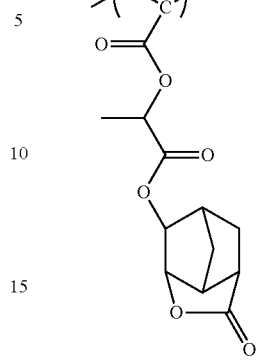 (a2-2-16)
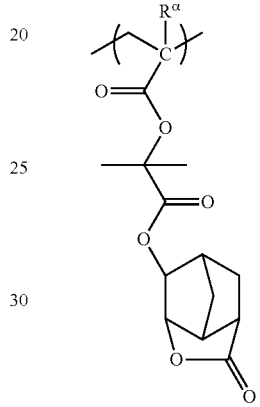 (a2-2-17)
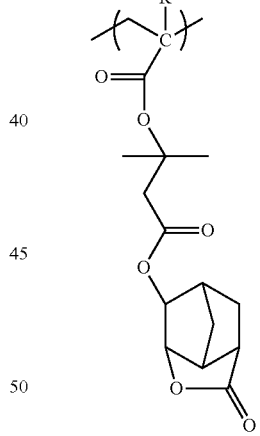 (a2-2-18)
[Chemical Formula 75]
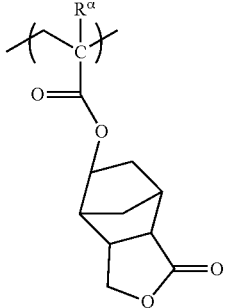 (a2-3-1)

(a2-3-2)
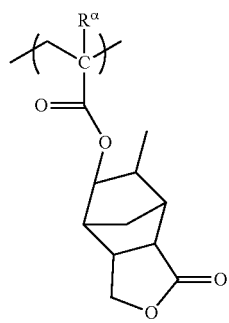
(a2-3-3)
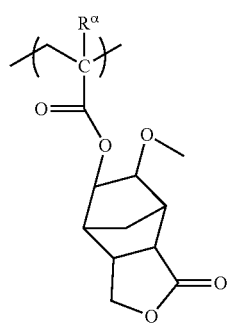
(a2-3-4)
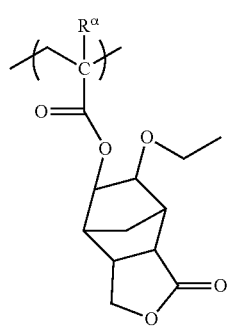
(a2-3-5)
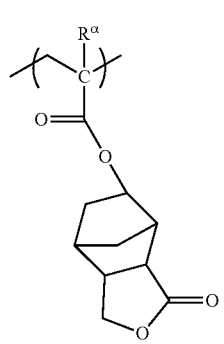
[Chemical Formula 76]
(a2-4-1)
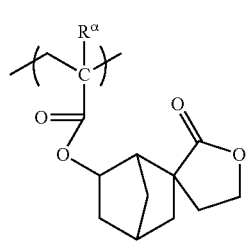
(a2-4-2)
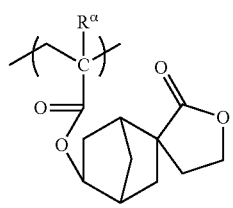
(a2-4-3)
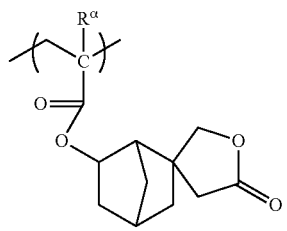
(a2-4-4)
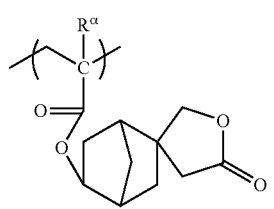
(a2-4-5)
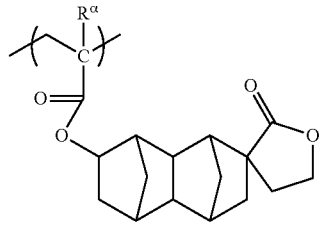
(a2-4-6)
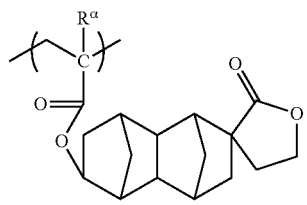
(a2-4-7)
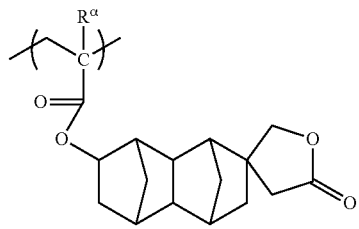
(a2-4-8)
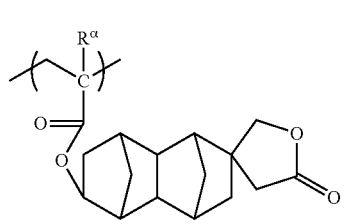

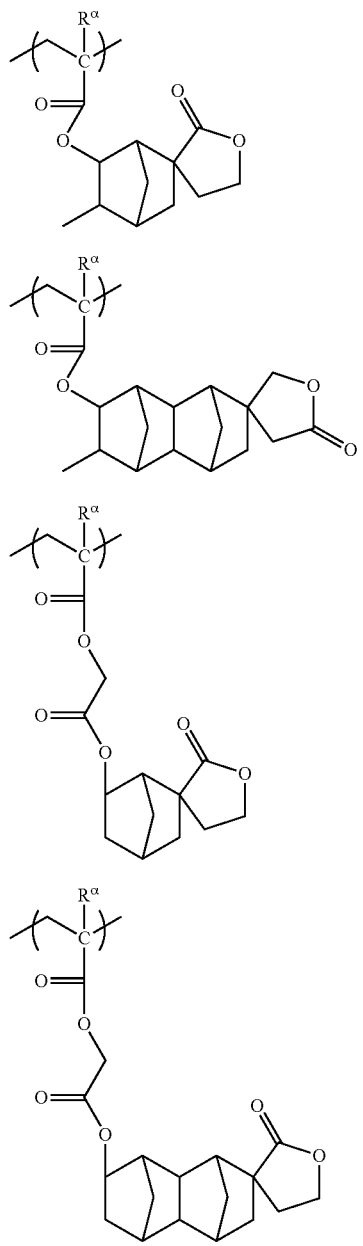
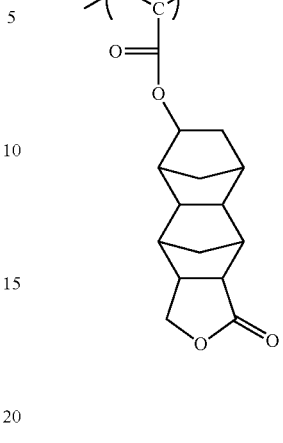
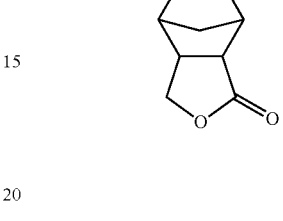
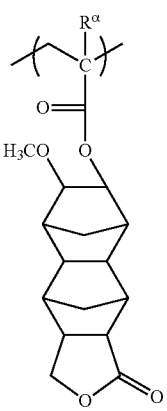
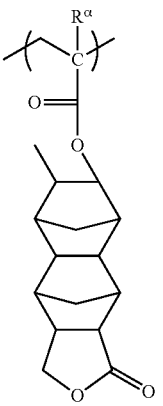
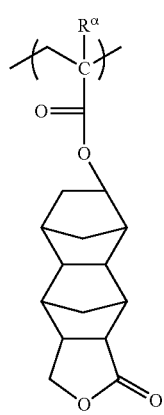

-continued (a2-5-5)
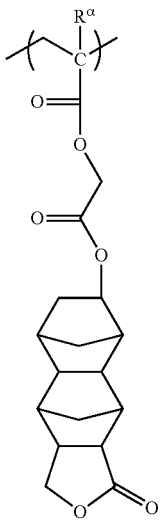

(a2-5-6)
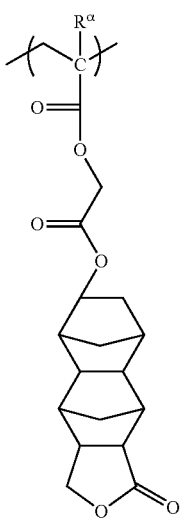

The structural unit (a2$^L$) is preferably at least one structural unit selected from the group consisting of structural units represented by general formulas (a2-1) to (a2-5), is more preferably at least one structural unit selected from the group consisting of structural units represented by general formulas (a2-1) to (a2-3), and is still more preferably at least one structural unit selected from the group consisting of structural units represented by general formulas (a2-1) and (a2-3).

Among these structural units, the structural unit (a2$^L$) is most preferably at least one structural unit selected from the group consisting of structural units represented by the above formulas (a2-1-1), (a2-1-2), (a2-2-1), (a2-2-7), (a2-2-12), (a2-2-13), (a2-2-15), (a2-3-1) and (a2-3-5).

Further, structural units represented by general formulas (a2-6) and (a2-7) shown below are also preferred as the structural unit (a2$^L$).

[Chemical Formula 78]

(a2-6)
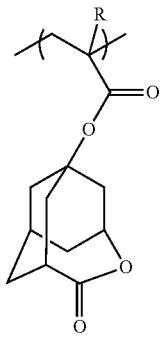

(a2-7)
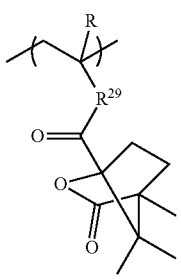

In the formulas, R and R$^{29}$ are the same as defined above.

In those cases where the component (A1-1) includes the structural unit (a2), the structural unit (a2) may be a single type of structural unit, or a combination of two or more types. For example, as the structural unit (a2), the structural unit (a2$^S$) may be used alone, the structural unit (a2$^L$) may be used alone, or the structural units (a2$^S$) and (a2$^L$) may be used in combination. Further, as the structural unit (a2$^S$) or the structural unit (a2$^L$), one type of structural unit may be used alone, or a combination of two or more types of structural units may be used.

The amount of the structural unit (a2) within the component (A1-1), based on the combined total of all the structural units that constitute the component (A1-1), is preferably within a range from 1 to 80 mol %, more preferably from 10 to 70 mol %, still more preferably from 10 to 65 mol %, and most preferably from 10 to 60 mol %.

When the amount of the structural unit (a2) is at least as large as the lower limit of the above range, the effects achieved be including the structural unit (a2) can be satisfactorily achieved. On the other hand, when the amount of the structural unit (a2) is not more than the upper limit of the above range, a good balance can be achieved with the other structural units, and various lithography properties and the pattern shape can be improved.

—Other Structural Units

Depending on the intended application, the component (A1-1) may include other structural units besides the structural units (a5), (a6), (a1) and (a2) described above, provided these other structural units do not impair the effects of the present invention.

There are no particular limitations on these other structural units, provided they cannot be classified as any of the structural units described above, and any of the multitude of conventional structural units used within resist resins for ArF excimer lasers or KrF excimer lasers (and particularly for ArF excimer lasers) can be used.

Examples of these other structural units include a structural unit (a3) containing a polar group, and a structural unit (a4) derived from an acrylate ester in which the hydrogen atom bonded to the carbon atom on the α-position may be substituted with a substituent, and containing a non-acid-dissociable aliphatic polycyclic group.

—Structural Unit (a3):

In the present invention, the structural unit (a3) is a structural unit containing a polar group.

By including the structural unit (a3) in the component (A1-1), the polarity of the component (A1-1) following exposure can be further increased. Increasing the polarity of the component (A1-1) that functions as the base resin contributes to improvements in the resolution and the like, particularly in those cases where an alkali developing process is used.

Examples of the polar group include —OH, —COOH, —CN, —SO$_2$NH$_2$ and —CONH$_2$. Structural units containing —COOH include (α-substituted) acrylic acids.

The structural unit (a3) is preferably a structural unit containing a hydrocarbon group in which a portion of the hydrogen atoms have been substituted with the polar group. The (divalent) hydrocarbon group that bonds the structure containing the main chain to the polar group may be either an aliphatic hydrocarbon group or an aromatic hydrocarbon group. The hydrocarbon group is preferably an aliphatic hydrocarbon group.

Examples of the aliphatic hydrocarbon group for this hydrocarbon group include linear or branched hydrocarbon groups (and preferably alkylene groups) of 1 to 10 carbon atoms, and aliphatic cyclic groups (monocyclic groups or polycyclic groups).

As the aliphatic cyclic group (monocyclic group or polycyclic group), any of the multitude of groups proposed for resins used in resist compositions designed for use with an ArF excimer laser can be selected as appropriate. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which two or more hydrogen atoms have been removed from a monocycloalkane, and groups in which two or more hydrogen atoms have been removed from a polycycloalkane such as a bicycloalkane, tricycloalkane or tetracycloalkane. Specific examples of such groups include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane. The aliphatic cyclic group may or may not have a substituent. Examples of the substituent include an alkyl group of 1 to 5 carbon atoms, a fluorine atom, and a fluorinated alkyl group of 1 to 5 carbon atoms.

The aromatic hydrocarbon group for the above hydrocarbon group is an aromatic hydrocarbon containing at least one aromatic ring.

There are no particular limitations on the aromatic ring, provided it is a cyclic conjugated system having 4n+2 (wherein n represents 0 or a natural number) in electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the above hydrocarbon group include groups in which two hydrogen atoms have been removed from an aromatic hydrocarbon ring or an aromatic heterocyclic ring (namely, arylene groups or heteroarylene groups), groups in which two hydrogen atoms have been removed from an aromatic compound having two or more aromatic rings (such as biphenyl or fluorene), and groups in which one further hydrogen atom has been removed from the aromatic ring of a group in which one of the hydrogen atoms of an aforementioned aromatic ring has been substituted with an alkylene group (for example, an arylalkyl group or heteroarylalkyl group such as a benzyl group, phenethyl group, 1-naphthylmethyl group, 2-naphthylmethyl group, 1-naphthylethyl group or 2-naphthylethyl group). The alkylene group that substitutes the hydrogen atom of the aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group may have a substituent. For example, a hydrogen atom bonded to the aromatic ring within the aromatic hydrocarbon group may be substituted with a substituent. Examples of this substituent include an alkyl group, alkoxy group, halogen atom, halogenated alkyl group, hydroxyl group and oxygen atom (=O).

The alkyl group as the substituent is preferably an alkyl group of 1 to 5 carbon atoms, and a methyl group, ethyl group, propyl group, n-butyl group or tert-butyl group is the most desirable.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent include groups in which part or all of the hydrogen atoms in an aforementioned alkyl group have each been substituted with an aforementioned halogen atom.

The structural unit (a3) is preferably a structural unit represented by general formula (a3-1) shown below.

[Chemical Formula 79]

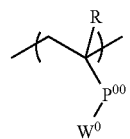

(a3-1)

In the formula, R represents a hydrogen atom, an alkyl group of 1 to 5 carbon atoms or a halogenated alkyl group of 1 to 5 carbon atoms, and P$^{00}$ represents —C(=O)—O—, —C(=O)—NR$^0$ (wherein R$^0$ represents a hydrogen atom or an alkyl group of 1 to 5 carbon atoms) or a single bond. W$^0$ represents a hydrocarbon group having at least one group selected from the group consisting of —OH, —COOH, —CN, —SO$_2$NH$_2$ and —CONH$_2$ as a substituent, or —COOH, wherein the hydrocarbon group may have an oxygen atom or a sulfur atom in an arbitrary position, and may be substituted with a halogen atom.

In formula (a3-1), the alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which part or all of the hydrogen atoms of an aforementioned alkyl group for R have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a3-1), $P^{00}$ represents —C(=O)—O—, —C(=O)—NR$^0$— (wherein R$^0$ represents a hydrogen atom or an alkyl group of 1 to 5 carbon atoms) or a single bond. The alkyl group for R$^0$ is the same as defined above for the alkyl group for R.

In formula (a3-1), W$^0$ represents a hydrocarbon group having at least one group selected from the group consisting of —OH, —COOH, —CN, —SO$_2$NH$_2$ and —CONH$_2$ as a substituent, or —COOH, wherein the hydrocarbon group may have an oxygen atom or a sulfur atom in an arbitrary position, and may be substituted with a halogen atom.

The hydrocarbon having a substituent describes a group in which at least part of the hydrogen atoms bonded to the hydrocarbon group have been substituted with a substituent.

The hydrocarbon group for W$^0$ may be an aliphatic hydrocarbon group or an aromatic hydrocarbon group.

Preferred examples of the aliphatic hydrocarbon group for W$^0$ include a linear or branched hydrocarbon group (and preferably an alkylene group) of 1 to 10 carbon atoms, and an aliphatic cyclic group (monocyclic group or polycyclic group), and these groups are as described above.

The aromatic hydrocarbon group for W$^0$ is a hydrocarbon group having at least one aromatic ring, and is the same as described above.

However, W$^0$ may have an oxygen atom or a sulfur atom in an arbitrary position. This expression that the hydrocarbon group "may have an oxygen atom or a sulfur atom in an arbitrary position" means that either a portion of the carbon atoms that constitute the hydrocarbon group or the hydrocarbon group having a substituent (including the carbon atoms in the substituent portion) may be substituted with an oxygen atom or a sulfur atom, or that one or more hydrogen atoms bonded to the hydrocarbon group may be substituted with an oxygen atom or a sulfur atom.

Further, in the hydrocarbon group for W$^0$, a hydrogen atom bonded to the hydrocarbon group may be substituted with a halogen atom. Examples of the halogen atom include a fluorine atom, chlorine atom, bromine atom and iodine atom, and a fluorine atom is particularly desirable.

Examples of W$^0$ groups having an oxygen atom (O) in an arbitrary position are shown below.

[Chemical Formula 80]

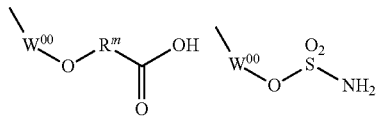
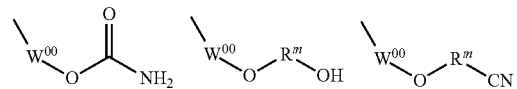

In the formulas, W$^{00}$ represents a hydrocarbon group, and R$^m$ represents an alkylene group of 1 to 5 carbon atoms.

In the above formulas, W$^{00}$ represents a hydrocarbon group, and examples include the same groups as those mentioned above for W$^0$ in formula (a3-1). W$^{00}$ is preferably an aliphatic hydrocarbon group, and more preferably an aliphatic cyclic group (monocyclic group or polycyclic group).

R$^m$ is preferably a linear or branched group, is more preferably an alkylene group of 1 to 3 carbon atoms, and is most preferably a methylene group or an ethylene group.

Among the various structural units (a3), specific examples of preferred structural units include structural units derived from an (α-substituted) acrylate ester, and structural units represented by any of general formulas (a3-11) to (a3-13) shown below.

An example of a structural unit derived from an (α-substituted) acrylate ester is a structural unit of the above formula (a3-1) in which $P^{00}$ represents a single bond and W$^0$ represents —COOH.

[Chemical Formula 81]

(a3-11)

(a3-12)

(a3-13)

In the formulas, R represents a hydrogen atom, an alkyl group of 1 to 5 carbon atoms or a halogenated alkyl group of 1 to 5 carbon atoms, W$^{01}$ represents an aromatic hydrocarbon group having at least one group selected from the group consisting of —OH, —COOH, —CN, —SO$_2$NH$_2$ and —CONH$_2$ as a substituent, each of P$^{02}$ and P$^{03}$ represents —C(=O)—O—, —C(=O)—NR$^0$— (wherein R$^0$ represents a hydrogen atom or an alkyl group of 1 to 5 carbon atoms) or a single bond, W$^{02}$ represents a cyclic hydrocarbon group having at least one group selected from the group consisting of —OH, —COOH, —CN, —SO$_2$NH$_2$ and —CONH$_2$ as a substituent, wherein the hydrocarbon group may have an oxygen atom or a sulfur atom in an arbitrary position, and W$^{03}$ represents a chain-like hydrocarbon group having at least one group selected from the group consisting of —OH, —COOH, —CN, —SO$_2$NH$_2$ and —CONH$_2$ as a substituent.

[Structural Unit Represented by General Formula (a3-11)]

In the above formula (a3-11), R is the same as defined above for R in formula (a3-1).

The aromatic hydrocarbon group for $W^{01}$ is the same as the aromatic hydrocarbon group described above for $W^0$ in formula (a3-1).

Specific examples of preferred structural units represented by general formula (a3-11) are shown below. In each of the following formulas, $R^\alpha$ represents a hydrogen atom, a methyl group, or a trifluoromethyl group.

[Chemical Formula 82]

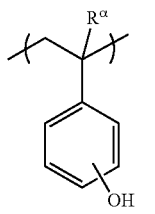

(a3-11-1)

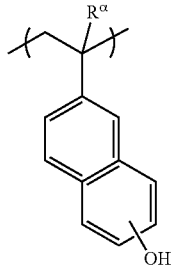

(a3-11-2)

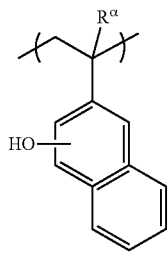

(a3-11-3)

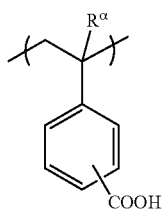

(a3-11-4)

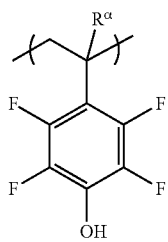

(a3-11-5)

[Structural Unit Represented by General Formula (a3-12)]

In the above formula (a3-12), R is the same as defined above for R in formula (a3-1).

$P^{02}$ represents —C(=O)—O— or —C(=O)—NR$^o$— (wherein R$^o$ represents a hydrogen atom or an alkyl group of 1 to 5 carbon atoms), and is preferably —C(=O)—O—. The alkyl group for R$^o$ is the same as defined above for the alkyl group for R.

Examples of the cyclic hydrocarbon group for $W^{02}$ include the same groups as those mentioned above for the aliphatic cyclic group (monocyclic group or polycyclic group) and the aromatic hydrocarbon group within the description for $W^0$ in the aforementioned formula (a3-1).

$W^{02}$ may have an oxygen atom or a sulfur atom in an arbitrary position, and this is the same as described above for $W^0$ in formula (a3-1).

Specific examples of preferred structural units represented by general formula (a3-12) are shown below. In each of the following formulas, $R^\alpha$ represents a hydrogen atom, a methyl group, or a trifluoromethyl group.

[Chemical Formula 83]

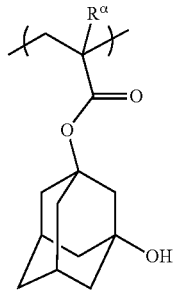

(a3-12-1)

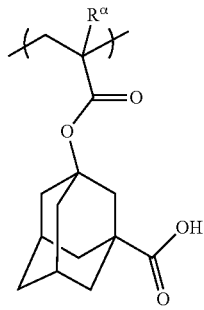

(a3-12-2)

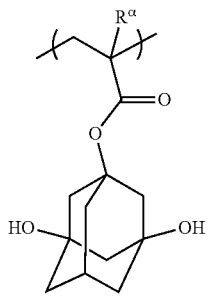

(a3-12-3)

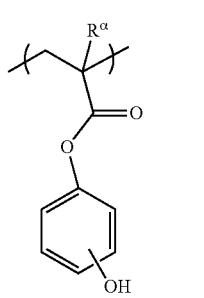

(a3-12-4)

(a3-12-5)
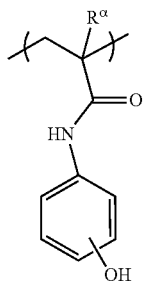
(a3-12-6)
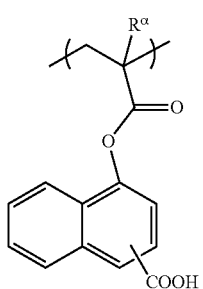
(a3-12-7)
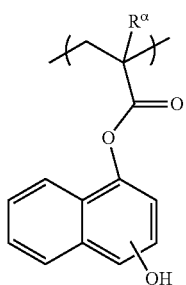
(a3-12-8)
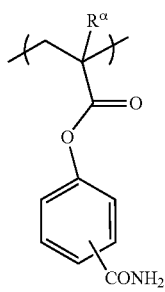
(a3-12-9)
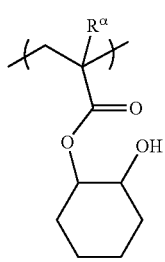
(a3-12-10)
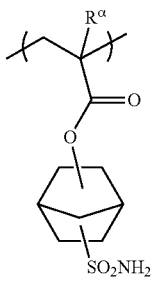
(a3-12-11)
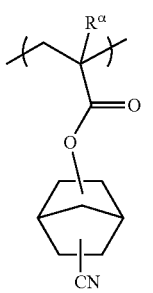
(a3-12-12)
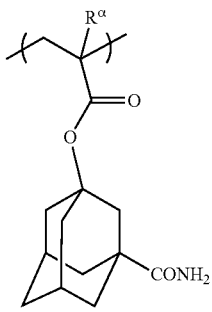
[Chemical Formula 84]
(a3-12-13)
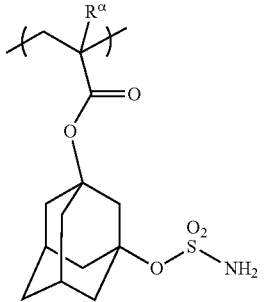
(a3-12-14)
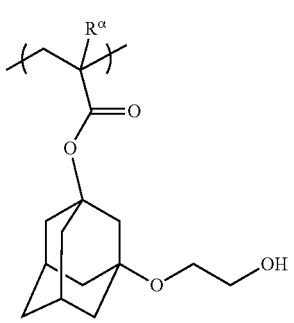

-continued (a3-12-15)

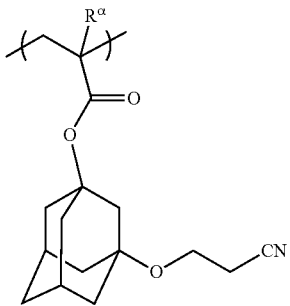

(a3-12-16)

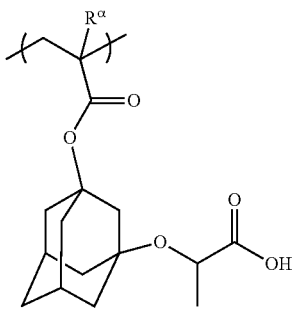

(a3-12-17)

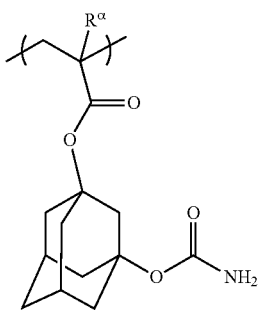

[Structural Unit Represented by General Formula (a3-13)]

In the above formula (a3-13), R is the same as defined above for R in formula (a3-1).

$P^{o3}$ represents —C(=O)—O— or —C(=O)—NR⁰— (wherein R⁰ represents a hydrogen atom or an alkyl group of 1 to 5 carbon atoms), and is preferably —C(=O)—O—. The alkyl group for R⁰ is the same as defined above for the alkyl group for R.

The chain-like hydrocarbon group for $W^{o3}$ preferably contains 1 to 10 carbon atoms, more preferably 1 to 5 carbon atoms, and still more preferably 1 to 3 carbon atoms.

The chain-like hydrocarbon group for $W^{o3}$ may also have a substituent (a) besides the —OH, —COOH, —CN, —SO$_2$NH$_2$ and/or —CONH$_2$ substituent. Examples of this substituent (a) include an alkyl group of 1 to 5 carbon atoms, an aliphatic cyclic group (monocyclic group or polycyclic group), a fluorine atom, and a fluorinated alkyl group of 1 to 5 carbon atoms. The aliphatic cyclic group (monocyclic group or polycyclic group) for the substituent (a) preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of such groups include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Further, the chain-like hydrocarbon group for $W^{o3}$ may have a plurality of substituents (a), as shown below for a structural unit represented by general formula (a3-13-a), and this plurality of substituents (a) may be bonded to each other to form a ring.

[Chemical Formula 85]

(a3-13-a)

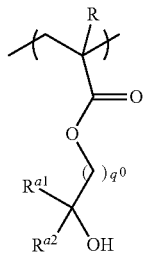

In the formula, R represents a hydrogen atom, an alkyl group of 1 to 5 carbon atoms or a halogenated alkyl group of 1 to 5 carbon atoms, and each of $R^{a1}$ and $R^{a2}$ independently represents an alkyl group of 1 to 5 carbon atoms, an aliphatic cyclic group (monocyclic group or polycyclic group), a fluorine atom or a fluorinated alkyl group of 1 to 5 carbon atoms. Further, $R^{a1}$ and $R^{a2}$ may be bonded to each other to form a ring. $q^o$ represents an integer of 1 to 4.

In formula (a3-13-a), R is the same as defined above for R in formula (a3-1).

The aliphatic cyclic group (monocyclic group or polycyclic group) for $R^{a1}$ and $R^{a2}$ is the same as the aliphatic cyclic group (monocyclic group or polycyclic group) described above for the substituent (a).

Further, $R^{a1}$ and $R^{a2}$ may be bonded to each other to form a ring. In this case, a cyclic group is formed from $R^{a1}$, $R^{a2}$, and the carbon atom to which both $R^{a1}$ and $R^{a2}$ are bonded. The thus formed cyclic group may be a monocyclic group or a polycyclic group, and specific examples include groups in which one or more hydrogen atoms have been removed from the types of monocycloalkanes and polycycloalkanes mentioned above within the description of the aliphatic cyclic group (monocyclic group or polycyclic group) for the aforementioned substituent (a).

$q^o$ is preferably 1 or 2, and is more preferably 1.

Specific examples of preferred structural units represented by general formula (a3-13) are shown below. In each of the following formulas, $R^\alpha$ represents a hydrogen atom, a methyl group, or a trifluoromethyl group.

[Chemical Formula 86]

(a3-13-1)

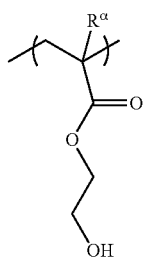

-continued (a3-13-2)
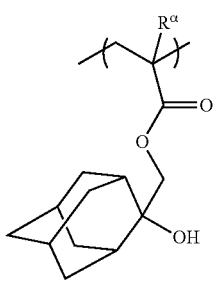

(a3-13-3)
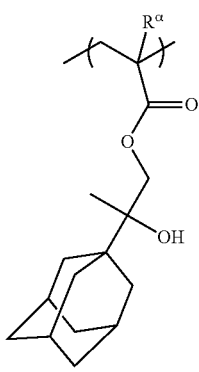

[Chemical Formula 87]

(a4-1)
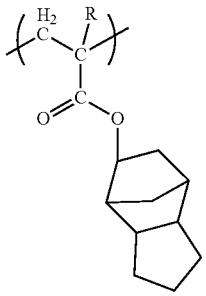

(a4-2)
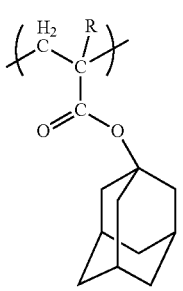

(a4-3)
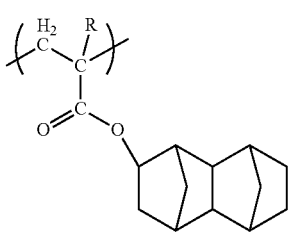

(a4-4)
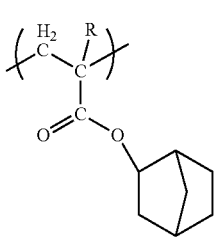

(a4-5)
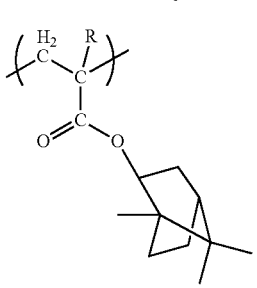

The structural unit (a3) in the component (A1-1) may be a single type of structural unit, or a combination of two or more types.

The amount of the structural unit (a3) within the component (A1-1), based on the combined total of all the structural units that constitute the component (A1-1), is preferably within a range from 5 to 50 mol %, more preferably from 5 to 40 mol %, and still more preferably from 5 to 25 mol %.

When the amount of the structural unit (a3) is at least as large as the lower limit of the above range, the effects achieved be including the structural unit (a3) (improved resolution, lithography properties and pattern shape) can be satisfactorily achieved. On the other hand, when the amount of the structural unit (a3) is not more than the upper limit of the above range, a good balance can be achieved with the other structural units.

—Structural Unit (a4):

In the present invention, the structural unit (a4) is a structural unit derived from an acrylate ester in which the hydrogen atom bonded to the carbon atom on the α-position may be substituted with a substituent, and containing a non-acid-dissociable aliphatic polycyclic group. By including the structural unit (a4), the lithography properties and etching resistance of the component (A1-1) can be improved.

In the structural unit (a4), examples of the polycyclic group include the same polycyclic groups as those mentioned above in connection with the structural unit (a1), and any of the multitude of conventional polycyclic groups used within the resin components of resist compositions designed for ArF excimer lasers or KrF excimer lasers (and preferably ArF excimer lasers) can be used.

In terms of industrial availability and the like, at least one polycyclic group selected from among a tricyclodecyl group, adamantyl group, tetracyclododecyl group, isobornyl group and norbornyl group is particularly desirable. These polycyclic groups may have a linear or branched alkyl group of 1 to 5 carbon atoms as a substituent.

Specific examples of the structural unit (a4) include structural units with structures represented by general formulas (a4-1) to (a4-5) shown below.

In the formulas, R is the same as defined above.

In those cases where the component (A1-1) includes the structural unit (a4), the structural unit (a4) may be a single type of structural unit, or a combination of two or more types.

When included in the component (A1-1), the amount of the structural unit (a4) based on the combined total of all the structural units that constitute the component (A1-1), is preferably within a range from 1 to 30 mol %, and more preferably from 10 to 20 mol %.

When the amount of the structural unit (a4) is at least as large as the lower limit of the above range, the effects achieved be including the structural unit (a4) can be satisfactorily achieved. On the other hand, when the amount of the structural unit (a4) is not more than the upper limit of the above range, a good balance can be achieved with the other structural units.

In the resist composition of the present invention, the component (A) includes the polymeric compound (A1) containing the structural unit (a5) and the structural unit (a6), and the component (A1) is preferably the polymeric compound (A1-1) which exhibits increased polarity under the action of acid.

Specific examples of the component (A1-1) include polymeric compounds composed of repeating structures of the structural unit (a5), the structural unit (a6) and the structural unit (a1), and polymeric compounds composed of repeating structures of the structural unit (a5), the structural unit (a6), the structural unit (a1) and the structural unit (a2).

More specific examples of preferred forms of the component (A1-1) include polymeric compounds composed of repeating structures of a structural unit represented by general formula (a5-2), a structural unit represented by general formula (a6-2-11), a structural unit represented by general formula (a1-0-12) and a structural unit represented by general formula (a2-0-12), polymeric compounds composed of repeating structures of a structural unit represented by general formula (a5-2), a structural unit represented by general formula (a6-2-13), a structural unit represented by general formula (a1-0-12) and a structural unit represented by general formula (a2-0-12), polymeric compounds composed of repeating structures of a structural unit represented by general formula (a5-2), a structural unit represented by general formula (a6-2-12), a structural unit represented by general formula (a1-0-12) and a structural unit represented by general formula (a2-0-12), polymeric compounds composed of repeating structures of a structural unit represented by general formula (a5-2), a structural unit represented by general formula (a6-11), a structural unit represented by general formula (a1-0-12) and a structural unit represented by general formula (a2-0-12), polymeric compounds composed of repeating structures of a structural unit represented by general formula (a5-1), a structural unit represented by general formula (a6-2-11), a structural unit represented by general formula (a1-0-12) and a structural unit represented by general formula (a2-0-12), and polymeric compounds composed of repeating structures of a structural unit represented by general formula (a5-2), a structural unit represented by general formula (a6-2-43), a structural unit represented by general formula (a1-0-12) and a structural unit represented by general formula (a2-0-12).

The weight-average molecular weight (Mw) (the polystyrene equivalent value determined by gel permeation chromatography (GPC)) of the component (A1-1) is not particularly limited, but is preferably within a range from 1,000 to 50,000, more preferably from 1,500 to 30,000, and most preferably from 2,000 to 20,000. When the weight-average molecular weight is not more than the upper limit of the above range, the polymeric compound (A1-1) exhibits satisfactory solubility in a resist solvent when used as a resist. On the other hand, when the weight-average molecular weight is at least as large as the lower limit of the above range, the dry etching resistance and the cross-sectional shape of the resist pattern are improved.

Further, although there are no particular limitations on the dispersity (Mw/Mn) of the component (A1-1), the dispersity is preferably from 1.0 to 5.0, more preferably from 1.0 to 3.0, and most preferably from 1.0 to 2.5. Here, Mn represents the number-average molecular weight.

The component (A1-1) can be obtained, for example, by a conventional radical polymerization or the like of the monomers that yield each of the structural units, using a radical polymerization initiator such as azobisisobutyronitrile (AIBN).

During the above polymerization, a chain transfer agent such as $HS-CH_2-CH_2-CH_2-C(CF_3)_2-OH$ may also be used to introduce a $-C(CF_3)_2-OH$ group at the terminals of the component (A1-1). This type of copolymer having an introduced hydroxyalkyl group in which part of the hydrogen atoms of the alkyl group have been substituted with fluorine atoms is effective in reducing developing defects and line edge roughness (LER: unevenness in the side walls of a line pattern).

As the monomers that yield each of the structural units, commercially available monomers may be used, or monomers that have been synthesized using conventional methods may be used.

In the component (A), a single component (A1) may be used alone, or a combination of two or more types of the component (A 1) may be used.

The amount of the component (A1) within the component (A), based on the total weight of the component (A), is preferably not less than 50% by weight, more preferably 75% by weight or greater, and may be 100% by weight.

Provided this amount is not less than 50% by weight, the effects of the invention in improving the sensitivity, the resolution and the lithography properties can be more readily achieved.

The component (A) may also include another base component (hereafter referred to as "component (A2)"), besides the component (A1), that exhibits changed solubility in a developing solution under the action of acid, provided the inclusion of the component (A2) does not impair the effects of the present invention. There are no particular limitations on the component (A2), and conventionally proposed resins and low molecular weight compounds can be used. Examples of resins that can be used as the component (A2) include polymeric compounds containing the structural unit (a6) and the structural unit (a1).

There are no particular limitations on the amount of the component (A) within the resist composition of the present invention, and the amount may be adjusted in accordance with factors such as the thickness of the resist film that is to be formed.

<Other Components>
[Component (D)]

The resist composition of the present invention may also include a basic compound (D) (hereafter referred to as "component (D)") as an optional component. The component (D) functions as an acid diffusion control agent, namely a quencher, which traps the acid generated from the component (A) and the component (B) described below upon exposure. In the present invention, the expression "basic compound" describes a compound that is relatively basic compared with the component (A) or the component (B).

The component (D) in the present invention may be a basic compound (D1) (hereafter referred to as "component (D1)") composed of a cation and an anion, or a basic compound (D2) (hereafter referred to as "component (D2)") that does not correspond with the above definition of the component (D1).

—Component (D1)

The component (D1) is preferably at least one compound selected from the group consisting of compounds (d1-1) represented by general formula (d1-1) shown below (hereafter referred to as "component (d1-1)"), compounds (d1-2) represented by general formula (d1-2) shown below (hereafter referred to as "component (d1-2)"), and compounds (d1-3) represented by general formula (d1-3) shown below (hereafter referred to as "component (d1-3)").

[Chemical Formula 88]

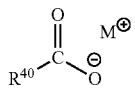  (d1-1)

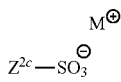  (d1-2)

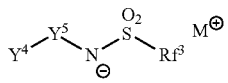  (d1-3)

In the formulas, $R^{40}$ represents a hydrocarbon group which may have a substituent, $Z^{2c}$ represents a hydrocarbon group of 1 to 30 carbon atoms which may have a substituent (but in which the carbon atom adjacent to S is not substituted with a fluorine atom), $Y^4$ represents an organic group, $Y^5$ represents a linear, branched or cyclic alkylene group or an arylene group, $Rf^3$ represents a hydrocarbon group containing a fluorine atom, and each $M^+$ independently represents a sulfonium or iodonium cation.

—Component (d1-1):
—Anion

In formula (d1-1), $R^{40}$ represents a hydrocarbon group which may have a substituent. The hydrocarbon group which may have a substituent for $R^{40}$ may be an aliphatic hydrocarbon group or an aromatic hydrocarbon group, and examples include the same groups as those described above for $X^3$ in the formula: $X^3$-Q'-, which was mentioned as a possible substituent for $R^{4\prime\prime\prime}$ in general formula $R^{4\prime\prime\prime}SO_3^-$ within the above description relating to the structural unit (a6).

Of the various possibilities, the hydrocarbon group which may have a substituent for $R^{40}$ is preferably an aromatic hydrocarbon group which may have a substituent or an aliphatic cyclic group which may have a substituent, and is more preferably a phenyl group or naphthyl group which may have a substituent, or a group in which one or more hydrogen atoms have been removed from a polycycloalkane such as adamantane, norbornane, isobornane, tricyclodecane or tetracyclododecane.

Furthermore, as the hydrocarbon group which may have a substituent for $R^{40}$, linear or branched alkyl groups and fluorinated alkyl groups are also desirable.

The linear or branched alkyl group for $R^{40}$ preferably contains 1 to 10 carbon atoms, and specific examples include linear alkyl groups such as a methyl group, ethyl group, propyl group, butyl group, pentyl group, hexyl group, heptyl group, octyl group, nonyl group and decyl group, and branched alkyl groups such as a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The fluorinated alkyl group for $R^{40}$ may be a chain-like group or a cyclic group, but is preferably a linear or branched group.

The fluorinated alkyl group preferably contains 1 to 11 carbon atoms, more preferably 1 to 8 carbon atoms, and still more preferably 1 to 4 carbon atoms. Specific examples include groups in which part or all of the hydrogen atoms of a linear alkyl group such as a methyl group, ethyl group, propyl group, butyl group, pentyl group, hexyl group, heptyl group, octyl group, nonyl group or decyl group have each been substituted with a fluorine atom, and groups in which part or all of the hydrogen atoms of a branched alkyl group such as a 1-methylethyl group, 1-methylpropyl group, 2-methylpropyl group, 1-methylbutyl group, 2-methylbutyl group or 3-methylbutyl group have each been substituted with a fluorine atom.

Further, the fluorinated alkyl group for $R^{40}$ may also include other atoms besides the fluorine atom(s). Examples of these other atoms besides the fluorine atom include an oxygen atom, carbon atom, hydrogen atom, sulfur atom and nitrogen atom.

Among the various possibilities, the fluorinated alkyl group for $R^{40}$ is preferably a group in which part or all of the hydrogen atoms of a linear alkyl group have each been substituted with a fluorine atom, and is more preferably a group in which all of the hydrogen atoms of a linear alkyl group have been substituted with fluorine atoms (namely, a perfluoroalkyl group).

Specific examples of preferred anions for the component (d1-1) are shown below.

[Chemical Formula 89]

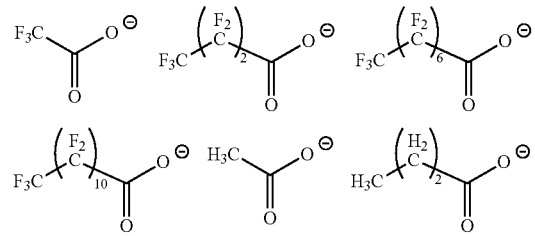

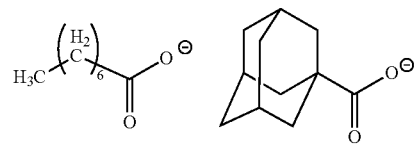

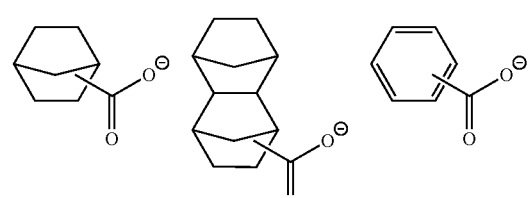

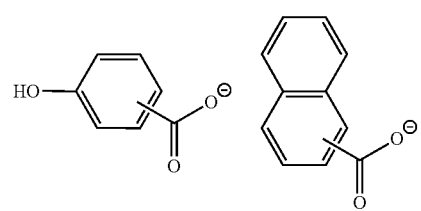

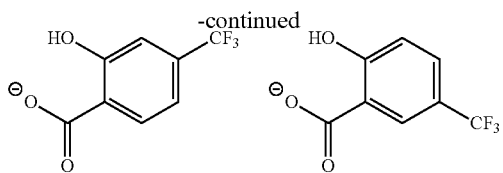
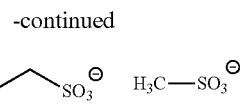

—Cation

In formula (d1-1), $M^{m+}$ represents an organic cation.

There are no particular limitations on the organic cation for $M^{m+}$, and examples include the same cations as those mentioned above for the compound represented by formula (m1-1) or (m2-1).

A single type of the component (d1-1) may be used alone, or a combination of two or more types may be used.

—Component (d1-2)

—Anion

In formula (d1-2), $Z^{2c}$ represents a hydrocarbon group of 1 to 30 carbon atoms which may have a substituent.

The hydrocarbon group of 1 to 30 carbon atoms which may have a substituent for $Z^{2c}$ may be an aliphatic hydrocarbon group or an aromatic hydrocarbon group, and examples include the same groups as those mentioned above for $R^{40}$ in formula (d1-1).

Of the various possibilities, the hydrocarbon group which may have a substituent for $Z^{2c}$ is preferably an aliphatic cyclic group which may have a substituent, and is more preferably a group (which may have a substituent) in which one or more hydrogen atoms have been removed from adamantane, norbornane, isobornane, tricyclodecane, tetracyclododecane or camphor or the like.

The hydrocarbon group for $Z^{2c}$ may have a substituent, and examples of the substituent include the same substituents as those mentioned above within the description for $X^3$ in the formula: $X^3$-Q'-. However, in $Z^{2c}$, the carbon atom adjacent to the S atom in $SO_3^-$ must not be substituted with a fluorine atom. By ensuring that $SO_3^-$ is not adjacent to a fluorine atom, the anion of the component (d1-2) becomes an appropriate weakly acidic anion, and the quenching action of the component (D) improves.

Specific examples of preferred anions for the component (d1-2) are shown below.

[Chemical Formula 90]

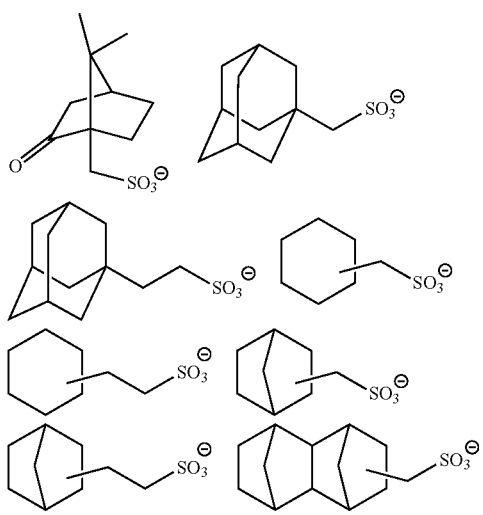
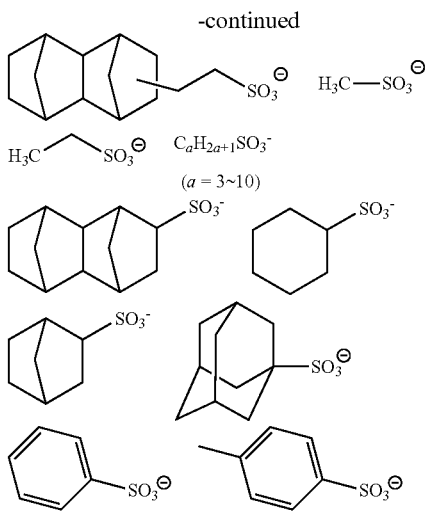

—Cation

In formula (d1-2), $M^+$ is the same as defined above for $M^+$ in formula (d1-1).

A single type of the component (d1-2) may be used alone, or a combination of two or more types may be used.

—Component (d1-3)

—Anion

In formula (d1-3), $Y^4$ represents an organic group.

There are no particular limitations on the organic group for $Y^4$, and examples include alkyl groups, alkoxy groups, $-O-C(=O)-C(R^{C2})=CH_2$ (wherein $R^{C2}$ represents a hydrogen atom, an alkyl group of 1 to 5 carbon atoms or a halogenated alkyl group of 1 to 5 carbon atoms) and $-O-C(=O)-R^{C3}$ (wherein $R^{C3}$ represents a hydrocarbon group).

The alkyl group for $Y^4$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. A portion of the hydrogen atoms within the alkyl group for $Y^4$ may each be substituted with a hydroxyl group or a cyano group or the like.

The alkoxy group for $Y^4$ is preferably an alkoxy group of 1 to 5 carbon atoms, and specific examples of such alkoxy groups include a methoxy group, ethoxy group, n-propoxy group, iso-propoxy group, n-butoxy group and tert-butoxy group. Among these, a methoxy group or an ethoxy group is the most desirable.

When $Y^4$ is $-O-C(=O)-C(R^{C2})=CH_2$, $R^{C2}$ represents a hydrogen atom, an alkyl group of 1 to 5 carbon atoms or a halogenated alkyl group of 1 to 5 carbon atoms.

The alkyl group of 1 to 5 carbon atoms for $R^{C2}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for $R^{C2}$ is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

As $R^{C2}$, a hydrogen atom, an alkyl group of 1 to 3 carbon atoms or a fluorinated alkyl group of 1 to 3 carbon atoms is preferable, and a hydrogen atom or a methyl group is the most desirable in terms of industrial availability.

When $Y^4$ is —O—C(=O)—$R^3$, $R^{C3}$ represents a hydrocarbon group.

The hydrocarbon group for $R^{C3}$ may be either an aromatic hydrocarbon group or an aliphatic hydrocarbon group. Specific examples of the hydrocarbon group for $R^{C3}$ include the same hydrocarbon groups as those described above for $R^{40}$ in formula (d1-1).

Among these, as the hydrocarbon group for $R^{C3}$, an alicyclic group in which one or more hydrogen atoms have been removed from a cycloalkane such as cyclopentane, cyclohexane, adamantane, norbornane, isobornane, tricyclodecane or tetracyclododecane, or an aromatic group such as a phenyl group or a naphthyl group is preferable. When $R^{C3}$ is an alicyclic group, the resist composition can be satisfactorily dissolved in an organic solvent, thereby improving the lithography properties. Alternatively, when $R^{C3}$ is an aromatic group, the resist composition exhibits excellent photoabsorption efficiency in a lithography process using EUV or the like as the exposure source, resulting in improvements in the sensitivity and the lithography properties.

Among the above possibilities, $Y^4$ is preferably a group represented by —O—C(=O)—C($R^{C2\prime}$)=CH$_2$ (wherein $R^{C2\prime}$ represents a hydrogen atom or a methyl group) or —O—C(=O)—$R^{C3\prime}$ (wherein $R^{C3\prime}$ represents an aliphatic cyclic group).

In formula (d1-3), $Y^5$ represents a linear, branched or cyclic alkylene group or an arylene group.

Examples of the linear, branched or cyclic alkylene group or the arylene group for $Y^5$ include the same groups as the "linear or branched aliphatic hydrocarbon group", "cyclic aliphatic hydrocarbon group" and "aromatic hydrocarbon group" mentioned above within the description of the divalent linking group for $R^2$ in the aforementioned formula (a5-0).

Among these groups, $Y^5$ is preferably an alkylene group, more preferably a linear or branched alkylene group, and most preferably a methylene group or an ethylene group.

In formula (d1-3), $Rf^3$ represents a hydrocarbon group containing a fluorine atom.

The hydrocarbon group containing a fluorine atom for $Rf^3$ is preferably a fluorinated alkyl group, and the same groups as those described above for the fluorinated alkyl group for $R^{40}$ are particularly desirable.

Specific examples of preferred anions for the component (d1-3) are shown below.

[Chemical Formula 91]

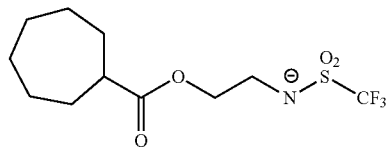
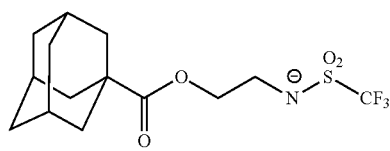
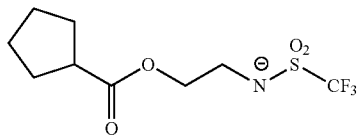
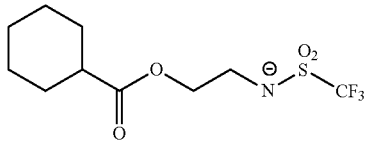
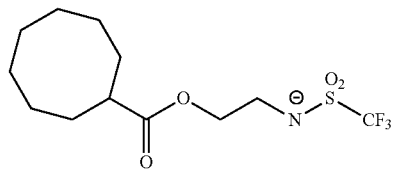
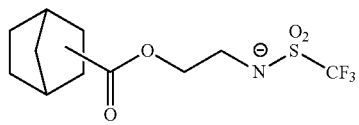
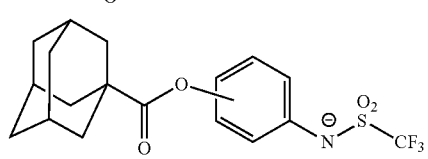
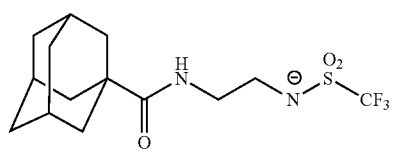
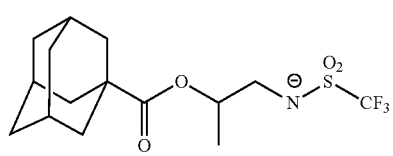
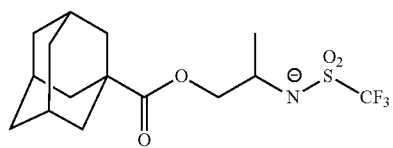
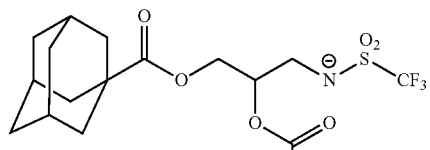
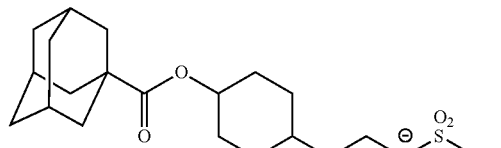
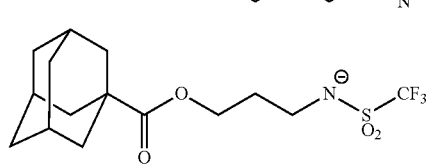

177
-continued

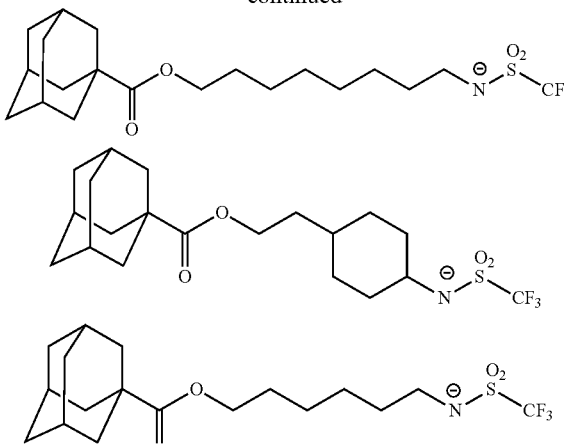

[Chemical Formula 92]

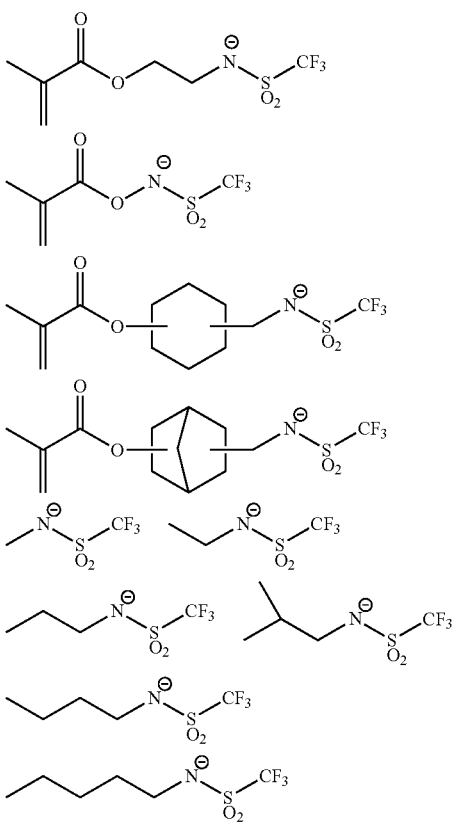

178
-continued

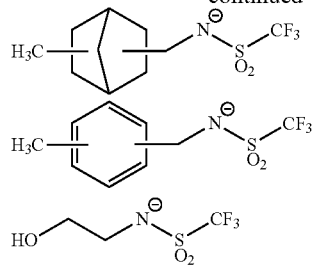

—Cation

In formula (d1-3), $M^+$ is the same as defined above for $M^+$ in formula (d1-1).

A single type of the component (d1-3) may be used alone, or a combination of two or more types may be used.

The component (D1) may contain only one of the above components (d1-1) to (d1-3), or may contain a combination of two or more of the components. The component (D1) preferably includes the component (d1-2).

The amount of the component (D1), relative to 100 parts by weight of the component (A), is preferably within a range from 0.5 to 10 parts by weight, more preferably from 0.5 to 8 parts by weight, still more preferably from 1 to 8 parts by weight, and most preferably from 1 to 5.5 parts by weight.

When the amount of the component (D1) is at least as large as the lower limit of the above range, favorable lithography properties and a superior resist pattern shape can be obtained. On the other hand, when the total amount of the component (D1) is not more than the upper limit of the above range, sensitivity can be favorably maintained, and throughput can be improved.

(Methods of Producing Components (d1-1) to (d 1-3))

In the present invention, there are no particular limitations on the methods used for producing the components (d1-1) and (d1-2), and conventional methods can be used.

Further, there are also no particular limitations on the production method for the component (d1-3). For example, in the case where $Y^4$ in the formula (d1-3) is a group having an oxygen atom at the terminal bonded to $Y^5$, a compound (i-1) represented by general formula (i-1) shown below can be reacted with a compound (i-2) represented by general formula (i-2) shown below to obtain a compound (i-3) represented by general formula (i-3) shown below, and the compound (i-3) can then be reacted with a compound $Z^-M^+$ (i-4) having the desired cation $M^+$, thereby producing a compound (d1-3) represented by general formula (d1-3).

[Chemical Formula 93]

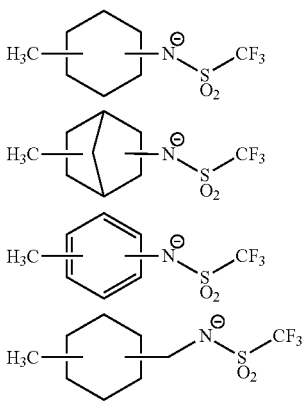

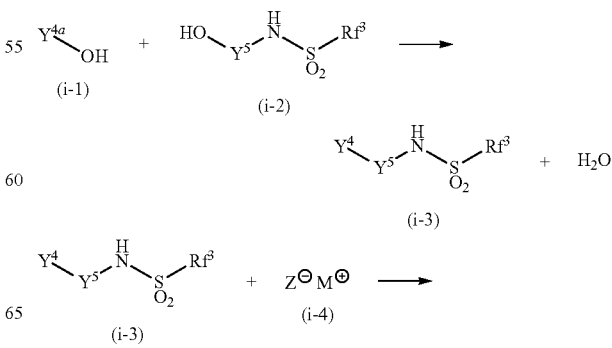

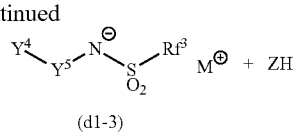

(d1-3)

In the above formulas, $Y^4$, $Y^5$, $Rf^3$ and $M^+$ are the same as defined above for $Y^4$, $Y^5$, $Rf^3$ and $M^+$ respectively in general formula (d1-3), $Y^{4a}$ represents a group in which the terminal oxygen atom has been removed from $Y^4$, and $Z''$ represents a counter anion.

First, the compound (i-1) is reacted with the compound (i-2) to obtain the compound (i-3).

In formula (i-1), $Y^{4a}$ represents a group in which the terminal oxygen atom has been removed from $Y^4$. In formula (i-2), $Y^5$ and $Rf^3$ are the same as defined above.

Commercially available compounds may be used as the compound (i-1) and the compound (i-2), or the compounds may be synthesized.

The method for reacting the compound (i-1) with the compound (i-2) to obtain the compound (i-3) is not particularly limited, and can be performed, for example, by reacting the compound (i-1) with the compound (i-2) in an organic solvent in the presence of an appropriate acid catalyst, and then washing the reaction mixture and recovering the reaction product.

There are no particular limitations on the acid catalyst used in the above reaction, and examples include toluenesulfonic acid and the like. The amount used of the acid catalyst is preferably within a range from approximately 0.05 to 5 mol, relative to 1 mol of the compound (i-2).

As the organic solvent used in the above reaction, any organic solvent which is capable of dissolving the raw materials, namely the compound (i-1) and the compound (i-2), can be used, and specific examples include toluene and the like. The amount of the organic solvent is preferably within a range from 0.5 to 100 parts by weight, and more preferably from 0.5 to 20 parts by weight, relative to the amount of the compound (i-1). As the solvent, one type of solvent may be used alone, or a combination of two or more types of solvents may be used.

In general, the amount of the compound (i-2) used in the above reaction is preferably within a range from approximately 0.5 to 5 mol, and more preferably from 0.8 to 4 mol, relative to 1 mol of the compound (i-1).

The reaction time for the above reaction varies depending on the reactivity between the compound (i-1) and the compound (i-2), and the reaction temperature and the like, but in most cases, is preferably within a range from 1 to 80 hours, and more preferably from 3 to 60 hours.

The reaction temperature of the above reaction is preferably within a range from 20° C. to 200° C., and more preferably from approximately 20° C. to 150° C.

Next, the obtained compound (i-3) is reacted with the compound (i-4), thereby obtaining the compound (d1-3).

In formula (i-4), $M^+$ is the same as defined above, and $Z^-$ represents a counter anion.

The method used for reacting the compound (i-3) with the compound (i-4) to obtain the compound (d1-3) is not particularly limited, and can be performed, for example, by dissolving the compound (i-3) in an appropriate organic solvent and water in the presence of an appropriate alkali metal hydroxide, and then adding the compound (i-4) and stirring to effect a reaction.

There are no particular limitations on the alkali metal hydroxide used in the above reaction, and examples include sodium hydroxide and potassium hydroxide and the like. The amount used of the alkali metal hydroxide is preferably within a range from approximately 0.3 to 3 mol, relative to 1 mol of the compound (i-3).

Examples of the organic solvent used in the above reaction include dichloromethane, chloroform and ethyl acetate. The amount used of the organic solvent is preferably within a range from 0.5 to 100 parts by weight, and more preferably from 0.5 to 20 parts by weight, relative to the weight of the compound (i-3). As the solvent, one type of solvent may be used alone, or a combination of two or more types of solvents may be used.

In general, the amount of the compound (i-4) used in the above reaction is preferably within a range from approximately 0.5 to 5 mol, and more preferably from approximately 0.8 to 4 mol, relative to 1 mol of the compound (i-3).

The reaction time for the above reaction varies depending on the reactivity between the compound (i-3) and the compound (i-4), and the reaction temperature and the like, but in most cases, is preferably within a range from 1 to 80 hours, and more preferably from 3 to 60 hours.

The reaction temperature of the above reaction is preferably within a range from 20° C. to 200° C., and more preferably from approximately 20° C. to 150° C.

Following completion of the reaction, the compound (d1-3) contained in the reaction mixture may be separated and purified. Conventional methods may be used to separate and purify the product, including concentration, solvent extraction, distillation, crystallization, recrystallization and chromatography, which may be used individually or in combinations of two or more different methods.

The structure of the compound (d1-3) obtained in the manner described above can be confirmed by general organic analysis methods such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elemental analysis and X-ray crystal diffraction methods.

—Component (D2)

There are no particular limitations on the component (D2), and a conventional compound can be used, provided it is a compound which is relatively basic compared with the component (A) and the component (B) so as to function as an acid diffusion inhibitor, namely, a quencher that traps the acid generated from the components (A) and (B) upon exposure, and provided it does not fall under the definition of the component (D1). Examples of these conventional compounds include amines such as aliphatic amines and aromatic amines, and of these, an aliphatic amine, and particularly a secondary aliphatic amine or tertiary aliphatic amine, is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), cyclic amines, and other aliphatic amines.

The alkyl group for the above alkylamines may be linear, branched or cyclic.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Specific examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Examples of the alkyl group in the hydroxyalkyl group within the aforementioned alkyl alcohol amines include the same groups as those mentioned above for the alkyl group within the alkylamines.

Specific examples of the alkylamines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine and tri-n-dodecylamine.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Among the above compounds, trialkylamines of 5 to 10 carbon atoms are preferred, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate.

Examples of aromatic amines include aniline, pyridine, 4-dimethylaminopyridine, pyrrole, indole, pyrazole, imidazole and derivatives thereof, diphenylamine, triphenylamine, tribenzylamine, 2,6-diisopropylaniline and N-tert-butoxycarbonylpyrrolidine.

As the component (D2), one type of compound may be used alone, or a combination of two or more types of compounds may be used.

The component (D2) is typically used in an amount within a range from 0.01 to 5 parts by weight, relative to 100 parts by weight of the component (A). By ensuring that the amount of the component (D2) is within the above range, the shape of the resist pattern and the post exposure stability of the latent image formed by the pattern-wise exposure of the resist layer are improved.

As the component (D), one type of compound may be used alone, or a combination of two or more types of compounds may be used.

In those cases where the resist composition of the present invention includes the component (D), the amount of the component (D) (namely, the combined amount of the component (D1) and the component (D2)) is preferably within a range from 0.1 to 15 parts by weight, more preferably from 0.3 to 12 parts by weight, and still more preferably from 0.5 to 12 parts by weight, relative to 100 parts by weight of the component (A).

When the amount of the component (D) is at least as large as the lower limit of the above range, lithography properties such as the roughness can be improved. Further, a more favorable resist pattern shape can be obtained. On the other hand, when the amount of the component (D) is not more than the upper limit of the above range, the sensitivity can be favorably maintained, and throughput can be improved.

[Component (E)]

Furthermore, in order to prevent any deterioration in sensitivity, and improve the resist pattern shape and the post exposure stability of the latent image formed by the pattern-wise exposure of the resist layer, the resist composition of the present invention may contain, as an optional component, at least one compound (E) (hereafter referred to as "component (E)") selected from the group consisting of organic carboxylic acids, and phosphorus oxo acids and derivatives thereof.

Examples of the organic carboxylic acids include acetic acid, malonic acid, citric acid, malic acid, succinic acid, benzoic acid, and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phosphinic acid esters and phenylphosphinic acid.

As the component (E), one type of compound may be used alone, or a combination of two or more types may be used.

In those cases where the resist composition of the present invention includes the component (E), the component (E) is typically used in an amount within a range from 0.01 to 5 parts by weight, relative to 100 parts by weight of the component (A).

[Component (B)]

The resist composition of the present invention may also include, as an optional component, an acid generator component (B) (hereafter referred to as "component (B)") which generates acid upon exposure, but does not correspond with the above definition of the component (A), provided inclusion of the component (B) does not impair the effects of the present invention.

There are no particular limitations on the component (B), and any of the conventional materials that have already been proposed as acid generators for chemically amplified resists can be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

Examples of onium salt acid generators that may be used include compounds represented by general formula (b-1) or (b-2) shown below.

[Chemical Formula 94]

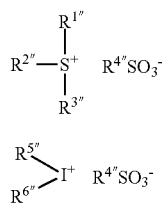

(b-1)

(b-2)

In the formulas, each of $R^{1\prime\prime\prime}$ to $R^{3\prime\prime\prime}$ independently represents an aryl group, alkyl group or alkenyl group which may have a substituent, and two of $R^{1\prime\prime\prime}$ to $R^{3\prime\prime\prime}$ may be bonded to each other to form a ring in combination with the sulfur atom in the formula. Each of $R^{5\prime\prime\prime}$ and $R^{6\prime\prime\prime}$ independently represents an aryl group, alkyl group or alkenyl group which may have a substituent, and $R^{4\prime\prime\prime}$ represents an alkyl group, halogenated alkyl group, aryl group or alkenyl group which may have a substituent.

In formula (b-1), each of $R^{1\prime\prime\prime}$ to $R^{3\prime\prime\prime}$ independently represents an aryl group, alkyl group which may have a substituent or alkenyl group which may have a substituent. Further, two of $R^{1\prime\prime\prime}$ to $R^{3\prime\prime\prime}$ may be bonded to each other to form a ring in combination with the sulfur atom in the formula.

$R^{1\prime\prime\prime}$ to $R^{3\prime\prime\prime}$ are the same as defined above for the aryl group which may have a substituent, the alkyl group which may have a substituent, and the alkenyl group which may have a substituent for $R^{11\prime\prime}$ to $R^{13\prime}$ in formula (m1-1).

Examples of preferred forms of the cation in the compound represented by formula (b-1) include the same cations as those mentioned above for the cation represented by formula (m1-1).

In formula (b-2), each of $R^{5\prime\prime\prime}$ and $R^{6\prime\prime\prime}$ independently represents an aryl group which may have a substituent, alkyl group which may have a substituent or alkenyl group which may have a substituent.

$R^{5\prime\prime\prime}$ and $R^{6\prime\prime\prime}$ are the same as defined above for the aryl group which may have a substituent, the alkyl group which may have a substituent, and the alkenyl group which may have a substituent for $R^{15\prime\prime}$ and $R^{16\prime\prime}$ in formula (m2-1).

Examples of preferred forms of the cation in the compound represented by formula (b-2) include a diphenyliodonium ion and a bis(4-tert-butylphenyl)iodonium ion.

In formulas (b-1) and (b-2), $R^{4\prime\prime\prime}SO_3^-$ is the same as $R^{4\prime\prime\prime}SO_3^-$ mentioned within the description of $V^-$ in general formula (a6-0-1) described above in connection with the structural unit (a6).

Examples of compounds that can be used as the onium salt acid generator include sulfonium salts having a cation represented by one of the above formulas (m1-2), (m1-3), (m1-4), (m1-5) or (m1-6).

There are no particular limitations on the anion of these sulfonium salts having a cation represented by one of the above formulas (m1-2) to (m1-6), and the same anions as those used in conventional onium salt acid generators can be used. Examples of these anions include fluorinated alkylsulfonate ions such as the anion ($R^{4\prime\prime\prime}SO_3^-$) of the onium salt acid generators represented by the above formulas (b-1) and (b-2), anions represented by the above general formulas (b-3) and (b-4), and anions represented by any of the above formulas (b1) to (b9).

In the present description, an oxime sulfonate acid generator is a compound having at least one group represented by general formula (B-1) shown below, and has a feature of generating acid upon irradiation (exposure). Such oxime sulfonate acid generators are widely used for a chemically amplified resist composition, and can be selected as appropriate.

[Chemical Formula 95]

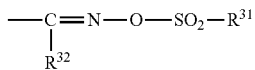

(B-1)

In formula (B-1), each of $R^{31}$ and $R^{32}$ independently represents an organic group.

The organic group for $R^{31}$ and $R^{32}$ refers to a group containing a carbon atom, and may also include atoms other than carbon atoms (such as a hydrogen atom, an oxygen atom, nitrogen atom, sulfur atom and halogen atom (such as a fluorine atom and a chlorine atom) and the like).

The organic group for $R^{31}$ is preferably a linear, branched or cyclic alkyl group, or an aryl group. The alkyl group or the aryl group may have a substituent. The substituent is not particularly limited, and examples include a fluorine atom and a linear, branched, or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The term "partially halogenated alkyl group" refers to an alkyl group in which part of the hydrogen atoms are substituted with halogen atoms, and the term "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The term "partially halogenated aryl group" refers to an aryl group in which some of the hydrogen atoms are substituted with halogen atoms, and the term "completely halogenated aryl group" refers to an aryl group in which all of hydrogen atoms are substituted with halogen atoms.

$R^{31}$ is preferably an alkyl group of 1 to 4 carbon atoms which has no substituent or a fluorinated alkyl group of 1 to 4 carbon atoms.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

$R^{32}$ is preferably a cyano group, an alkyl group of 1 to 8 carbon atoms having no substituent or a fluorinated alkyl group of 1 to 8 carbon atoms.

Preferred examples of the oxime sulfonate acid generator include compounds represented by general formula (B-2) or (B-3) shown below.

[Chemical Formula 96]

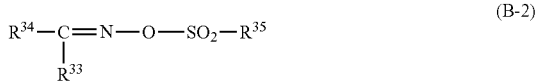

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group, and phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group for the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group is preferable, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

[Chemical Formula 97]

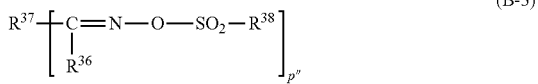

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-3), examples of the alkyl group having no substituent and the halogenated alkyl group for $R^{36}$ include the same alkyl groups having no substituent and the halogenated alkyl groups described above for $R^{33}$.

Examples of the divalent or trivalent aromatic hydrocarbon group for $R^{37}$ include groups in which one or two hydrogen atoms have been removed from the aryl group described above for $R^{34}$.

Examples of the alkyl group having no substituent and the halogenated alkyl group for $R^{38}$ include the same alkyl groups having no substituent and the halogenated alkyl groups described above for $R^{35}$.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described on pages 65 to 86) may also be used favorably.

Furthermore, the following compounds may also be used as preferred examples.

[Chemical Formula 98]

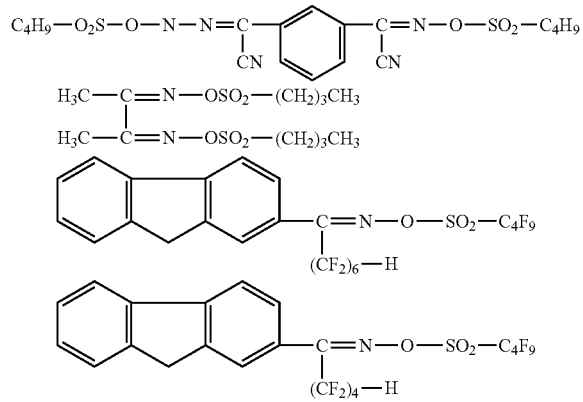

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or a combination of two or more types may be used.

In those case where the resist composition of the present invention includes the component (B), the amount of the component (B) is preferably not more than 60 parts by weight, more preferably not more than 40 parts by weight, and still more preferably not more than 10 parts by weight, relative to 100 parts by weight of the component (A).

When the amount of the component (B) is not more than the upper limit mentioned above, and preferably not more than 40 parts by weight, a uniform solution can be obtained when each of the components of the resist composition is dissolved in an organic solvent, and the storage stability of the composition tends to improve.

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the materials for the resist composition in an organic solvent (hereafter frequently referred to as "component (S)").

The component (S) may be any organic solvent which can dissolve the respective components to give a uniform solution, and one or more types of organic solvent may be selected appropriately from those solvents that have been conventionally known as solvents for chemically amplified resists.

Examples include lactones such as γ-butyrolactone; ketones such as acetone, methyl ethyl ketone, cyclohexanone (CH), methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives, including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among these solvents, γ-butyrolactone, propylene glycol monomethyl ether acetate (PGMEA), propylene glycol monomethyl ether (PGME), cyclohexanone (CH) and ethyl lactate (EL) are preferred.

Further, among the mixed solvents, a mixed solvent obtained by mixing PGMEA with a polar solvent is preferable. The mixing ratio (weight ratio) of the mixed solvent may be determined as appropriate, taking into consideration the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as the polar solvents, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of PGMEA, EL or an aforementioned mixed solvent of PGMEA and a polar solvent, with γ-butyrolactone is also preferred. In this case, the mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

In the resist composition of the present invention, the sensitivity, the resolution and the lithography properties are all excellent. The reasons that these effects are obtained are not entirely clear, but are thought to include the following.

The resist composition of the present invention uses the polymeric compound (A1) having the structural unit (a5) represented by general formula (a5-0) and the structural unit (a6) that generates acid upon exposure.

The structural unit (a5) includes an imino group (—NH—), a carbonyl group (—C(=O)—) bonded adjacently to one side of the imino group, and a carbonyl group or a thioketone group (—C(=S)—) bonded adjacently to the other side of the imino group. As a result of this structure, the acidic proton on the nitrogen atom of the imino group functions as a proton source, which yields a high level of sensitivity. In addition, because of the existence of the nitrogen atom in the imino group, diffusion of the acid generated from the structural unit (a6) or the like upon exposure can be suppressed.

On the other hand, because the component (A1) is a polymeric compound, each of the structural units can be more easily distributed uniformly through the resist film. As a result, during resist pattern formation, acid can be generated from the structural unit (a6) in a uniform manner throughout the entire exposed portion of the resist film. In addition, the imino group (—NH—) within the structural unit (a5) is also distributed uniformly through the resist film, and therefore the quenching effect that traps the generated acid can also be achieved uniformly through the entire resist film.

It is thought that these synergistic actions and effects enable the effects of the present invention to be achieved.

<<Method of Forming Resist Pattern>>

The method of forming a resist pattern according to the present invention includes: using the aforementioned resist composition of the present invention to form a resist film on a substrate, conducting exposure of the resist film, and developing the resist film to form a resist pattern.

More specifically, the method of forming a resist pattern according to the present invention can be performed, for example, as follows.

First, the resist composition of the present invention is applied onto a substrate using a spinner or the like, and a bake treatment (post applied bake (PAB)) is conducted under temperature conditions of 80 to 150° C. for 40 to 120 seconds, and preferably 60 to 90 seconds, to form a resist film.

Subsequently, the resist film is selectively exposed using an exposure apparatus such as an ArF exposure apparatus, an electron beam lithography apparatus or an EUV exposure apparatus, either by irradiation through a mask having a predetermined pattern formed therein (namely, a mask pattern), or by patterning via direct irradiation with an electron beam without using a mask pattern, and the resist film is then subjected to a bake treatment (post exposure bake (PEB)) under temperature conditions of 80 to 150° C. for to 120 seconds, and preferably 60 to 90 seconds.

Next, the resist film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

The substrate is not specifically limited, and a conventionally known substrate can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC), or an organic film such as a lower-layer organic film used in a multilayer resist method can be used.

Here, a "multilayer resist method" is method in which at least one layer of an organic film (a lower-layer organic film) and at least one layer of a resist film (an upper-layer resist film) are provided on a substrate, and a resist pattern formed on the upper-layer resist film is used as a mask to conduct patterning of the lower-layer organic film. This method is considered as being capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (triple-layer resist method).

The wavelength to be used for exposure is not particularly limited, and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective for use with a KrF excimer laser, ArF excimer laser, EB or EUV.

The exposure of the resist film can be either a general exposure (dry exposure) conducted in air or an inert gas such as nitrogen, or an immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above range is advantageous in that the removal of the immersion medium after the exposure can be conducted using a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in a solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon-based solvents.

If required, known additives can be added to the organic developing solution. Examples of these additives include surfactants. There are no particular limitations on the surfactants, and ionic and nonionic fluorine-based surfactants and/or silicone-based surfactants can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following the developing treatment in a solvent developing process include those organic solvents among the solvents described above for the organic solvent of the organic developing solution which exhibit poor dissolution of the resist pattern. In general, at least one type of solvent selected from among hydrocarbon-based solvents, ketone-based solvents, ester-based solvents, alcohol-based solvents, amide-based solvents and ether-based solvents is used. Among these, at least one solvent selected from among hydrocarbon-based solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

<<Polymeric Compound>>

The polymeric compound of the present invention has a structural unit (a5) represented by general formula (a5-0) shown below, and a structural unit (a6) that generates acid upon exposure.

[Chemical Formula 99]

(a5-0)

In the formula, R represents a hydrogen atom, an alkyl group of 1 to 5 carbon atoms, or a halogenated alkyl group of 1 to 5 carbon atoms, $R^1$ represents a sulfur atom or an oxygen atom, $R^2$ represents a single bond or a divalent linking group, and Y represents a hydrocarbon group in which a carbon atom or a hydrogen atom may be substituted with a substituent.

In the polymeric compound of the present invention, the structural unit (a6) preferably includes a group represented by general formula (a6-0-1) or general formula (a6-0-2) shown below.

[Chemical Formula 100]

(a6-0-1)

-continued

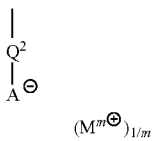

(a6-0-2)

In the formulas, each of $Q^1$ and $Q^2$ independently represents a single bond or a divalent linking group, each of $R^3$, $R^4$ and $R^5$ independently represents an organic group, wherein $R^4$ and $R^5$ may be bonded to each other to form a ring in combination with the sulfur atom in the formula, $V^-$ represents a counter anion, $A^-$ represents an organic group containing an anion, and $M^{m+}$ represents an organic cation having a valency of m, wherein m represents an integer of 1 to 3.

The polymeric compound of the present invention preferably also includes a structural unit (a1) containing an acid-decomposable group that exhibits increased polarity under the action of acid.

Details regarding the polymeric compound of the present invention are the same as those mentioned above within the description of the component (A1) for the resist composition of the present invention.

The polymeric compound of the present invention is ideal as the base resin for a resist composition.

(Method of Producing Compound that Yields the Structural Unit (a5))

A compound (hereafter referred to as "compound (1)") that yields the structural unit (a5) can be produced, for example, by reacting a compound (1-1) represented by formula (1-1) shown below with a compound (1-2) represented by formula (1-2) shown below.

[Chemical Formula 101]

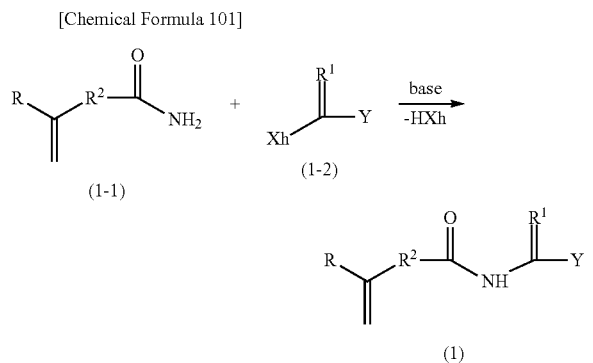

In the formula, R, $R^1$, $R^2$ and Y are the same as defined above for R, $R^1$, $R^2$ and Y in the aforementioned formula (a5-0), and Xh represents a halogen atom.

In formula (1-2), Xh represents a halogen atom. Examples include a fluorine atom, chlorine atom, bromine atom and iodine atom, and a chlorine atom is preferred.

The method used for reacting the compound (1-1) and the compound (1-2) can be executed, for example, by dissolving the compound (1-1) in an appropriate organic solvent, and stirring the solution in the presence of an appropriate base. Subsequently, the compound (1-2) is added to the solution and stirred, the reaction mixture is washed, and the product is recovered.

The compounds (1-1) and (1-2) may employ commercially available products, or may be synthesized.

In the above reaction, the organic solvent is preferably tetrahydrofuran, tert-butyl methyl ether, dichloromethane, acetonitrile, chloroform or methylene chloride or the like, and the amount used of the organic solvent is preferably within a range from 0.5 to 100 parts by weight, and more preferably from 0.5 to 20 parts by weight, relative to the compound (1-1). The solvent may use a single solvent, or a combination of two or more solvents.

Examples of the base include sodium hydride, $K_2CO_3$, $Cs_2O_3$, lithium diisopropylamide (LiDA), triethylamine and 4-dimethylaminopyridine, and any one of these base may be used alone, or a combination of two or more bases may be used. The amount used of the base need only be a catalytic amount, and is typically within a range from approximately 0.01 to 10 mol relative to 1 mol of the compound (1-1).

The reaction time for the above reaction varies depending on factors such as the reactivity of the compound (1-1) and the compound (1-2), and the reaction temperature, but is typically within a range from 0.1 to 100 hours, and preferably from 0.5 to 50 hours.

The reaction temperature for the above reaction is preferably within a range from 0 to 50° C., and more preferably from 0 to approximately 30° C.

The amount of the compound (1-2) used in the reaction is typically within a range from approximately 0.5 to 10 mol, and preferably from approximately 0.5 to 5 mol, relative to 1 mol of the compound (1-1).

Following completion of the reaction, the compound (1) contained in the reaction mixture may be separated and purified.

Conventional methods may be used to separate and purify the compound (1), including concentration, solvent extraction, distillation, crystallization, recrystallization and chromatography, which may be used individually or in combinations of two or more different methods.

The structure of the compound (1) obtained in the manner described above can be confirmed by general organic analysis methods such as 1H-nuclear magnetic resonance (NMR) spectrometry, $^{13}$C-NMR spectrometry, $^{19}$F-NMR spectrometry, infrared absorption (IR) spectrometry, mass spectrometry (MS), elemental analysis and X-ray crystal diffraction methods.

EXAMPLES

A more detailed description of the present invention is presented below based on a series of examples, although the present invention is in no way limited by these examples.

In the examples, a compound represented by a chemical formula (1) is designated as "compound (1)", and a similar labeling system applies for compounds represented by other chemical formulas.

Monomer Synthesis Examples 1 to 7

(Monomer Synthesis Example 1)

First, 90.0 g of methacrylamide was dissolved in 1,350 g of tetrahydrofuran (THF), and 944 mL of a 1.12 mol/L solution of lithium diisopropylamide (LiDA) was then added dropwise to the solution at 5° C. and stirred for 10 minutes. Subsequently, a solution prepared by dissolving 231.1 g of 1-adamantanecarbonyl chloride in 900 g of THF was added, and the resulting mixture was stirred at 5° C. for 18 hours. Following completion of the reaction, THF and t-butyl methyl ether (TBME) were added, and following washing with a 1% by weight aqueous solution of hydrochloric acid and then with pure water, the reaction solution was concentrated under reduced pressure. Subsequently, n-hexane was added to the obtained solution, and following crystallization at 5° C., the solid was collected by filtration and dried under reduced pressure, yielding 194.4 g of 1-adamantanecarbonyl methacrylamide (compound (51)).

The results of analyzing the obtained compound (51) by proton nuclear magnetic resonance spectrometry ($^1$H-NMR) are shown below.

$^1$H-NMR (DMSO-d6, internal standard: tetramethylsilane): δ=9.85 ppm (br s, 1H), 5.57 ppm (s, 1H), 5.51 ppm (s, 1H), 1.98 ppm (m, 3H), 1.86 ppm (m, 9H), 1.61 ppm (m, 6H).

[Chemical Formula 102]

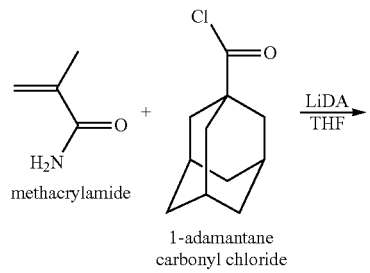

(Monomer Synthesis Example 2)

The same operations as Monomer Synthesis Example 1 were performed to obtain a compound (53).

The results of analyzing the obtained compound (53) by proton nuclear magnetic resonance spectrometry ($^1$H-NMR) are shown below.

$^1$H-NMR (DMSO-d6, internal standard: tetramethylsilane): δ=10.08 ppm (br s, 1H), 5.85 ppm (s, 1H), 5.37 ppm (s, 1H), 2.48 to 1.70 ppm (m, 7H), 1.13 ppm (s, 3H), 1.06 ppm (s, 3H), 0.97 (s, 3H).

(Monomer Synthesis Example 3)

The same operations as the Monomer Synthesis Example 1 were performed to obtain a compound (54).

The results of analyzing the obtained compound (54) by proton nuclear magnetic resonance spectrometry (1H-NMR) are shown below.

$^1$H-NMR (DMSO-d6, internal standard: tetramethylsilane): δ=10.10 ppm (br s, 1H), 8.50 to 7.47 ppm (m, 7H), 5.58 ppm (s, 1H), 5.51 ppm (s, 1H), 1.93 ppm (s, 3H).

(Monomer Synthesis Example 4)

The same operations as Monomer Synthesis Example 1 were performed to obtain a compound (56).

The results of analyzing the obtained compound (56) by proton nuclear magnetic resonance spectrometry ($^1$H-NMR) are shown below.

$^1$H-NMR (DMSO-d6, internal standard: tetramethylsilane): δ=10.01 ppm (br s, 1H), 7.98 to 7.45 ppm (s, 5H), 5.60 ppm (s, 1H), 5.55 ppm (s, 1H), 1.85 ppm (s, 3H).

(Monomer Synthesis Example 5)

The same operations as Monomer Synthesis Example 1 were performed to obtain a compound (57).

The results of analyzing the obtained compound (57) by proton nuclear magnetic resonance spectrometry ($^1$H-NMR) are shown below.

$^1$H-NMR (DMSO-d6, internal standard: tetramethylsilane): δ=10.12 ppm (br s, 1H), 5.63 ppm (s, 1H), 5.56 ppm (s, 1H), 2.26 ppm (s, 6H), 2.19 ppm (s, 3H), 2.04 ppm (s, 6H), 1.87 ppm (s, 31H).

(Monomer Synthesis Example 6)

The same operations as Monomer Synthesis Example 1 were performed to obtain a compound (58).

The results of analyzing the obtained compound (58) by proton nuclear magnetic resonance spectrometry ($^1$H-NMR) are shown below.

$^1$H-NMR (DMSO-d6, internal standard: tetramethylsilane): δ=11.01 ppm (br s, 1H), 5.82 ppm (s, 1H), 5.66 ppm (s, 1H).

(Monomer Synthesis Example 7)

The same operations as Monomer Synthesis Example 1 were performed to obtain a compound (59).

The results of analyzing the obtained compound (59) by proton nuclear magnetic resonance spectrometry ($^1$H-NMR) are shown below.

$^1$H-NMR (DMSO-d6, internal standard: tetramethylsilane): δ=11.84 ppm (br s, 1H), 6.04 ppm (s, 1H), 5.85 ppm (s, 1H).

The structures of the obtained compounds (53), (54) and (56) to (59) are shown below.

[Chemical Formula 103]

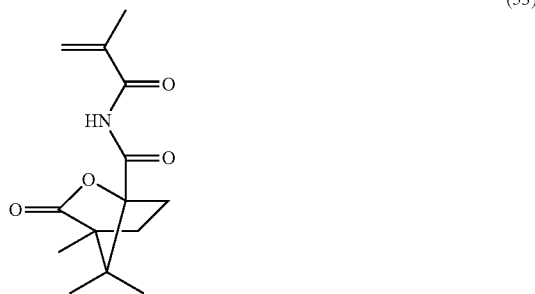

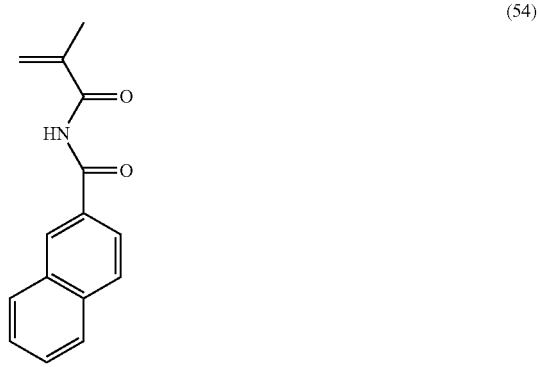

-continued

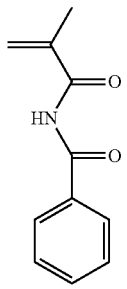

(56)

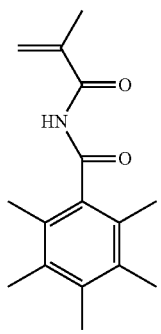

(57)

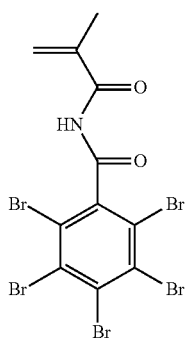

(58)

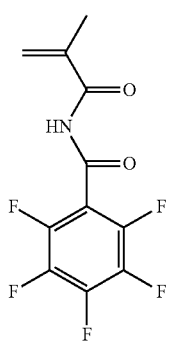

(59)

<Polymer Synthesis Examples: Examples 1 to 20, Comparative Examples 1 and 2>

Example 1

In a separable flask fitted with a thermometer, a reflux condenser and a nitrogen inlet tube, 5.75 g (21.91 mmol) of the compound (11) was dissolved in a mixed solvent containing 6.25 g of methyl ethyl ketone (MEK) and 6.25 g of cyclohexanone (CH), and the solution was heated to 80° C. To this solution was added a solution prepared by dissolving 5.00 g (15.81 mmol) of the compound (21), 1.44 g (5.48 mmol) of the compound (11), 2.49 g (10.07 mmol) of the compound (51), 2.69 g (5.47 mmol) of the compound (61), and 6.46 mmol of dimethyl azobisisobutyrate (V-601) as a polymerization initiator in a mixed solvent containing 14.86 g of MEK and 14.86 g of CH, with the addition performed under a nitrogen atmosphere, and in a dropwise manner over a period of 4 hours.

Following completion of the dropwise addition, the reaction solution was stirred for a further one hour, and the reaction solution was then cooled to room temperature. Subsequently, the obtained polymerization reaction solution was added dropwise to a large volume of n-heptane to precipitate the polymer, and the precipitated white powder was collected by filtration, and then washed with methanol and dried, yielding 8.48 g of the target polymeric compound (1).

The polystyrene-equivalent weight-average molecular weight (Mw) of the polymeric compound (1) determined by GPC measurement was 12,100, and the molecular weight dispersity (Mw/Mn) was 1.85.

Further, the copolymer composition ratio (the ratio (molar ratio) of the respective structural units within the structural formula) determined by carbon-13 nuclear magnetic resonance spectroscopy (600 MHz $^{13}$C-NMR) was l/m/n/o=39.5/31.8/15.4/13.3.

[Chemical Formula 104]

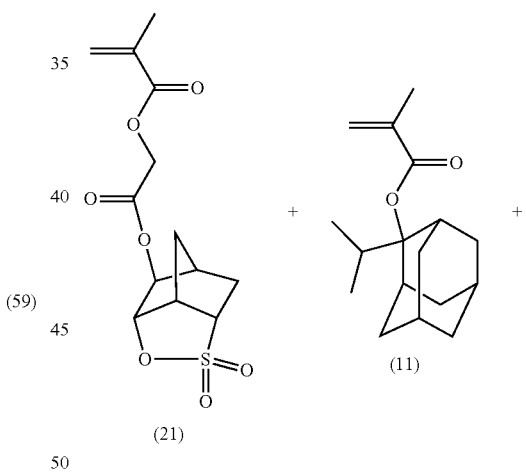

(21)     (11)

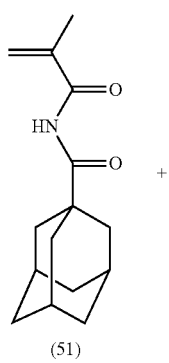

(51)

-continued

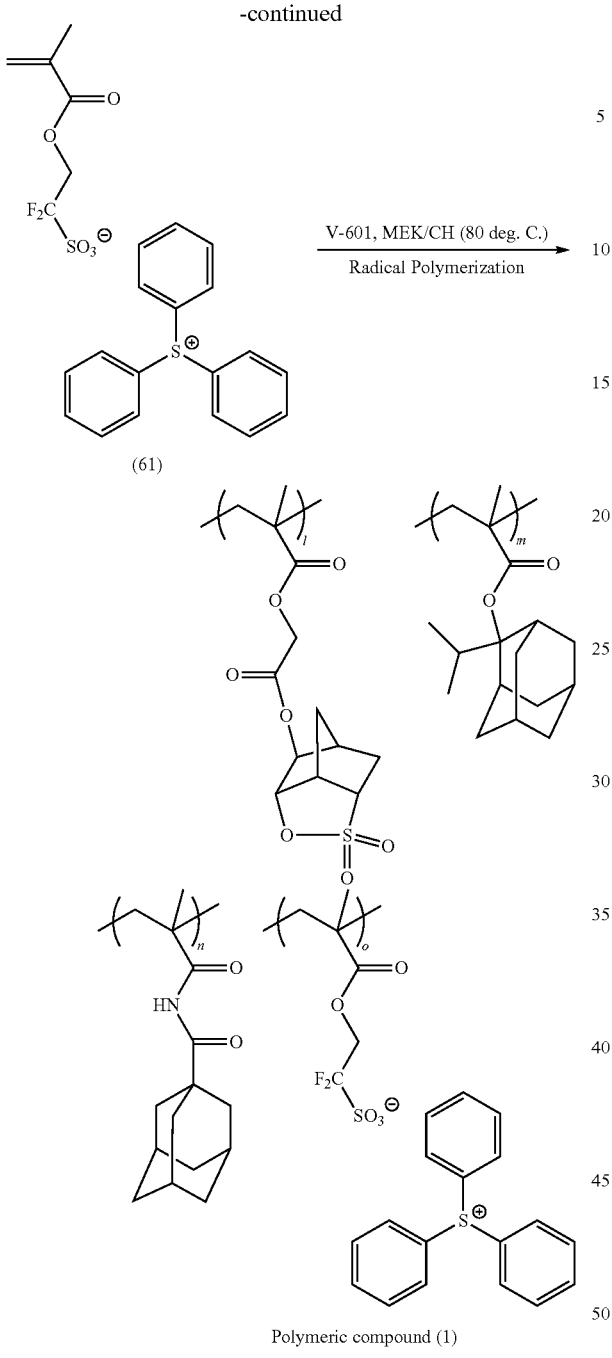

Polymeric compound (1)

Examples 2 to 20, Comparative Examples 1 and 2

With the exception of using the above compounds (51), (53), (54) and (56) to (59), and the compounds (52), (55), (11), (21), (31) and (61) to (71) described below, in the prescribed molar ratios, as the compounds which yield the various structural units that constitute each of the polymeric compounds, polymeric compounds (2) to (22) were synthesized using the same method as that described for Example 1.

For each polymeric compound, the compounds used in forming the respective structural units, the copolymer compositional ratio as determined by carbon-13 nuclear magnetic resonance spectroscopy (600 MHz, $^{13}$C-NMR), and the polystyrene-equivalent weight-average molecular weight (Mw) and the dispersity (Mw/Mn) determined by GPC measurement are shown in Table 1.

[Chemical Formula 105]

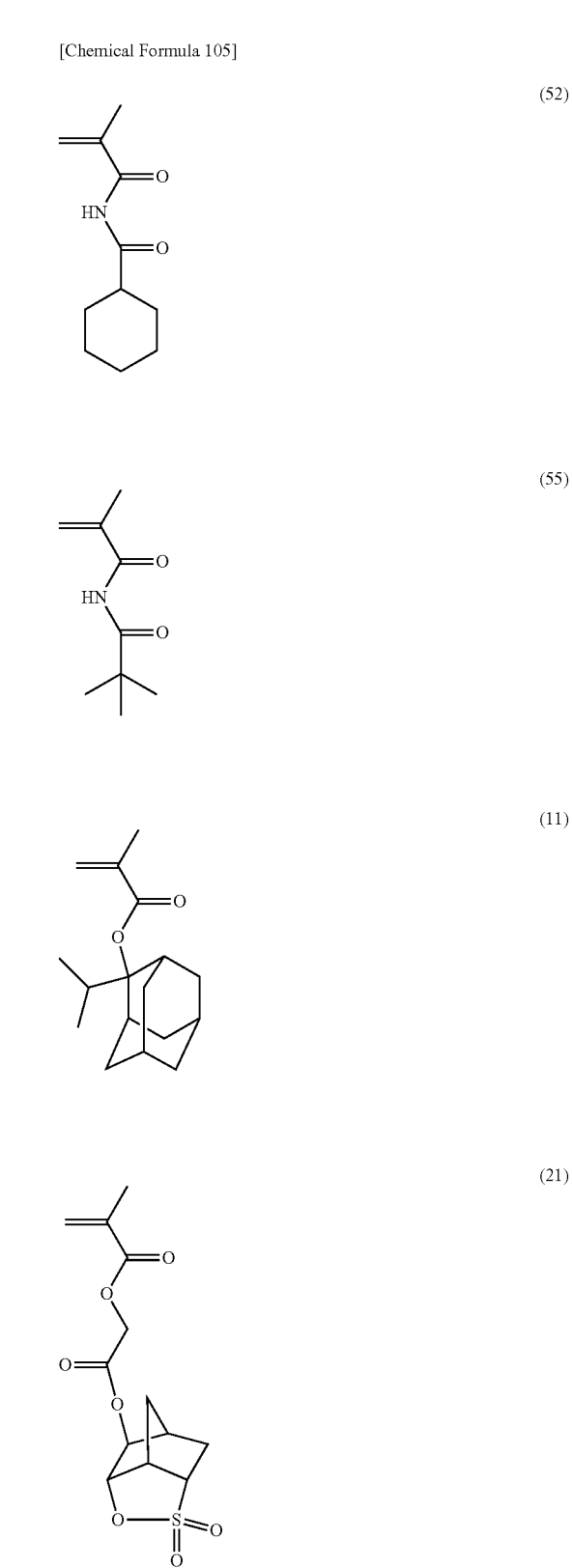

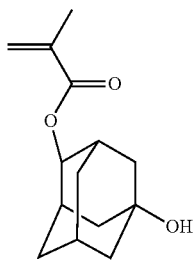
(31)
[Chemical Formula 106]
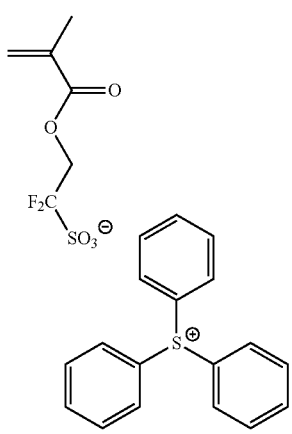
(61)
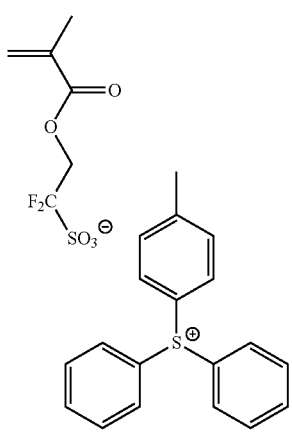
(62)
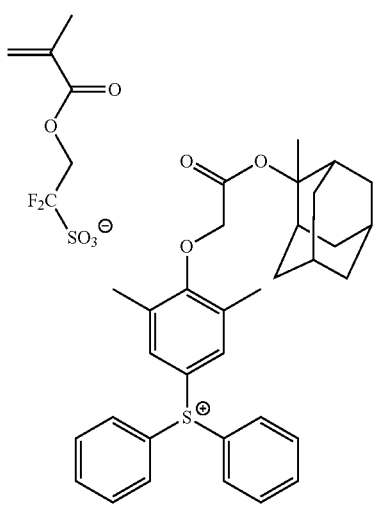
(63)
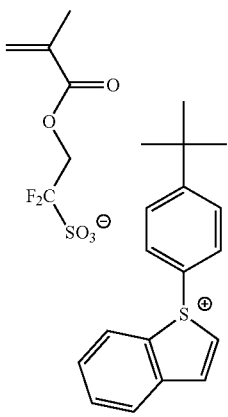
(64)
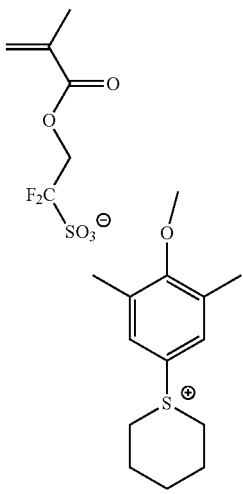
(65)
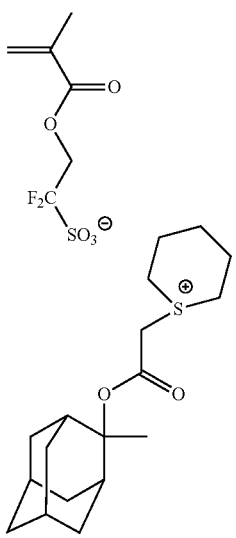
(66)

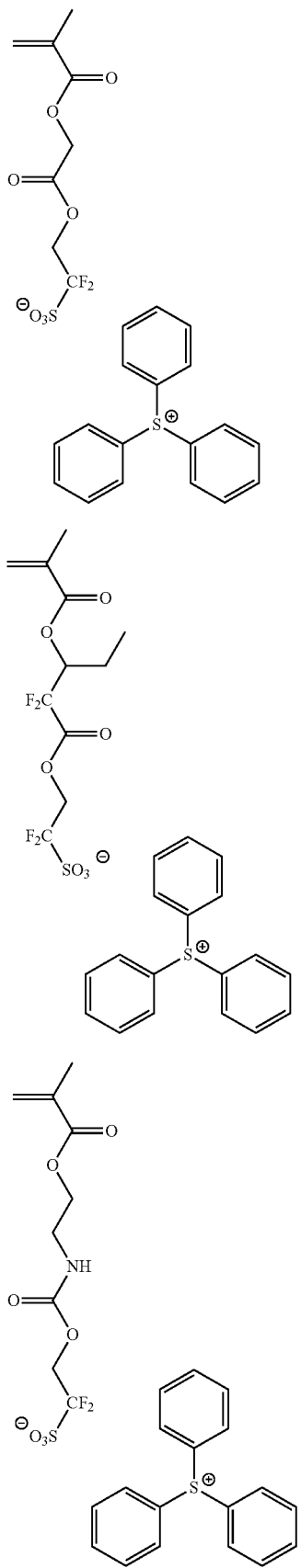
(67)
(68)
(69)
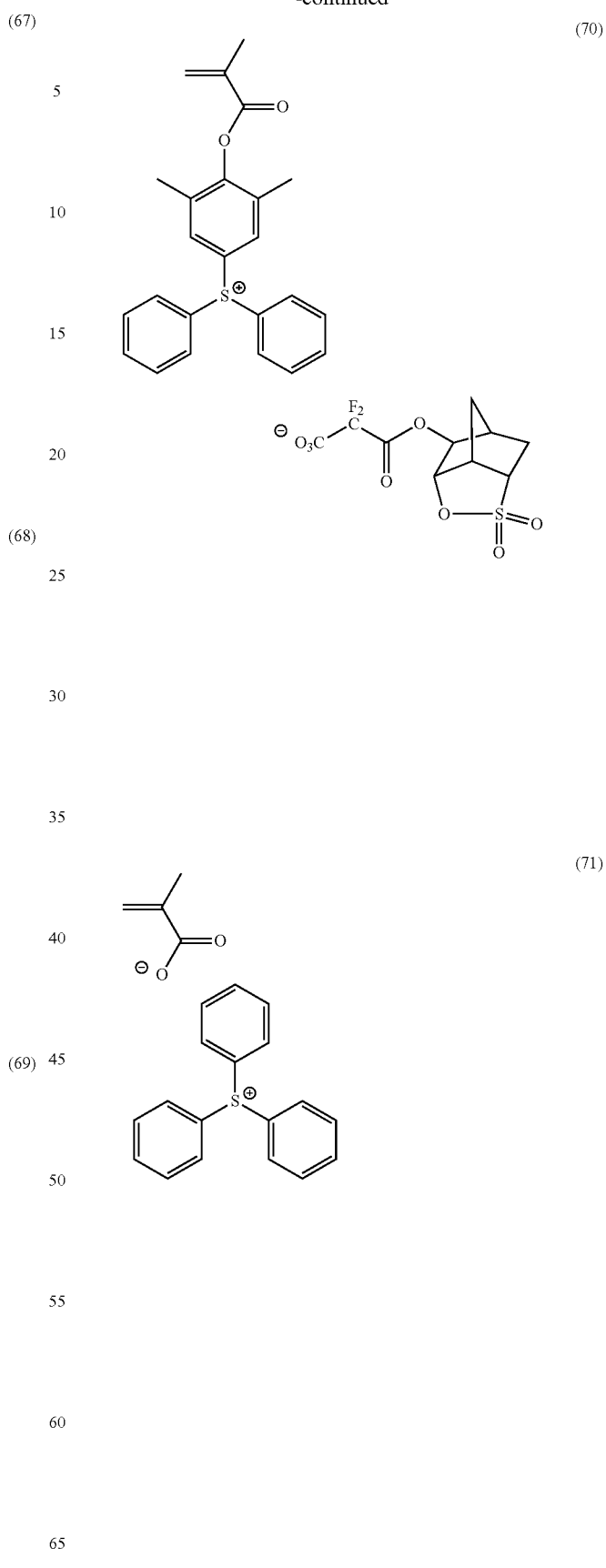
(70)
(71)

TABLE 1

| | Polymeric compound | Compounds for forming each structural unit | Copolymer compositional ratio | Mw | Mw/Mn |
|---|---|---|---|---|---|
| Example 1 | (1) | (21)/(11)/(51)/(61) | 39.5/31.8/15.4/13.3 | 12,100 | 1.85 |
| Example 2 | (2) | (21)/(11)/(51)/(62) | 36.9/33.5/17.8/11.8 | 11,400 | 1.70 |
| Example 3 | (3) | (21)/(11)/(51)/(63) | 37.1/32.0/18.7/12.2 | 11,800 | 1.77 |
| Example 4 | (4) | (21)/(11)/(51)/(64) | 37.2/30.7/18.6/13.5 | 12,100 | 1.74 |
| Example 5 | (5) | (21)/(11)/(51)/(65) | 38.4/32.0/16.3/13.3 | 12,700 | 1.84 |
| Example 6 | (6) | (21)/(11)/(51)/(66) | 38.8/33.0/15.0/13.2 | 11,700 | 1.88 |
| Example 7 | (7) | (21)/(11)/(51)/(67) | 36.7/32.7/16.8/13.8 | 12,800 | 1.72 |
| Example 8 | (8) | (21)/(11)/(51)/(68) | 38.0/33.1/15.7/13.2 | 13,100 | 1.93 |
| Example 9 | (9) | (21)/(11)/(51)/(69) | 39.8/30.1/17.4/12.7 | 13,100 | 1.94 |
| Example 10 | (10) | (21)/(11)/(51)/(70) | 37.5/31.0/17.5/14.0 | 7,100 | 2.02 |
| Example 11 | (11) | (21)/(11)/(52)/(61) | 37.1/31.9/17.1/13.9 | 12,600 | 1.71 |
| Example 12 | (12) | (21)/(11)/(53)/(61) | 37.4/33.6/15.4/13.6 | 12,900 | 1.94 |
| Example 13 | (13) | (21)/(11)/(54)/(61) | 35.5/34.1/18.0/12.4 | 12,400 | 1.93 |
| Example 14 | (14) | (21)/(11)/(51)/(71) | 38.2/31.8/18.2/11.8 | 12,900 | 1.75 |
| Comparative example 1 | (15) | (21)/(11)/(31)/(61) | 35.8/34.3/16.1/13.8 | 11,400 | 1.85 |
| Comparative example 2 | (16) | (21)/(11)/(51) | 42.9/39.2/17.9 | 6,100 | 1.80 |
| Example 15 | (17) | (21)/(11)/(55)/(61) | 36.4/31.8/19.3/12.5 | 12,700 | 1.95 |
| Example 16 | (18) | (21)/(11)/(56)/(61) | 37.1/31.4/17.8/13.7 | 11,500 | 1.93 |
| Example 17 | (19) | (21)/(11)/(57)/(61) | 35.0/35.6/17.2/12.2 | 12,900 | 1.76 |
| Example 18 | (20) | (21)/(11)/(58)/(61) | 36.4/31.3/19.5/12.8 | 11,200 | 1.84 |
| Example 19 | (21) | (21)/(11)/(59)/(61) | 37.7/31.7/17.6/13.0 | 10,900 | 1.71 |
| Example 20 | (22) | (11)/(53)/(61) | 31.8/55.2/13.0 | 11,900 | 1.81 |

<Preparation of Resist Composition>

Examples 21 to 41, Comparative Examples 3 and 4

The components shown in Tables 2 and 3 were mixed together and dissolved to prepare a series of resist compositions.

In the tables, component (A') describes a base component that exhibits changed solubility in a developing solution under the action of acid (but does not itself generate acid upon exposure).

TABLE 2

| | Component (A) | Component (A') | Component (B) | Component (D) | Component (E) | Component (S) | |
|---|---|---|---|---|---|---|---|
| Example 21 | (A1)-1 [100] | — | — | (D)-1 [1.6] | (E)-1 [0.64] | (S)-1 [200] | (S)-2 [5000] |
| Example 22 | (A1)-2 [100] | — | — | (D)-1 [1.6] | (E)-1 [0.64] | (S)-1 [200] | (S)-2 [5000] |
| Example 23 | (A1)-3 [100] | — | — | (D)-1 [1.6] | (E)-1 [0.64] | (S)-1 [200] | (S)-2 [5000] |
| Example 24 | (A1)-4 [100] | — | — | (D)-1 [1.6] | (E)-1 [0.64] | (S)-1 [200] | (S)-2 [5000] |
| Example 25 | (A1)-5 [100] | — | — | (D)-1 [1.6] | (E)-1 [0.64] | (S)-1 [200] | (S)-2 [5000] |
| Example 26 | (A1)-6 [100] | — | — | (D)-1 [1.6] | (E)-1 [0.64] | (S)-1 [200] | (S)-2 [5000] |
| Example 27 | (A1)-7 [100] | — | — | (D)-1 [1.6] | (E)-1 [0.64] | (S)-1 [200] | (S)-2 [5000] |
| Example 28 | (A1)-8 [100] | — | — | (D)-1 [1.6] | (E)-1 [0.64] | (S)-1 [200] | (S)-2 [5000] |
| Example 29 | (A1)-9 [100] | — | — | (D)-1 [1.6] | (E)-1 [0.64] | (S)-1 [200] | (S)-2 [5000] |
| Example 30 | (A1)-10 [100] | — | — | (D)-1 [1.6] | (E)-1 [0.64] | (S)-1 [200] | (S)-2 [5000] |

TABLE 3

| | Component (A) | Component (A') | Component (B) | Component (D) | Component (E) | Component (S) | |
|---|---|---|---|---|---|---|---|
| Example 31 | (A1)-11 [100] | — | — | (D)-1 [1.6] | (E)-1 [0.64] | (S)-1 [200] | (S)-2 [5000] |
| Example 32 | (A1)-12 [100] | — | — | (D)-1 [1.6] | (E)-1 [0.64] | (S)-1 [200] | (S)-2 [5000] |

TABLE 3-continued

| | Component (A) | Component (A') | Component (B) | Component (D) | Component (E) | Component (S) | |
|---|---|---|---|---|---|---|---|
| Example 33 | (A1)-13 [100] | — | — | (D)-1 [1.6] | (E)-1 [0.64] | (S)-1 [200] | (S)-2 [5000] |
| Example 34 | (A1)-1 [80] (A1)-14 [20] | — | — | — | — | (S)-1 [200] | (S)-2 [5000] |
| Example 35 | (A1)-1 [100] | — | — | (D)-2 [2.2] | — | (S)-1 [200] | (S)-2 [5000] |
| Comparative example 3 | (A2)-1 [100] | — | — | (D)-1 [1.6] | (E)-1 [0.64] | (S)-1 [200] | (S)-2 [5000] |
| Comparative example 4 | — | (A')-1 [100] | (B)-1 [24.0] | (D)-1 [1.6] | (E)-1 [0.64] | (S)-1 [200] | (S)-2 [5000] |
| Example 36 | (A1)-17 [100] | — | — | (D)-1 [1.6] | (E)-1 [0.64] | (S)-1 [200] | (S)-2 [5000] |
| Example 37 | (A1)-18 [100] | — | — | (D)-1 [1.6] | (E)-1 [0.64] | (S)-1 [200] | (S)-2 [5000] |
| Example 38 | (A1)-19 [100] | — | — | (D)-1 [1.6] | (E)-1 [0.64] | (S)-1 [200] | (S)-2 [5000] |
| Example 39 | (A1)-20 [100] | — | — | (D)-1 [1.6] | (E)-1 [0.64] | (S)-1 [200] | (S)-2 [5000] |
| Example 40 | (A1)-21 [100] | — | — | (D)-1 [1.6] | (E)-1 [0.64] | (S)-1 [200] | (S)-2 [5000] |
| Example 41 | (A1)-22 [100] | — | — | (D)-1 [1.6] | (E)-1 [0.64] | (S)-1 [200] | (S)-2 [5000] |

In Tables 2 and 3, the numerical values in brackets [ ] indicate the amount (in parts by weight) of the component added, and the reference characters indicate the following.

(A1)-1 to (A1)-14: the aforementioned polymeric compounds (1) to (14)

(A1)-17 to (A1)-22: the aforementioned polymeric compounds (17) to (22)

(A2)-1: the aforementioned polymeric compound (15)

(A1')-1: the aforementioned polymeric compound (16)

(B)-1: an acid generator composed of a compound represented by chemical formula (B)-1 shown below (D)-1: tri-n-octylamine (D)-2: a compound represented by chemical formula (D)-2 shown below (E)-1: salicylic acid (S)-1: γ-butyrolactone (S)-2: a mixed solvent of PGMEA/PGME/CH=1500/1000/2500 (weight ratio)

PGMEA is propylene glycol monomethyl ether acetate, PGME is propylene glycol monomethyl ether, and CH is cyclohexanone.

[Chemical Formula 107]

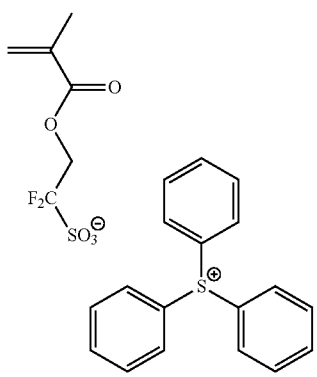

(B)-1

-continued

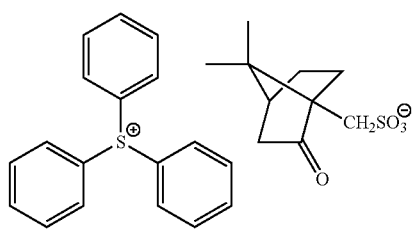

(D)-2

<Formation of Resist Patterns>

Using a spinner, each of the resist compositions of the above examples was applied uniformly onto an 8-inch silicon substrate that had been treated with hexamethyldisilazane (HMDS) for 36 seconds at 90° C., and a bake treatment (PAB) was then conducted for 60 seconds at a bake temperature shown in Table 4, thereby forming a resist film (film thickness: 60 nm). This resist film was subjected to direct patterning (exposure) with an electron beam lithography apparatus HL800D (VSB) (manufactured by Hitachi, Ltd.) at an accelerating voltage of 70 kV. Next, a bake treatment (post exposure bake (PEB)) was conducted for 60 seconds at a bake temperature shown in Table 4, and alkali development was then performed for 60 seconds at 23° C. using a 2.38% by weight aqueous solution of tetramethylammonium hydroxide (TMAH) (product name: NMD-3, manufactured by Tokyo Ohka Kogyo Co., Ltd.).

As a result, a 1:1 line and space pattern (LS pattern) having a line width of 100 nm and a pitch of 200 nm was formed in each of the examples.

The optimum exposure Eop ($\mu C/cm^2$; sensitivity) for formation of the LS pattern was determined. The results are shown in Table 4.

[Evaluation of Resolution]

A resist pattern was formed in the same manner as that described above in <Formation of resist patterns>, and the critical resolution (nm) at the aforementioned optimum exposure Eop was determined using a scanning electron microscope S-9380 (manufactured by Hitachi High-Technologies Corporation). The results are indicated as "Resolution (nm)" in Table 4.

[Evaluation of Exposure Latitude (EL Margin)]

At the optimum exposure Eop described above, the exposure dose at which an LS pattern was formed within a dimensional variation of ±10% from the target dimension (line width of 100 nm) (namely, within a range from 90 nm to 110 nm) was determined, and the EL margin (units: %) was determined using the following formula. The results are indicated as "EL margin (%)" in Table 4.

EL margin (%)=(|$E1-E2$|/Eop)×100

E1: the exposure dose (μC/cm$^2$) at which an LS pattern having a line width of 90 nm was formed
E2: the exposure dose (μC/cm$^2$) at which an LS pattern having a line width of 110 nm was formed The larger the value of the EL margin, the smaller the fluctuation in the pattern size caused by variation in the exposure dose.

[Evaluation of Line Edge Roughness (LER)]

For each of the LS patterns having a line width of 100 nm and a pitch of 200 nm formed in the aforementioned <Formation of resist patterns>, the value of 3σ was determined as an indicator of LER. The results are indicated as "LER (nm)" in Table 4.

The value "3π" indicates the value obtained by measuring the line width of the LS pattern at 400 locations along the lengthwise direction of the line using a scanning electron microscope (accelerating voltage: 800 V, product name: S-9380, manufactured by Hitachi High-Technologies Corporation), determining the standard deviation (σ) from the measurement results, and then calculating the value of 3 times the standard deviation (3σ) (units: nm).

The smaller this value of 3σ, the lower the level of roughness in the line side walls, indicating that an LS pattern with a uniform width has been obtained.

TABLE 4

| | PAB/PEB (° C.) | Eop (μC/cm$^2$) | Resolution (nm) | EL margin (%) | LER (nm) |
|---|---|---|---|---|---|
| Example 21 | 130/110 | 50 | 50 | 18.4 | 6.7 |
| Example 22 | 130/110 | 53 | 50 | 17.9 | 6.6 |
| Example 23 | 130/110 | 53 | 50 | 17.1 | 6.5 |
| Example 24 | 130/110 | 56 | 50 | 15.7 | 6.9 |
| Example 25 | 130/110 | 58 | 50 | 17.7 | 7.3 |
| Example 26 | 130/110 | 60 | 50 | 19.8 | 6.5 |
| Example 27 | 130/110 | 47 | 50 | 19.1 | 6.9 |
| Example 28 | 130/110 | 45 | 50 | 16.5 | 7.4 |
| Example 29 | 130/110 | 48 | 50 | 16.8 | 7.2 |
| Example 30 | 130/100 | 49 | 50 | 15.5 | 7.6 |
| Example 31 | 130/110 | 47 | 50 | 17.6 | 7.1 |
| Example 32 | 130/110 | 51 | 50 | 18.9 | 6.6 |
| Example 33 | 130/110 | 48 | 50 | 18.1 | 7.1 |
| Example 34 | 130/110 | 56 | 50 | 20.4 | 6.3 |
| Example 35 | 130/110 | 52 | 50 | 18.8 | 6.6 |
| Comparative example 3 | 130/110 | 62 | 50 | 14.3 | 8.0 |
| Comparative example 4 | 130/90 | 52 | 70 | 12.8 | 8.5 |
| Example 36 | 130/110 | 46 | 50 | 15.2 | 7.6 |
| Example 37 | 130/110 | 49 | 50 | 17.8 | 6.8 |
| Example 38 | 130/110 | 50 | 50 | 17.6 | 7.2 |
| Example 39 | 130/110 | 48 | 50 | 18.1 | 6.7 |
| Example 40 | 130/110 | 44 | 50 | 19.0 | 6.8 |
| Example 41 | 130/110 | 47 | 50 | 19.2 | 7.1 |

Based on the results shown in Table 4, it is evident that the resist compositions of the examples, which represent applications of the present invention, exhibited superior resolution and lithography properties compared with the resist compositions of the comparative examples.

Further, by comparing examples 21, 31 to 33 and 36 to 40 with comparative example 3, it is evident that using a resist composition that applies the present invention yields an improvement in the sensitivity.

What is claimed is:

1. A resist composition, comprising a base component (A) which generates acid upon exposure, and exhibits changed solubility in a developing solution under action of acid, wherein
the base component (A) comprises a polymeric compound (A1) having a structural unit (a5) represented by general formula (a5-0) shown below and a structural unit (a6) that generates acid upon exposure:

(a5-0)

wherein R represents a hydrogen atom, an alkyl group of 1 to 5 carbon atoms or a halogenated alkyl group of 1 to 5 carbon atoms, R$^1$ represents a sulfur atom or an oxygen atom, R$^2$ represents a single bond or a divalent linking group, and Y represents an aliphatic polycyclic group in which a carbon atom or a hydrogen atom may be substituted with a substituent, or an aromatic hydrocarbon group in which a carbon atom or a hydrogen atom may be substituted with a substituent.

2. The resist composition according to claim 1, wherein the structural unit (a6) comprises a structural unit having a group represented by general formula (a6-0-1) or general formula (a6-0-2) shown below:

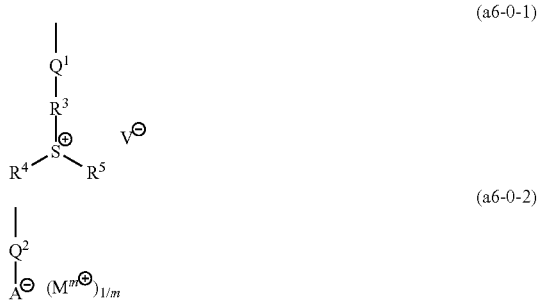

wherein each of Q$^1$ and Q$^2$ independently represents a single bond or a divalent linking group, each of R$^3$, R$^4$ and R$^5$ independently represents an organic group, wherein R$^4$ and R$^5$ may be bonded to each other to form a ring in combination with a sulfur atom in the formula, V$^-$ represents a counter anion, A$^-$ represents an organic group containing an anion, and M$^{m+}$ represents an organic cation having a valency of m, wherein m represents an integer of 1 to 3.

3. The resist composition according to claim 1, wherein the polymeric compound (A1) also has a structural unit (a1) containing an acid-decomposable group that exhibits increased polarity under action of acid.

4. A method of forming a resist pattern, the method including: using the resist composition of claim 1 to form a resist film on a substrate, conducting exposure of the resist film, and developing the resist film to form a resist pattern.

5. A polymeric compound having a structural unit (a5) represented by general formula (a5-0) shown below and a structural unit (a6) that generates acid upon exposure:

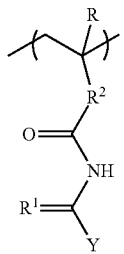

(a5-0)

wherein R represents a hydrogen atom, an alkyl group of 1 to 5 carbon atoms or a halogenated alkyl group of 1 to 5 carbon atoms, $R^1$ represents a sulfur atom or an oxygen atom, $R^2$ represents a single bond or a divalent linking group, and Y represents an aliphatic polycyclic group in which a carbon atom or a hydrogen atom may be substituted with a substituent, or an aromatic hydrocarbon group in which a carbon atom or a hydrogen atom ma be substituted with a substituent.

6. The polymeric compound according to claim 5, wherein the structural unit (a6) comprises a structural unit having a group represented by general formula (a6-0-1) or general formula (a6-0-2) shown below:

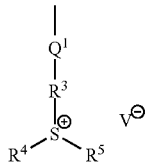

(a6-0-1)

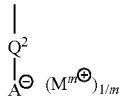

(a6-0-2)

wherein each of $Q^1$ and $Q^2$ independently represents a single bond or a divalent linking group, each of $R^3$, $R^4$ and $R^5$ independently represents an organic group, wherein $R^4$ and $R^5$ may be bonded to each other to form a ring in combination with a sulfur atom in the formula, $V^-$ represents a counter anion, $A^-$ represents an organic group containing an anion, and $M^{m+}$ represents an organic cation having a valency of m, wherein m represents an integer of 1 to 3.

7. The polymeric compound according to claim 5, having a structural unit (a1) containing an acid-decomposable group that exhibits increased polarity under action of acid.

* * * * *

UNITED STATES PATENT AND TRADEMARK OFFICE
CERTIFICATE OF CORRECTION

PATENT NO. : 8,778,595 B2
APPLICATION NO. : 13/678955
DATED : July 15, 2014
INVENTOR(S) : Daichi Takaki et al.

It is certified that error appears in the above-identified patent and that said Letters Patent is hereby corrected as shown below:

In the Specification

At Column 1, Line 4 (Approx.), Below "Title" insert --Priority is claimed on Japanese Patent Application No. 2011-257859, filed Nov. 25, 2011, the content of which is incorporated herein by reference.--.

At Column 1, Lines 12-14, Below "composition." delete "Priority is claimed on Japanese Patent Application No. 2011-257859, filed Nov. 25, 2011, the content of which is incorporated herein by reference.".

At Column 6, Line 5, Change "(A 1-2)," to --(A1-2),--.

At Column 9, Line 52, Change "n" to --п--.

At Column 13, Line 59 (Approx.), Change "n" to --п--.

At Column 44, Line 57, Change "i to 5" to --1 to 5--.

At Column 49, Line 1, Change "A" to --A⁻--.

At Column 67, Line 54, Change "$R^1$," to --$R^{q1}$,--.

At Column 94, Line 1, Change "(a1)" to --(a11)--.

At Column 130, Line 36, Change "ring ring" to --ring--.

At Column 130, Line 53, Change "$SO_{O2}$" to --$SO_2$--.

Signed and Sealed this
Tenth Day of November, 2015

Michelle K. Lee
*Director of the United States Patent and Trademark Office*

CERTIFICATE OF CORRECTION (continued)
U.S. Pat. No. 8,778,595 B2

At Column 140, Line 7, Change "$(CH_2),-O$" to --$(CH_2)_c-O$--.

At Column 157, Line 59, Change "in" to --п--.

At Column 186, Line 2, Change "p"represents" to --p "represents--.

In the Claims

At Column 211, Line 28, In Claim 5, change "ma be" to --may be--.